United States Patent
Kim et al.

(10) Patent No.: US 8,051,555 B2
(45) Date of Patent: Nov. 8, 2011

(54) CIRCUIT MANUFACTURING APPARATUS

(75) Inventors: Minill Kim, Cheonan-si (KR);
Taegyeong Chung, Suwon-si (KR);
Jonggi Lee, Yongin-si (KR); Kwang Yong Lee, Anyang-si (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 60 days.

(21) Appl. No.: 12/615,585

(22) Filed: Nov. 10, 2009

(65) Prior Publication Data
US 2010/0115763 A1 May 13, 2010

(30) Foreign Application Priority Data
Nov. 10, 2008 (KR) .................. 2008-111165

(51) Int. Cl.
*B23B 19/00* (2006.01)
(52) U.S. Cl. ........... 29/740; 29/739; 29/832; 228/180.5; 324/754.1
(58) Field of Classification Search ............ 29/740–743, 29/564.1, 564.2, 840–842; 198/346.1; 228/180.21–180.22; 219/230–233; 324/754.1, 324/756.01, 763.01
See application file for complete search history.

(56) References Cited

U.S. PATENT DOCUMENTS

| | | | | |
|---|---|---|---|---|
| 5,163,599 A * | 11/1992 | Mishina et al. | ................. | 228/42 |
| 5,232,463 A * | 8/1993 | Micic et al. | ................. | 29/25.01 |
| 5,467,912 A * | 11/1995 | Mishina et al. | ................. | 228/10 |
| 6,841,728 B2 * | 1/2005 | Jones et al. | ................. | 136/244 |
| 6,878,172 B2 * | 4/2005 | Jensen | ................. | 29/25.01 |
| 7,313,859 B2 * | 1/2008 | Maenishi et al. | ................. | 29/711 |
| 7,357,288 B2 * | 4/2008 | Hosotani et al. | ................. | 228/6.2 |
| 7,841,079 B2 * | 11/2010 | Inoue et al. | ................. | 29/840 |
| 2004/0003882 A1 * | 1/2004 | Davis et al. | ................. | 156/64 |

FOREIGN PATENT DOCUMENTS

| | | |
|---|---|---|
| JP | 2003-158328 | 5/2003 |
| KR | 1998-84030 | 12/1998 |
| KR | 2004-67048 | 7/2004 |

* cited by examiner

*Primary Examiner* — Minh Trinh
(74) *Attorney, Agent, or Firm* — Stanzione & Kim, LLP

(57) ABSTRACT

An assembling apparatus includes a chip transfer unit, a heating unit, a testing unit, and an output unit. The chip transfer unit mounts first semiconductor chip to a circuit board to form an electrical circuit. The heating unit heats a solder connection to electrically connect the semiconductor chip to the circuit board. The testing unit tests the semiconductor chip, and, when the testing unit determines that the first semiconductor chip is not functioning properly, the heating unit reheats the solder connection to remove the non-functioning semiconductor chip from the circuit board.

25 Claims, 52 Drawing Sheets

Fig. 20A  Fig. 20B  Fig. 20C
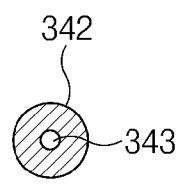
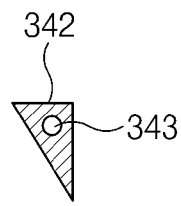
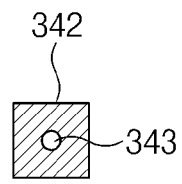
Fig. 21
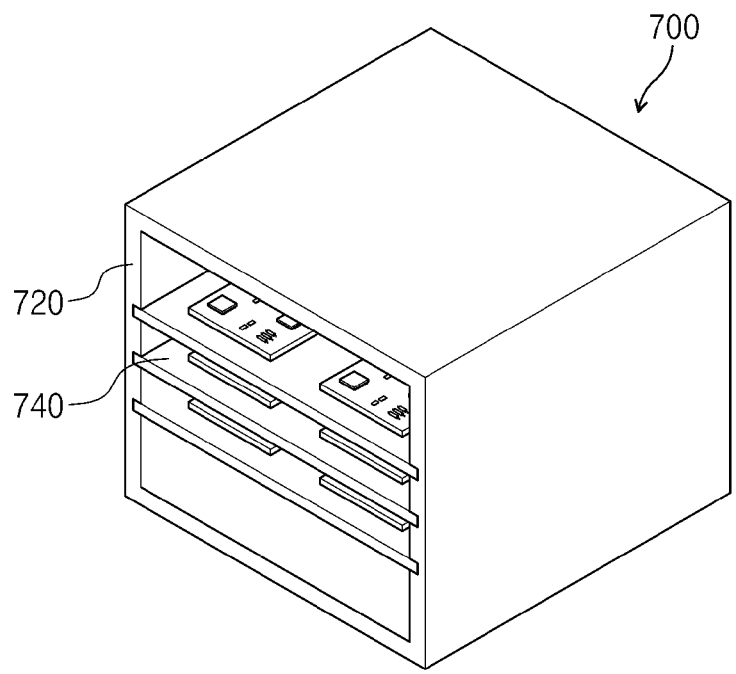

CIRCUIT MANUFACTURING APPARATUS

CROSS-REFERENCE TO RELATED APPLICATIONS

This U.S. non-provisional patent application claims priority under 35 U.S.C. §119 of Korean Patent Application No. 10-2008-0111165, filed on Nov. 10, 2008, the entire contents of which are hereby incorporated by reference.

BACKGROUND

1. Field of the Invention

The present general inventive concept disclosed herein relates to a module apparatus and method of assembling a semiconductor chip.

2. Description of the Related Art

A process of assembling a semiconductor chip that is an encapsulated component may include a mounting process and a test process. The mounting process mounts the semiconductor chip having the solder ball on a printed circuit board (PCB). After the assembly and mounting processes, a process for reflowing the solder ball by applying heat on each solder ball is required. The test process determines whether the reflow process is completed successfully or not by performing an electrical test on the PCB.

SUMMARY

The present general inventive concept provides a module apparatus and method capable of effectively performing a module process.

Additional aspects and utilities of the present general inventive concept will be set forth in part in the description which follows and, in part, will be obvious from the description, or may be learned by practice of the general inventive concept.

Features and/or utilities of the present general inventive concept may also be realized by an assembling apparatus including a mounting portion to mount a first semiconductor chip to a first circuit board to form an electrical circuit, a heating portion to heat at least one solder connection to electrically connect the first semiconductor chip to the first circuit board, a testing portion to test the first semiconductor chip mounted on the first circuit board, and an output portion to receive the first semiconductor chip when the testing portion determines that the first semiconductor chip functions properly. When the testing portion determines that the first semiconductor chip is not functioning properly, the heating portion may reheat the solder connection to remove the non-functioning first semiconductor chip from the first circuit board.

The mounting portion may include a chip supporter to store the first semiconductor chip prior to mounting the first semiconductor chip onto the first circuit board, and a chip transfer apparatus to mount the first semiconductor chip onto the first circuit board.

The mounting portion may include the heating portion, and the chip transfer apparatus may include a heating unit.

The chip transfer apparatus may include a vacuum line including an inlet to attach to the first semiconductor chip, at least one transfer rod to position the inlet of the vacuum line, and at least one drive source to move the at least one transfer rod.

The heating portion may include a heater including a coil to generate a magnetic field and a power source to supply power to the coil.

The heater may include a first heater to be positioned above the first circuit board and a second heater to be positioned beneath the first circuit board.

A plurality of circuit boards including the first circuit board may be mounted on a circuit board supporter, and the heater may include a first heater to be positioned above at least one circuit board on the circuit board supporter and a second heater to be positioned above at least another circuit board on the circuit board supporter.

The first circuit board may have a substantially planar upper surface defined by a first direction and a second direction perpendicular to the first direction, and the heater may be rotatable along an axis perpendicular to each of the first and second directions. The heater may also be rotatable along an axis parallel to a plane defined by the first and second directions.

The first circuit board may have a substantially planar upper surface defined by a first direction and a second direction perpendicular to the first direction, and a surface of the heater facing the first circuit board may be positioned at an angle with respect to the upper surface of the first circuit board that is greater than zero degrees and less than ninety degrees.

The surface of the heater facing the first circuit board may be positioned at an angle with respect to the upper surface of the first circuit board that is greater than eighty degrees and less than ninety degrees.

The first circuit board may have a substantially planar upper surface defined by a first direction and a second direction perpendicular to the first direction, and the heating unit may include a guide to move the heater along the first direction with respect to the first circuit board.

The heater may further include a bracket to mount the heater to the guide.

The heater may further include a cooling member surrounding the coil. Alternatively, the cooling member may be embedded within the coil.

The heater may include a first heater having a coil of a first size to simultaneously heat a plurality of circuit boards and a second heater having a coil of a second size smaller than the first size to heat only one circuit board at a time.

The heater may further include a bracket to mount the heater to a guide, and the first heater and the second heater may be interchangeably mountable on the bracket.

The heating unit may include two guides on opposite ends of the first circuit board to move the first heater and the second heater, respectively, along the first direction with respect to the first circuit board and two brackets to mount the first heater and the second heater to respective guides.

A circumferential cross-section of the coil may have a polygonal shape.

The assembling apparatus may further include a circuit board transfer apparatus to move the first circuit board between the mounting portion, the heating portion, and the testing portion.

The circuit board transfer apparatus may be a conveyor belt.

Alternatively, the circuit board transfer apparatus may include a plate, a projection extending from a surface of the plate in a first direction perpendicular to the plate, the projection moveable in the first direction perpendicular to the surface of the plate and having a retracted state when the projection is moved towards the plate and an extended state when the projection is moved away from the surface of the plate, a transfer rod to move the plate in a second direction perpendicular to the first direction, and rails to maintain the circuit board on a path in the second direction. The projection may be capable of moving the circuit board when in the extended state, and the projection may be capable of moving around the circuit board when in the retracted state.

A plurality of circuit boards including the first circuit board may be mounted on a circuit board supporter, and the circuit board transfer apparatus may move the plurality of circuit boards by applying a force to an end of the semiconductor chip supporter.

The testing portion may include a tester apparatus and a circuit board moving member to move the first circuit board from the heating portion to the tester apparatus, and, based upon a testing result of the testing apparatus, to one of a faulty circuit board storage area and the output portion.

The mounting portion, the heating portion, and the testing portion may be arranged in a line, so that the first circuit board may be moved along a line from the mounting portion to the heating portion to the testing portion.

Features and/or utilities of the present general inventive concept may also be realized by a method of manufacturing at least one circuit board using an assembly apparatus, the method including mounting a first semiconductor chip onto a first circuit board, heating at least one solder connection between the first semiconductor chip and the first circuit board to physically and electrically connect the semiconductor chip to the first circuit board, connecting the first circuit board to a testing apparatus to determine whether the first semiconductor chip is faulty, and when it is determined that the first semiconductor chip is faulty, using a reflow process to remove the first semiconductor chip from the first circuit board and replacing the first semiconductor chip with a second semiconductor chip.

The method may further include mounting a plurality of circuit boards including the first circuit board onto a circuit board supporter and moving the circuit board supporter from a mounting area of the assembling apparatus where the plurality of circuit boards are mounted onto the circuit board supporter to a heating area of the assembling apparatus where heating is performed to a test area of the assembling apparatus where testing is performed using the testing apparatus.

The method may further include, when it is determined that the first semiconductor chip is faulty, moving the first circuit board to the heating area to heat solder connections between first semiconductor chip and the first circuit board, moving the first circuit board to the mounting area to remove the first semiconductor chip and to mount a second semiconductor chip on the first circuit board in place of the first semiconductor chip, moving the first circuit board to the heating area to heat solder connections between the second semiconductor chip and the first circuit board to physically and electrically connect the second semiconductor chip to the first circuit board, and moving the first circuit board to the test area to be tested.

Heating at least one solder connection between the first semiconductor chip and the first circuit board may include generating a magnetic field to heat conductors in at least one of the first semiconductor chip and the first circuit board.

Generating a magnetic field may include rotating a magnetic field generating apparatus such that an angle between a magnetic field line and a plane defined by an upper surface of the first circuit board is not 90°.

BRIEF DESCRIPTION OF THE DRAWINGS

The above and/or other aspects of the present general inventive concept will become apparent and more readily appreciated from the following description of the exemplary embodiments, taken in conjunction with the accompanying drawings, in which:

FIGS. 20A through 20C are sectional views illustrating various cross-sectional forms of a coil;

FIG. 21 is a perspective view illustrating a bad board storage of FIG. 2;

DETAILED DESCRIPTION OF THE EMBODIMENTS

Figure 1:
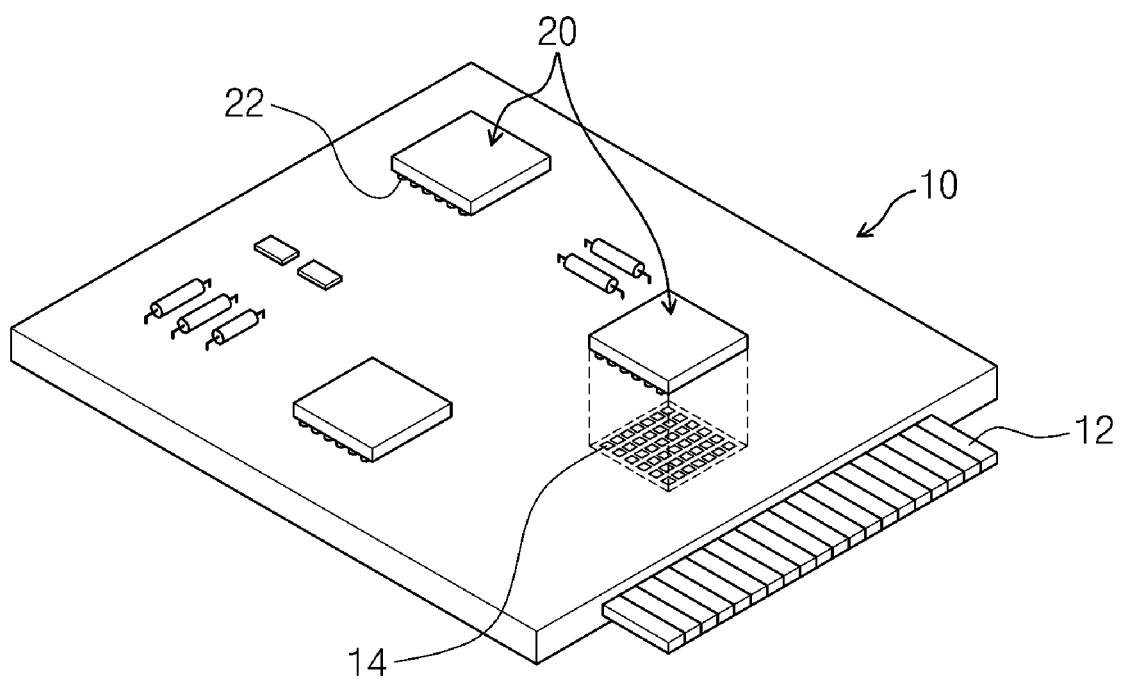
FIG. 1 is a perspective view of a printed circuit board.

Embodiments of the present general inventive concept will be described below in more detail with reference to the accompanying FIGS. 1 through 29J. The present general inventive concept may, however, be embodied in different forms and should not be construed as limited to the embodiments set forth herein. Rather, these embodiments are provided so that this disclosure will be thorough and complete, and will fully convey the scope of the present general inventive concept to those skilled in the art. Accordingly, forms of components may be exaggerated in the accompanying drawings to provide a more clear description.

Reference will now be made in detail to the embodiments of the present general inventive concept, examples of which are illustrated in the accompanying drawings, wherein like reference numerals refer to the like elements throughout.

FIG. 1 illustrates a printed circuit board (PCB) 10 on which a semiconductor chip 20 is mounted. The printed circuit board may have a thin plate shape and may include contact terminals 12 at one end. The printed circuit board 10 may include connection terminals 14 such as conductive pads, which are electrically connected to a semiconductor chip 20 with a solder ball 22. The contact terminals 12 and the connection terminals 14 may be electrically connected via a plurality of conductive lines or wires (not shown) in the PCB 10.

Figure 2:
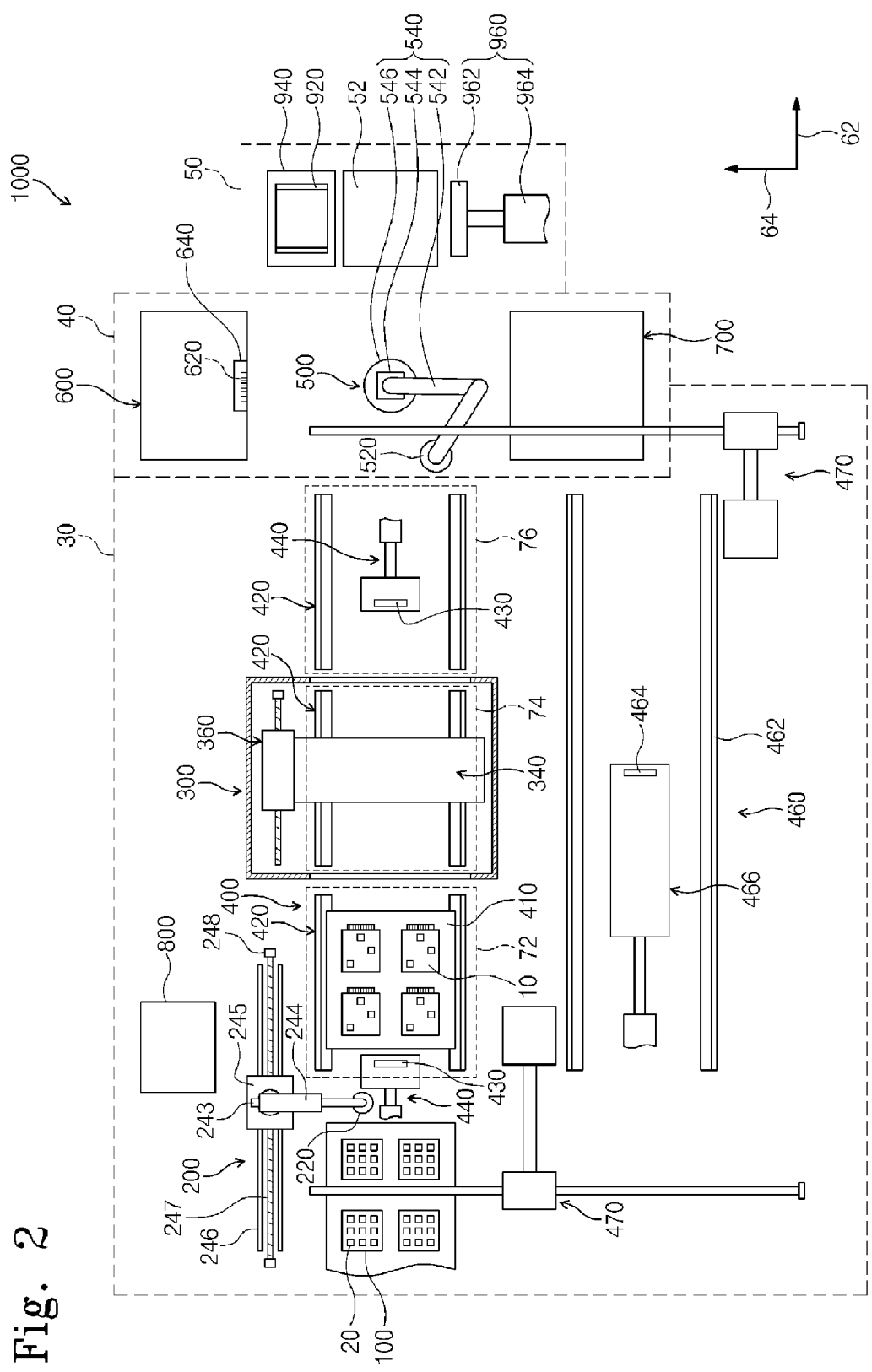
FIG. 2 is a plan view of a module apparatus according to an embodiment of the present general inventive concept.

FIG. 2 is a plan view illustrating a circuit manufacturing apparatus 1000 to manufacture a semiconductor circuit, or a module apparatus to form a semiconductor package, according to an embodiment of the present general inventive concept. The module apparatus 1000 may include a first unit 30, a second unit 40, and an unloader unit 50.

The first unit 30 performs a process of mounting a semiconductor chip 20 onto a printed circuit board 10 and a process of reflowing a solder ball 22 of the semiconductor chip 20 to connect the semiconductor chip 20 to the printed circuit board 10. Additionally, the first unit 30 may perform a rework process on the PCB 10. After the mounting process and the reflowing process, the rework process removes the semiconductor chip 20 from the PCB 10 when it is determined that a faulty electrical connection exists between the semiconductor chip 20 and the PCB 10. The first unit then performs processes to mount a new semiconductor chip 20 onto the PCB 10 and to reflow the new semiconductor chip 20 onto the PCB 10.

The first unit 30 may include a chip supporter 100, a chip transfer unit 200, a heat unit 300, and board transfer assembly 400. The chip supporter 100 may hold a plurality of semiconductor chips 20 before they are mounted onto a printed circuit board 10. The chip supporter may be a rectangular plate, for example. The chip supporter 100 may have an M row×N column matrix (M and N are a natural number). In FIG. 2, four chip supporters 100 are illustrated being positioned two row× two column matrix. A plurality of semiconductor chips 20 may be provided on each of the chip supporters 100. The semiconductor chips 200 may be of the same type or of different types.

A chip transfer unit 200, to be described in detail below with respect to FIG. 7, may transfer a semiconductor chip 20 from the chip supporter 100 to a printed circuit board 10, as shown in FIG. 1. During the semiconductor chip 20 mounting process, the printed circuit board 10 may be located on a board supporter 410 in a first region 72.

The first unit 30 may include a board transfer assembly 400 including the board supporter 410, a transfer rail or transfer guide 420, and a projection driver 440. The board supporter 410 may be located on a transfer rail 420 that may guide the board supporter 410 as it is moved by the projection driver 440a within the first unit 30. The board supporter 410 may be a plate on which the printed circuit boards 10 are positioned while the semiconductor chips 20 are mounted on the printed circuit boards 10 or while the reflow process is performed to electrically and physically connect the semiconductor chips 20 to the printed circuit boards 10 via solder connections 22. The board supporter 410 may be a thin and substantially rectangular plate. The board supporter 410 may have a size sufficient to support a plurality of printed circuit boards 10. The PCBs 10 may be arranged on the board supporter 410 in an M row×N column matrix (M and N are a natural number). For example, the board supporter 410 illustrated in FIG. 2 supports four printed circuit boards 10 arranged in a two row×two column matrix.

The transfer rails 420 may be located in each of the first region 72, where the semiconductor chips 20 are mounted to the printed circuit boards 10, the second region 74 including the heat unit 300, and the third region 76, from which the printed circuit boards 10 are removed for testing. The transfer rails 420 may be separate segments with spaces in-between, as illustrated in FIG. 2, or they may be contiguous throughout the first, second, and third regions 72, 74, 76. The structure of the transfer rail 420 and board supporter moving member 450 of the board transfer assembly 400 will be described in greater detail below with respect to FIG. 3.

The board transfer assembly 400 may also include a transfer device 470 to transfer a board supporter 410 from a return member 460 to the transfer rail 420. The first unit 30 may also include a faulty chip storage 800 to store semiconductor chips 20' that are determined to be faulty in a testing process, as described in more detail below.

The first unit 30 may include a second region 74 containing a heat unit 300 to perform a reflow process to melt a solder connection or solder ball 22 between a semiconductor chip 20 and printed circuit board 10, and the heat unit 300 is described in greater detail below with respect to FIG. 8.

The first unit 30 may also include a third region 76 to hold the board supporter 410 as the printed circuit boards 10 are being tested.

The second unit 40, or the test portion, of the manufacturing apparatus 1000 may be located adjacent to the first unit 30. It may include a tester 600 to test the printed circuit boards 10, a faulty board storage 700 (shown in greater detail in FIG. 21) to store printed circuit boards 10 having faulty semiconductor chips 20', or faulty connections to the semiconductor chips 20', and a board moving member 500 or transfer arm to transfer the printed circuit boards from the third region 76 of the first unit to the tester 600, the faulty board storage 700, and the unloader 50. The second unit 40 performs an electrical test on the printed circuit board 10 after the reflow process is completed to determine whether an electrical connection between the semiconductor chip 20 and the PCB 10 is faulty Moreover, the board moving member 500 of the second unit 40 may transfer a printed circuit board 10 from the faulty board storage 700 to the first unit 30 to perform a rework process.

The first unit 30 or the second unit 40 may also include a transfer device 470 to move a board supporter 410 from the return member 460 to the third region 76 of the first unit 30.

Figure 22:
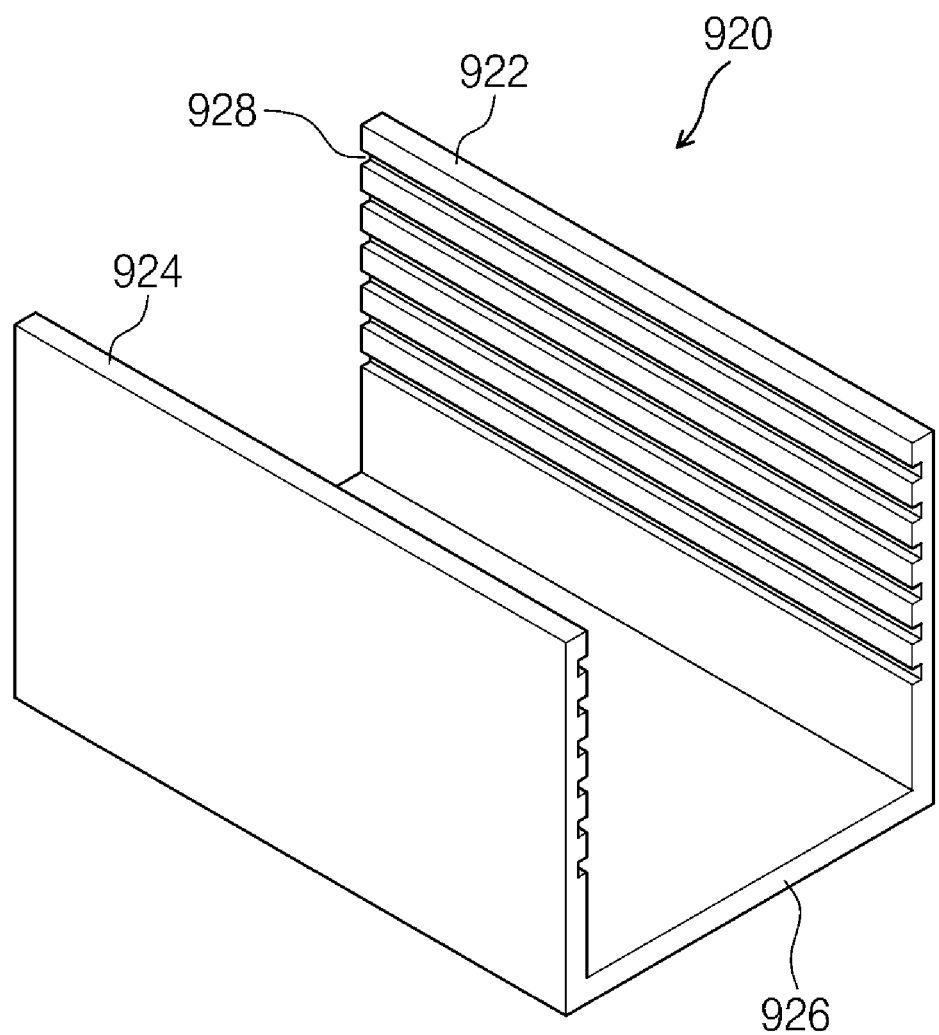
FIG. 22 is a perspective view illustrating a magazine of FIG. 2.
Figure 23:
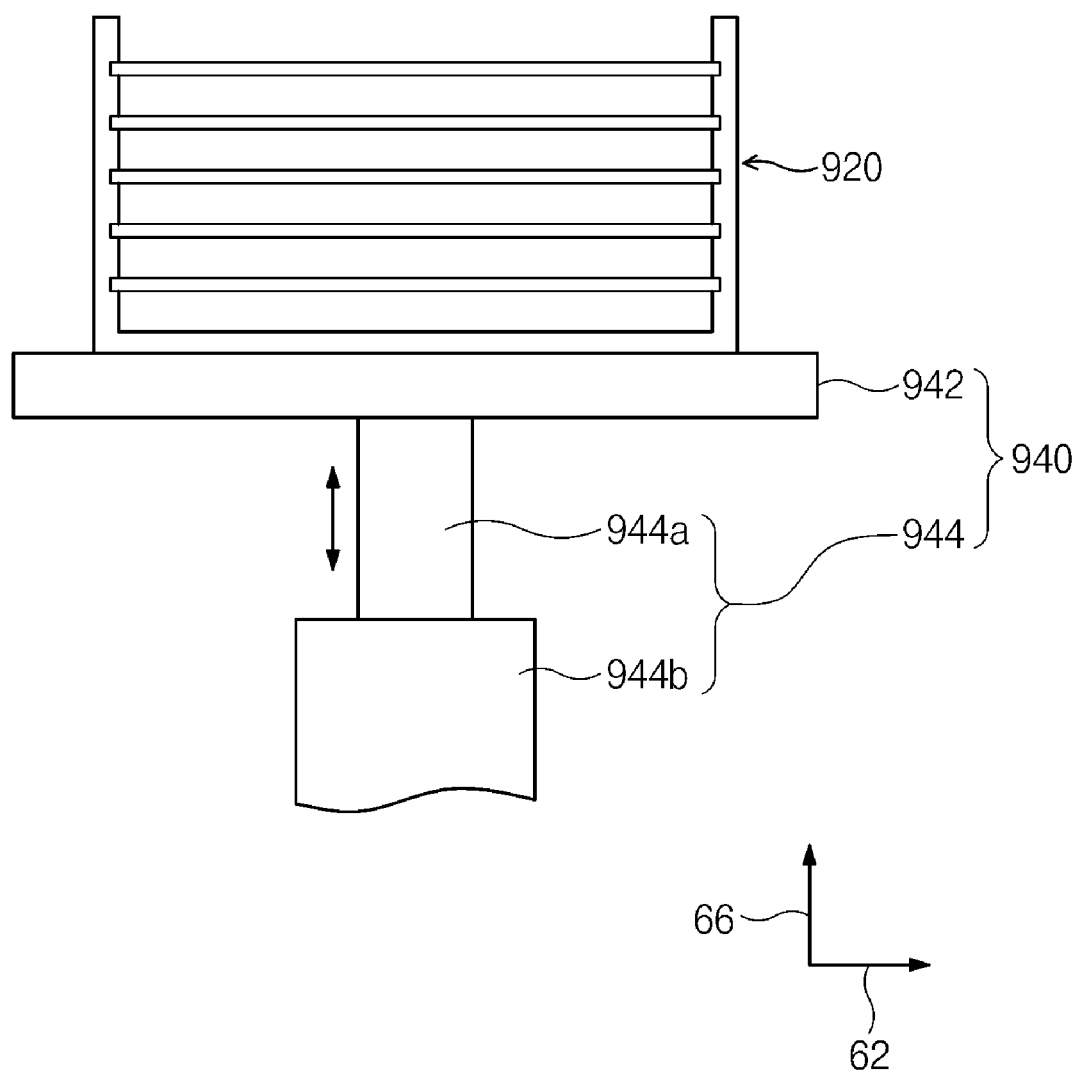
FIG. 23 is a front view illustrating a magazine driver of FIG. 2.

The unloader unit 50 receives the good printed circuit board 10 from the tester 600 and stacks a plurality of good printed circuit boards 10 in a magazine 920, shown in more detail in FIGS. 22 and 23.

The first unit 30, the second unit 40, and the unloader unit 50 may be positioned side by side in a line in a first direction 62. A second direction 64 is perpendicular to the first direction 62, and both the first and second directions 62, 64 may be substantially co-planar with the upper surface of the board supporter 410 or the printed circuit board 10. A third direction 66 is perpendicular to both the first and second directions 62, 64, and if the first and second directions 62, 64 define a horizontal plane, the third direction 66 extends vertically.

Figure 3:
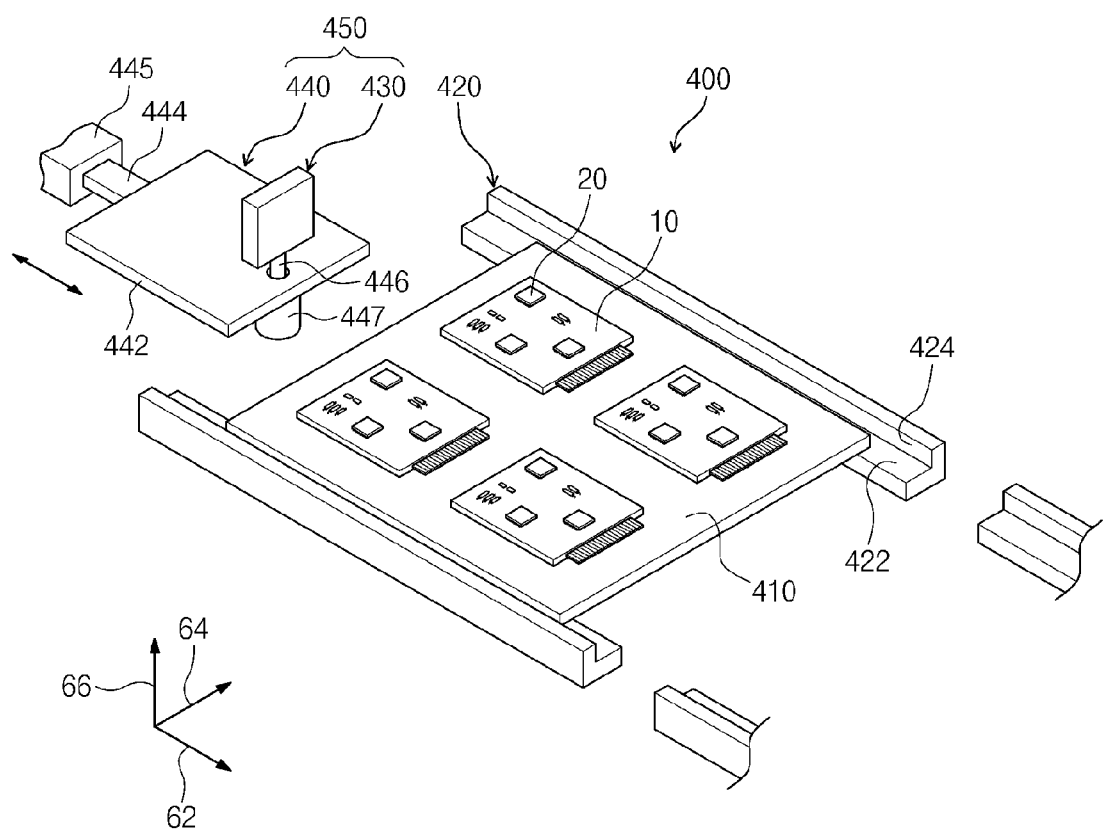
FIG. 3 is a perspective view of a board transfer assembly of FIG. 2.

Referring to the projection driver 440 and transfer rails 420 of the first unit 30, the projection driver and transfer rails 420 are components of a supporter moving mechanism 450 illustrated in FIG. 3. In particular, FIG. 3 is a perspective view of the transfer guides 420, the projection 430, and the projection driver 440. The transfer guides 420 may guide the board supporter 410 to transfer it linearly along the first direction 62. A separate transfer guide 420 or pair of transfer guides 420 may be located in the first region 72, the second region 74, and the third region 76. The transfer guides 420 may be adjacent to each other in a straight line so that the printed circuit board 10 may be stably transferred between adjacent transfer guides 420 in the first direction 62. Alternatively, the first unit 30 may have only one transfer guide 420 extending between the first, second, and third regions 72, 74, 76.

The transfer rails 420 may be spaced apart from each other in the second direction 64. Each of the transfer rails 420 includes a supporting side 422 to support an edge of the bottom side of the printed circuit board 10 and a stopper side 424 that extends upwards from one end of the supporting side 422 to prevent the printed circuit board 10 from moving in the second direction 64.

The projection 430 may have a rectangular plate form. Each of the first and third regions 72, 76 may include a projection 430 and a projection driver 440. The projection 430a of the first region 72 may transfer the printed circuit board 10 between the first region 72 and the second region 74, and the projection 430b of the third region 76 may transfer the printed circuit board 10 between the second region 74 and the third region 76. The projection 430 and projection driver 440 may be positioned between the transfer rails 420 either below or above the transfer guide 420 or co-planar with the transfer guide 420. For example, FIG. 3 illustrates the projection 430 and projection driver 440 positioned below the transfer rails 420 when the projection 430 is in a retracted state. The projection 430 pushes or pulls the board supporter 410 to transfer it along the transfer guide 420.

The projection driver 440 includes a connection plate 442, a parallel transfer rod 444, and a vertical transfer rod 446. The connection plate 442 may have a rectangular plate shape, for example. The vertical transfer rod 446 is mounted on the front end of the connection plate 442 and is connected to the projection 430. The projection 430 may be fixed to the top end of the vertical transfer rod 446. The vertical transfer rod 446 is connected to the connection plate 442 to allow the projection 430 to move in a vertical direction with respect to the connection plate 442. The vertical transfer rod 446 is connected to a drive source 447 such as a cylinder to move the connection plate 442 and the projection 430 in the third direction 66. When the vertical transfer rod 446 is moved in an upper direction into its extended state, the top end of the projection 430 is higher than the board supporter 410 located on the transfer rail 420. When the vertical transfer rod 446 is moved in a lower direction into its retracted state, the top end of the projection 430 is lower than the board supporter 410 on the transfer rail 420. A parallel transfer rod 444 is fixed and coupled to the rear end of the connection plate 442 such that the connection plate 442 can be moved in the first direction 62. The parallel transfer rod 444 is connected to a drive source 445 such as a motor or a cylinder.

The projection 430a and the projection driver 440a in the first region 72 and the projection 430b and the projection driver 440b in the third region 76 may be symmetrical to each other relative to a line parallel to the second direction 64. In other words, the projection 430a and projection driver 440a of the first region 72 may face the projection 430b and projection driver 440b of the third region 76 and may mirror the positioning of the projection 430b and projection driver 440b of the third region 76. The front end of the projection 430a in the first region 72 is may face towards the heat unit 300. The projection 430a may push a first end of the board supporter 410 to move the board supporter 410 from the first region 72 to the second region 74, and the projection 430a may pull a second end of the board supporter 410 opposite the first end to move the board supporter 410 from the second region 74 to the first region 72. The projection 430b in the third region 76 front end that faces away from the heat unit 300. The projection 430 may pull the first end of the board supporter 410 to move the board supporter 410 from the second region 74 to the third region 76, and the projection 430b may push the second end of the board supporter 410 opposite the first end to move the board supporter 410 from the third region 76 to the second region 74. Configurations of the fingers 430 and the projection drivers 440 are not limited to the above.

The board supporter 410 may be transferred onto the transfer guide 420 in the first region 72 by a worker or by using the transfer device 470. The transfer device 470 may be an overhead transfer device 470 that is movable in the third direction 66 and the second direction 64 to lift a board supporter 410 and to move between the return member 460 and the first region 72. The return member 460 may include two transfer rails 462, a projection 464, and a projection driver 466. The transfer rails 462 may be separated from the transfer rails 420 horizontally in the second direction 64 or vertically in the third direction 66 and may be parallel to the transfer rails 420. The projection 464 and the projection driver 446 may have a similar structure as the projection 430 and the projection driver 440 of the board transfer assembly 400. As will be discussed below, once all the circuit boards 10 on a board supporter 410 are tested, a transfer device 470 may move the board supporter from the third region 76 to the return member 460. The projection 430 and projection driver 440 may pull the board supporter 410 along the rails or guides 462 toward the first region 72. Another transfer device 470 may lift the board supporter 410 from the rails 462 of the return member and place the board supporter 410 on the rails 420 of the first region 72. New circuit boards 10 may then be positioned on the board supporter 410.

Alternatively, the circuit manufacturing apparatus 1000 may not include the return member 460, and the board supporter 410 may be transferred from a storage area (not shown) onto the transfer guide 420 and the board supporter 410 in the third region 76 may be moved to and stored in an additional storage area (not shown).

The printed circuit boards 10 may be positioned on the board supporter 410 either before or after the board supporter 410 is moved onto the transfer guide 420. The printed circuit boards 10 may be transferred onto the board supporter 410 either by a worker or by a circuit board transfer device (not shown)

Figure 4:
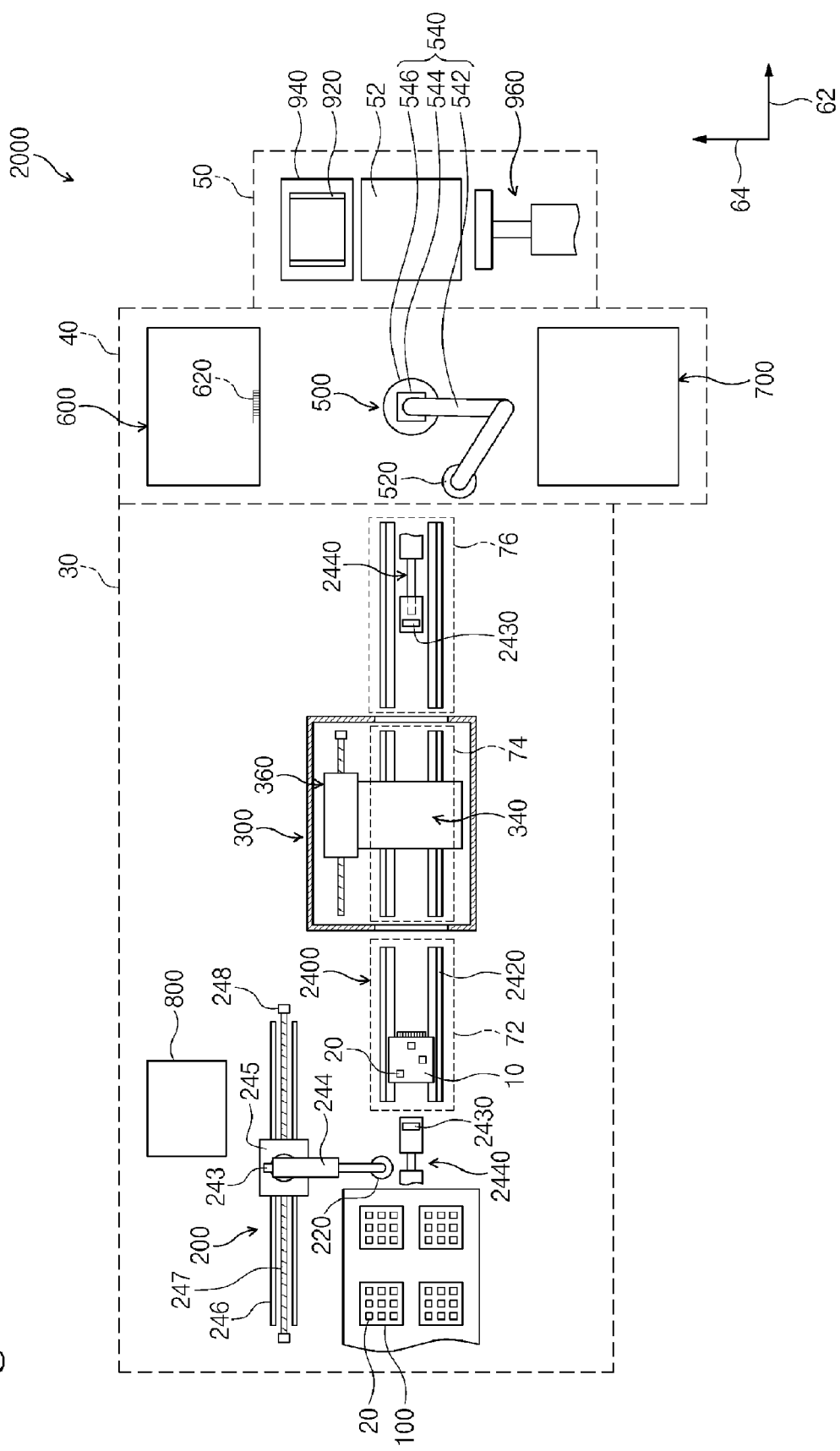
FIGS. 4 through 6 are plan views illustrating modifications of a module apparatus of FIG. 2.

FIG. 4 is a plan view illustrating a circuit manufacturing apparatus 2000 including another embodiment of a board transfer assembly 240. FIG. 4 is similar to the circuit manufacturing apparatus 1000 of FIG. 2, except instead of transferring a plurality of circuit boards 10 on a board supporter 410, the board transfer assembly 2400 is configured to transfer only one circuit board 10 at a time. Consequently, the circuit manufacturing apparatus 2000 does not utilize a return mechanism 460, the distance between transfer rails 2420 is smaller than in FIG. 2, and the projections 2430 and projection drivers 2440 may also be smaller than those of FIG. 2.

Figure 5:
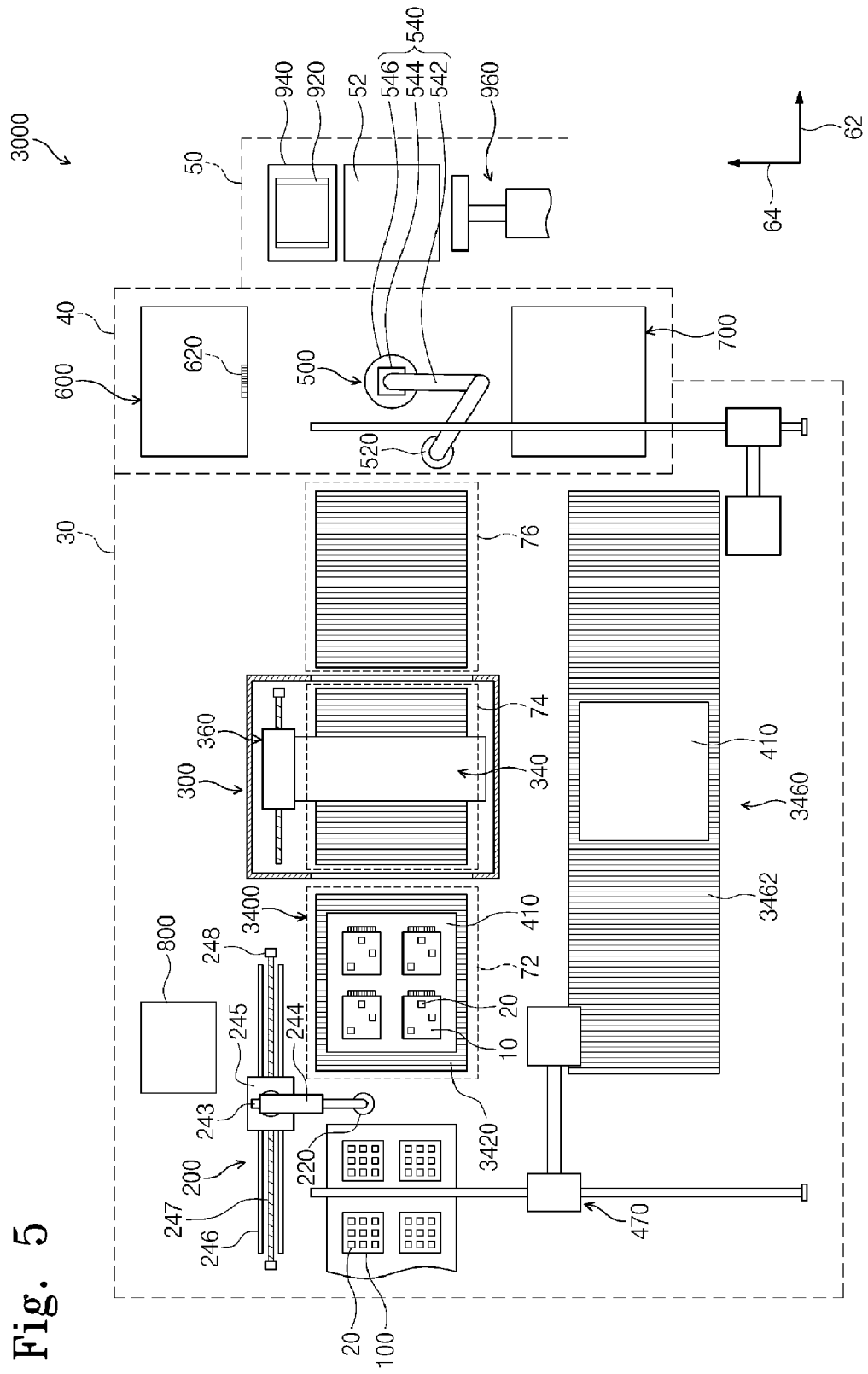

FIG. 5 is a plan view illustrating another embodiment of a circuit manufacturing apparatus 3000 having another board transfer assembly 3400. In FIG. 5, the transfer rails 420 of FIG. 2 are replaced with a transfer conveyor 3420 to transfer the board supporter 410. The transfer conveyer 3420 may have a conventional loop structure including a substantially planar material surrounding rotatable rollers (not shown). A motor (not shown) driving the roller may rotate in a clockwise direction or a counterclockwise direction to move the board supporter 410 either forwards or backwards. In other words, when the motor moves the conveyor 3420 in a clockwise direction, the transfer conveyer 3420 moves the board supporter 410 from the first region 72 toward the third region 76, and when the motor moves the conveyor 3420 in the counterclockwise direction, the transfer conveyer 3420 moves the board supporter 410 from the third region 76 towards the first region 72. The transfer conveyer 3420 may be arranged in a straight line between the first region 72, the second region 74, and the third region 76. The transfer conveyer 3420 may have a length that extends from the first region 72 to the third region 76. The board supporter 410 in the third region 76 may be returned to the first region 72 via a return member 3460. The return member 3460 may include a return conveyer 3462 that is separated from the transfer conveyer 3420 in the second direction 64 and may be parallel to the transfer conveyer 3420. The transfer from the return conveyer 3462 to the transfer conveyer 3420 may be performed by a transfer means such as an overhead transfer 470 or may be performed manually.

Figure 6:
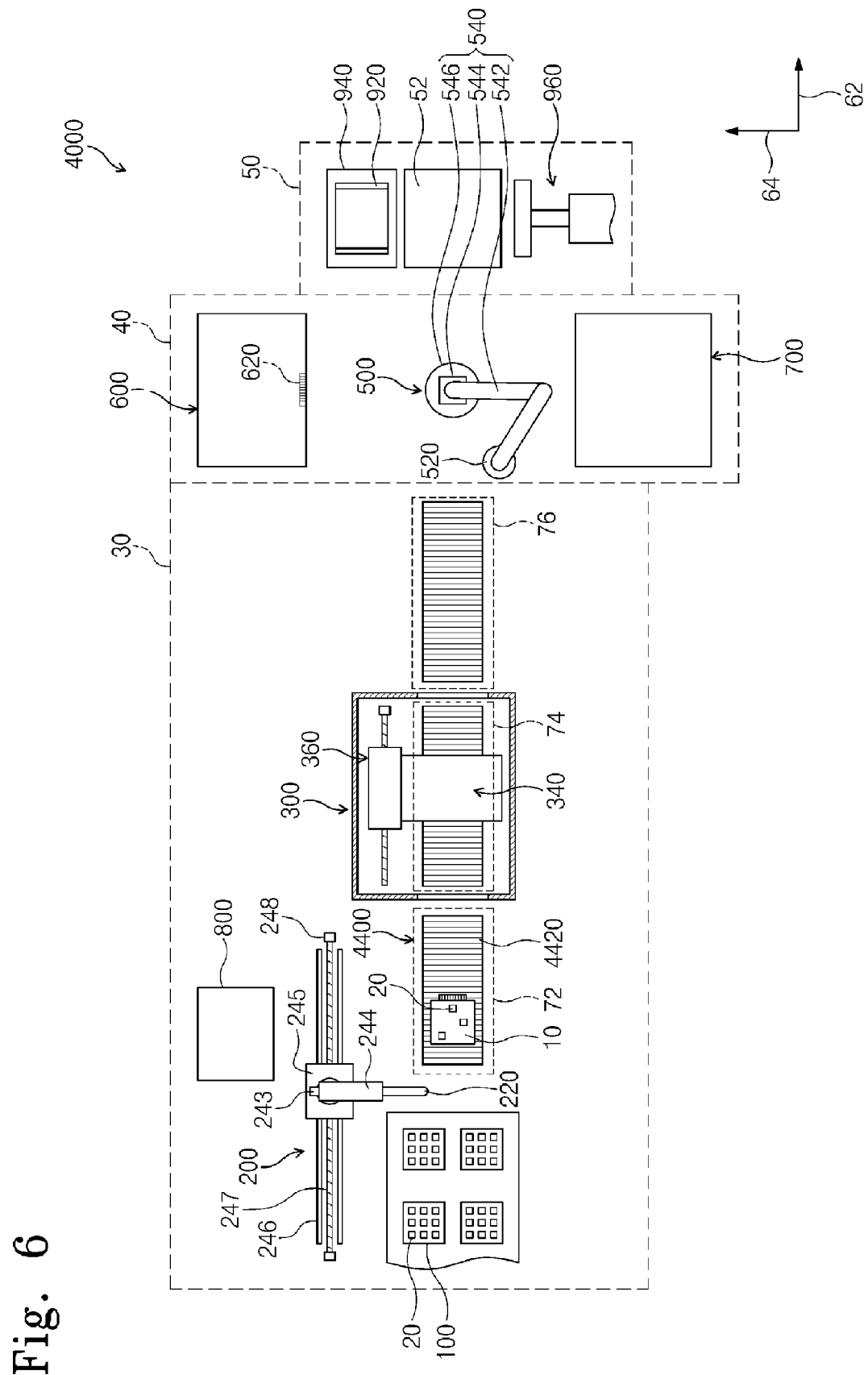

FIG. 6 illustrates a circuit manufacturing apparatus 4000 similar to the circuit manufacturing apparatus 3000 of FIG. 5. However, the circuit manufacturing apparatus 4000 is configured to transfer one circuit board 10 at a time in a width direction of the transfer conveyor 4420 instead of a plurality of circuit boards 10 on a board supporter 410. Consequently, the transfer conveyer 4420 of FIG. 6 is narrower than the conveyer 3420 in FIG. 5. In addition, the return mechanism 3460 of FIG. 5 may be omitted.

Referring to the circuit manufacturing apparatus 1000 of FIG. 2, a chip transfer unit 200 removes a semiconductor chip 20 from a chip supporter 100 and mounts the semiconductor chip 20 onto the board supporter 410 located on the transfer rails 420 in the first region 72. In addition, as discussed below, after the testing process is performed on the circuit board 10, the chip transfer unit 200 separates a faulty chip 20' from the printed circuit board during a rework process and transfers the faulty chip 20' into a faulty chip container 800.

Figure 7:
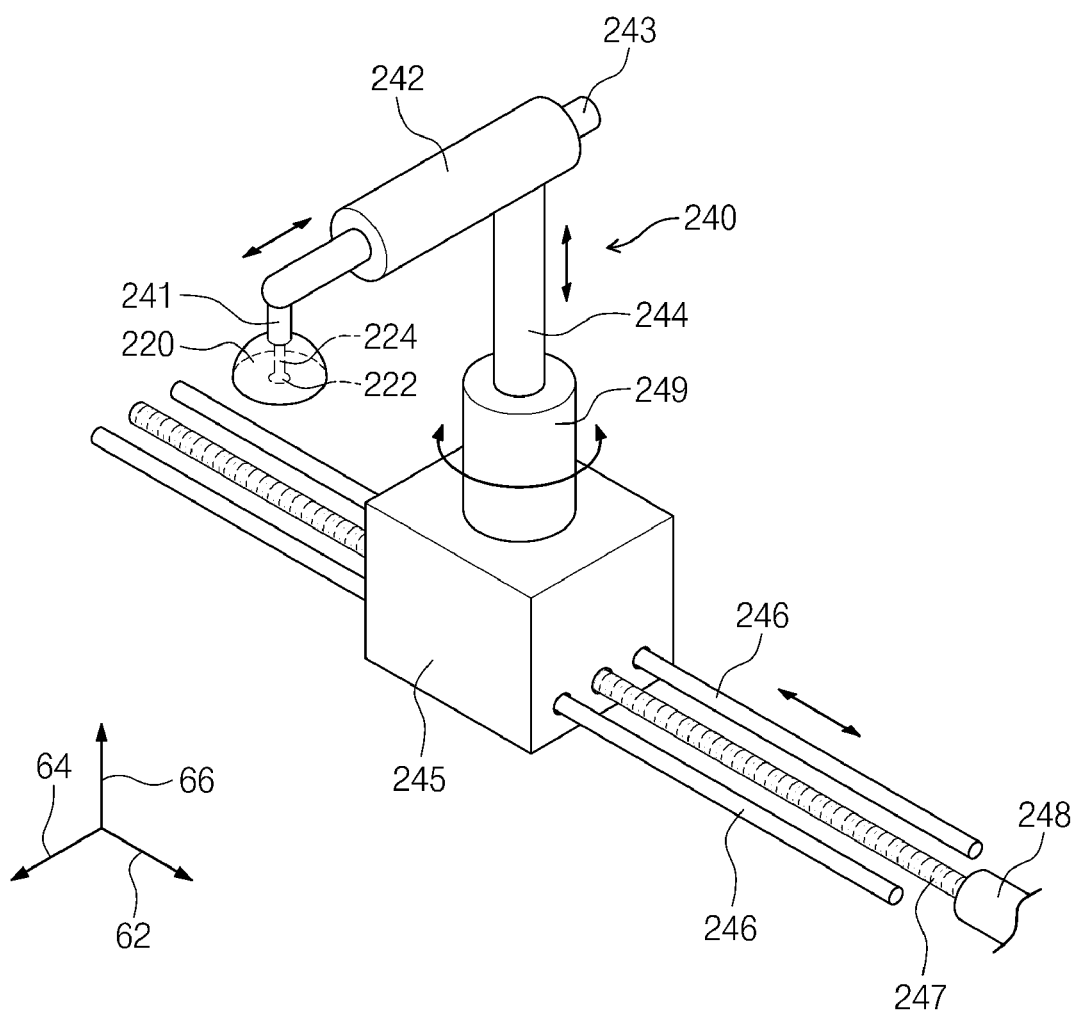
FIG. 7 is a perspective view of a chip transfer unit of FIG. 2.

FIG. 7 is a perspective view illustrating the chip transfer unit 200. The chip transfer unit 200 includes a pad 220 and a pad driver 240. The pad 220 holds the semiconductor chip 20. According to this embodiment, the pad 220 has a generally hemispheric form. The pad 220 may be formed of a soft material. An inlet 222 is located in a bottom section of the pad 220, and a vacuum line 224 is connected to the inlet 222.

The pad driver 240 may include a support bar 241 to support the pad 220, a horizontal transfer rod 242, a vertical transfer rod 244, a bracket 245, and a guide rail 246. The guide rail 246 is separated from the chip supporter 100 in the second direction 64, and its length direction is parallel to the first direction 62. The guide rail 246 has a length that extends from one side of the chip supporter 100 to one side of the first region 72. A screw 247 may be located adjacent to the guide rail 246 or between two guide rails 246. The bracket 245 may be mounted on the screw 247 and the guide rail 246, and a drive source 248 may rotate the screw 247 to move the bracket 245 in the first direction. The vertical transfer rod 244 is coupled to the bracket 245 and may be rotatable with respect to the bracket 245. The vertical transfer rod 244 may also be moveable vertically in the third direction 66. A drive source 249 mounted to the bracket 245 may rotate and move vertically the vertical transfer rod 244. The horizontal transfer rod 242 may be extendable in the second direction 64, or in a direction co-planar with a plane defined by the first and second directions 62, 64. A drive source 243 mounted to an end of the horizontal transfer rod 242 may extend and retract the horizontal transfer rod 242. The support bar 241 may be fixed to an end of the horizontal transfer rod 242 and may be connected to the pad 220.

Although an example of a chip transfer unit 200 has been described, the chip transfer unit 200 is not limited to this embodiment. The form of the pad 220, means to fix the semiconductor chip 20 to the pad 220 and to a printed circuit board 10, and the structure of the pad driver 240 may all be modified, as desired. For example, the chip transfer unit 200 may hold the semiconductor chip 20 through a non-contact method. Inhalation or injection may be performed using gases such as air, nitrogen, argon, hydrogen, etc. as a medium, such that a board is supported using Bernoulli's principle or buoyancy. The chip transfer unit 200 may support the semiconductor chip 20 using a mechanical mechanism or electrostatic force.

Referring again to the circuit manufacturing apparatus 1000 of FIG. 2, the board supporter 410 is moved from the first area 72 to the second area 74 including the heat unit 300. The heat unit 300 applies heat to the solder ball 22 of the semiconductor chip 20 mounted on the printed circuit board 10 through a reflow process. Additionally, the heat unit 300 applies heat to the flawed semiconductor chips 20' to melt the solder connection 22 between the flawed semiconductor chip 20' and the circuit board 10 to allow the semiconductor chip 20' to be easily separated from the printed circuit board 10.

Figure 8:
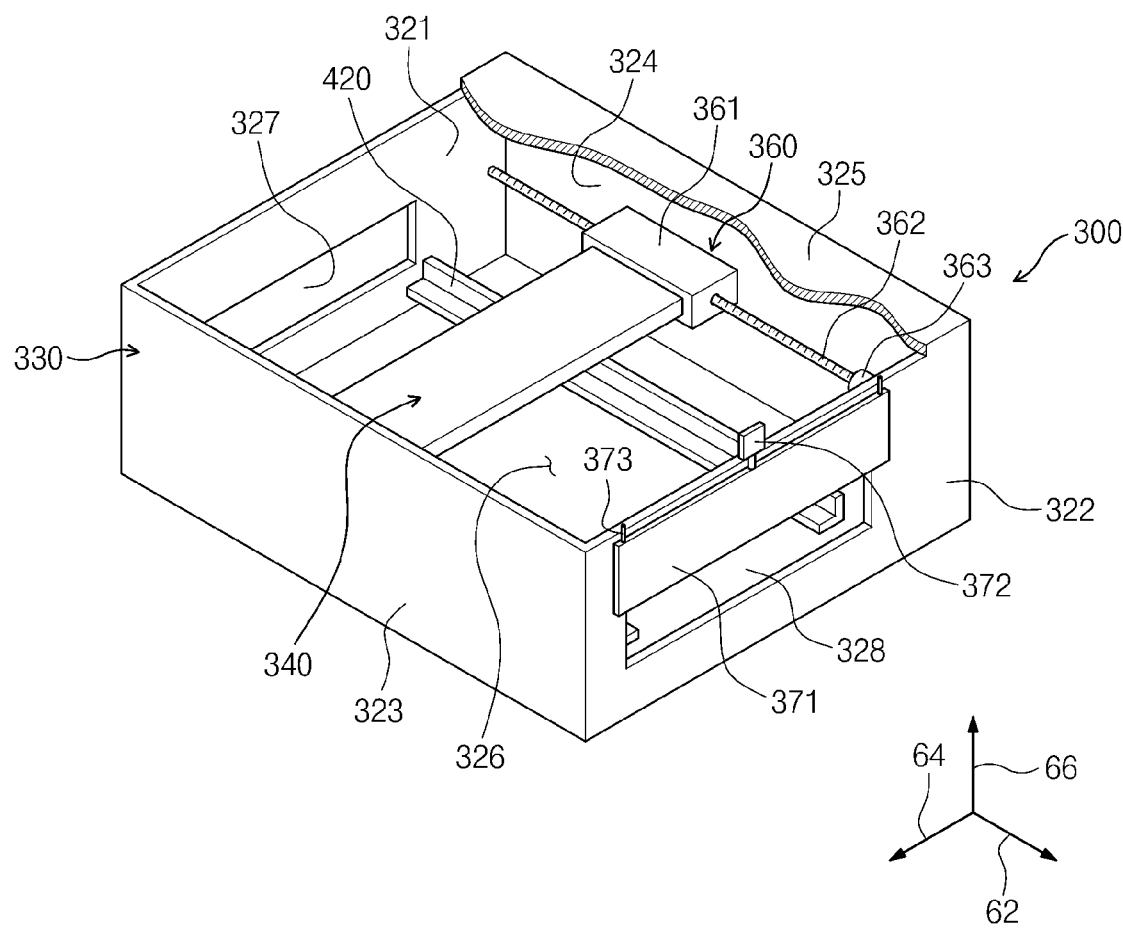
FIG. 8 is a perspective view of a heat unit of FIG. 2.

FIG. 8 is a perspective view illustrating the heat unit 300. The heat unit 300 is shown with an upper wall 325 that is partially cut to show the inside of the heat unit 300. The heat unit 300 includes a chamber 330, a heater 340, and a heater driver 360. The chamber 330 may have a substantially rectangular shape and may be formed of a metal material such as aluminum to block electromagnetic interference. The chamber 330 may have a length corresponding to the first direction 62, a width corresponding to the second direction 64, and a height corresponding to the third direction 66. The chamber 330 includes a front wall 321 facing the first region 72, a rear wall 322 facing the third region 76, a first sidewall 323, a second sidewall 324, a bottom wall 326, and a top wall 325. An entrance 327 is formed in the front wall 321 to function as an opening through which a printed circuit board 10 enters into the chamber 330. An exit 328 is formed in the rear wall 322 to function as an opening through which the printed circuit board 10 exits the chamber 330. A shutter (not shown) to open and shut the entrance 327 is installed in the front wall 321 of the chamber 330. A shutter 371 to open and shut the exit 328 is installed at the rear wall 322 of the chamber 330. Each shutter 371 may slide vertically to open and shut the entrance 327 or the exit 328 by a driver 372. A guide 373 is provided to guide a straight line movement of the shutter 371. The shutter 371 may be formed of a metal material such as aluminum to block electromagnetic interference.

The heat unit 300 may include transfer rails 420 to support and guide a board supporter 410 within the chamber 330. The heater 340 may be connected to the heater driver 360. The heater driver 360 moves the heater 340 linearly in the first direction 62. For example, once a reflow process of a first printed circuit board 10 is completed, the heater driver 360 moves the heater 340 linearly in the first direction 62 to perform a reflow process on another printed circuit board 10. The heater driver 360 includes a bracket 361 mounted to a screw 362. A drive source 363 may turn the screw 362 to move the bracket 361 and the heater 340 linearly, parallel to the first direction 62. The screw 362 may have a length direction that is parallel to the first direction 62, and both ends of the screw 362 may be fixed to the front wall 321 and the rear wall 322 of the chamber 330, respectively. The drive source 363 may be a motor, for example. The bracket 361 may be screw-coupled to the screw 362 to allow the bracket 361 to move in the first direction 62 along the screw 362. The heater 340 is fixed and coupled to the bracket 361 and thus moves together with the bracket 361. Although an example heater driver 360 is described above, any adequate heater driver may be used.

In addition, the board supporter 410 may be moved instead of or in addition to the heater 340. When a circuit board 10 is moved along the board transfer assembly 400 without a board supporter 410, the heater 340 may be stationary.

The heater 340 heats the solder ball or solder connection 22 via an induction heating method. When an alternating current is applied to the coil 342, an alternating magnetic field is generated in the coil 342. An eddy current is generated in a direction vertical to a direction of the magnetic field in a conductor placed within the magnetic field. The eddy current flows along the surface of the conductor and generates a heat.

Figure 9:
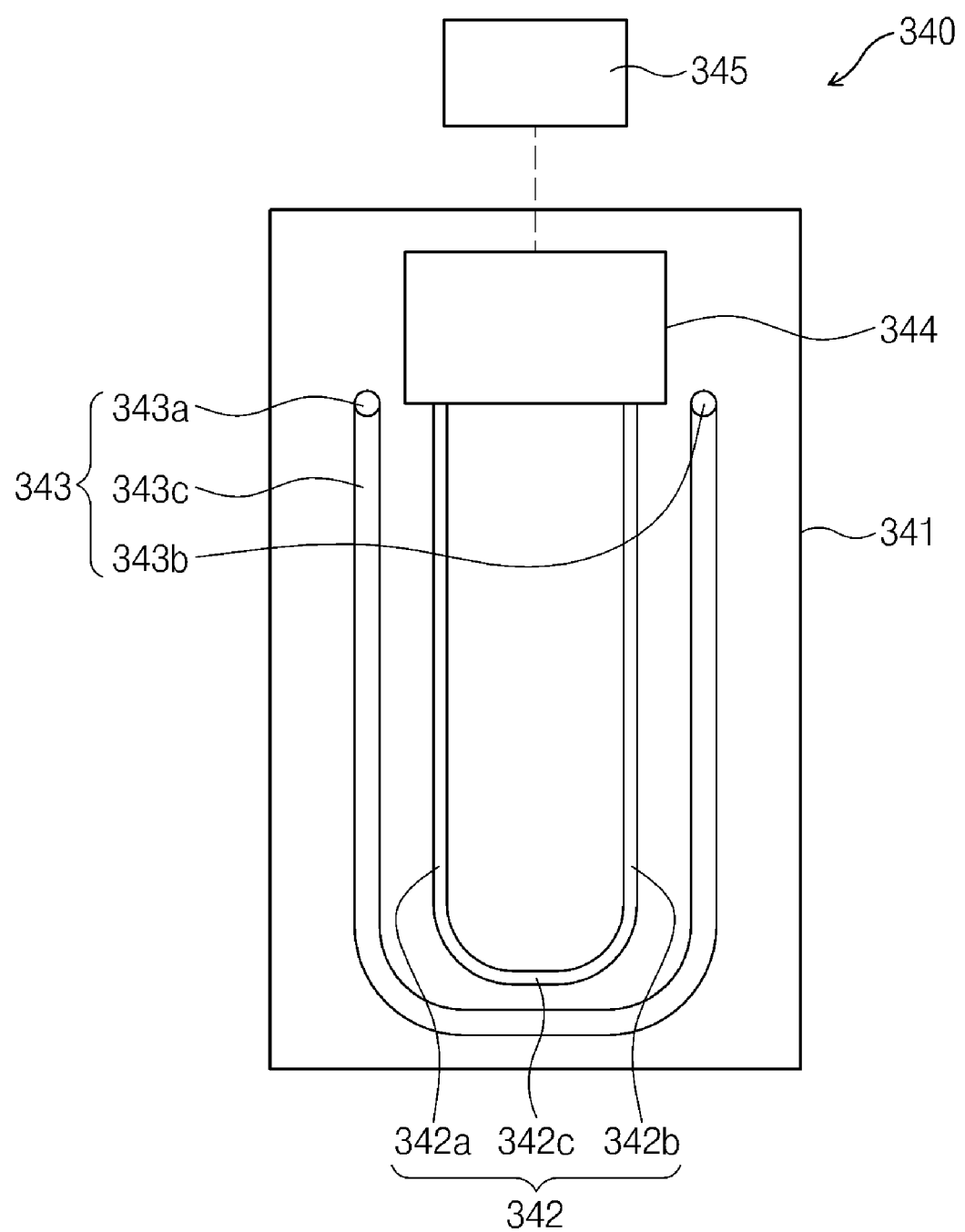
FIGS. 9 and 10 are a plan view and a perspective view, respectively, illustrating a heater of FIG. 8.
Figure 10:
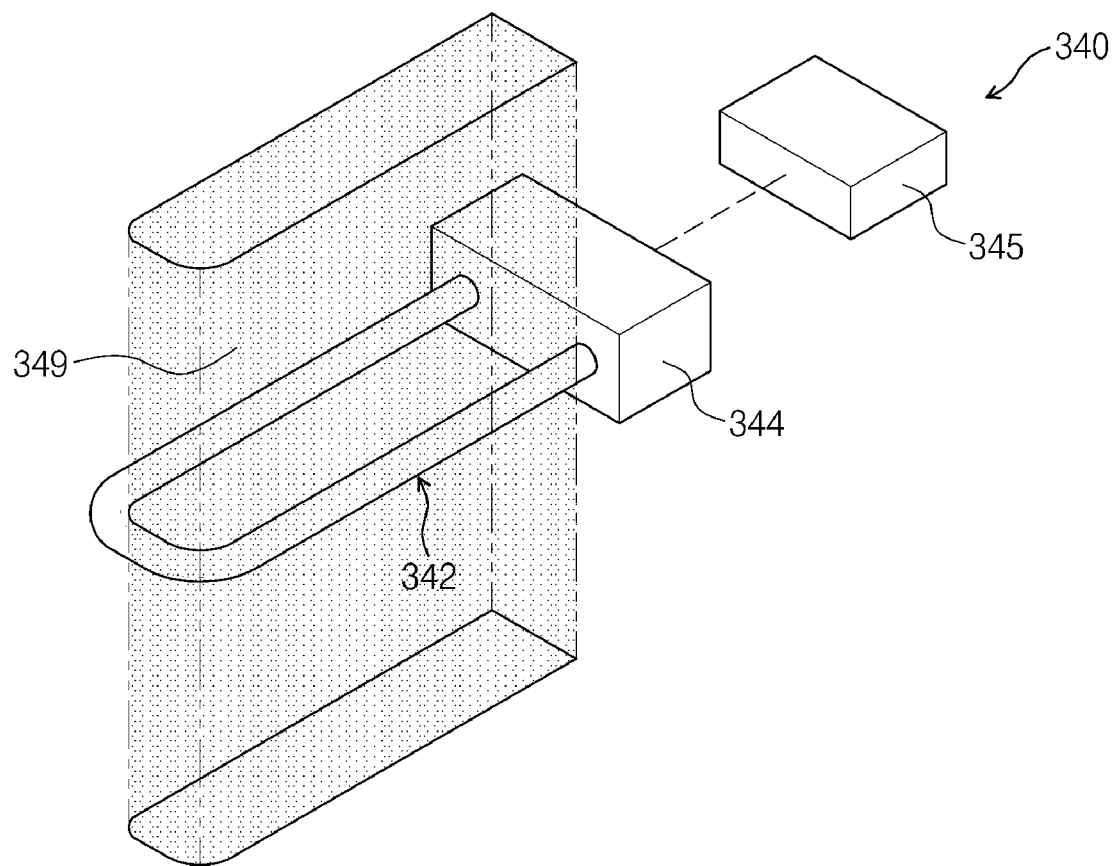

FIG. 9 is a plan view illustrating the heater 340. The heater 340 includes a housing 341, a power source 344, a coil 342, a cooling member 343, and a controller 345. The housing 341 may have a substantially rectangular shape. The coil 342, the power source 344, and the cooling member 343 are installed inside the housing 341. The coil 342 may include a first straight line section 342a and a second straight line section 342b parallel to the first straight line section 342a and also a connection section 342c connecting the first straight line section 342a and the second straight line section 342b. The connection section 342c may be a straight line or curved. The first straight line section 342a and the second straight line section 342b may be located at the same height relative to the bottom wall 326 of the heat unit 300. The first straight line section 342a and the second straight line section 342b may have the same length and may each be parallel to the second direction 64. The power source 344 applies an alternating current to the coil 342 and is controlled by the controller 345. A current may be provided with a frequency of several tens of KHz to several MHz. As illustrated in FIG. 10, a region heated by the coil 342 substantially includes a region surrounded by the first straight line section 342a, the connection section 342c, and the second straight line section 342b and a corresponding region extending vertically upwards and downwards from the coil. Hereinafter, those regions are referred to as a heating space 349.

Figure 11A:
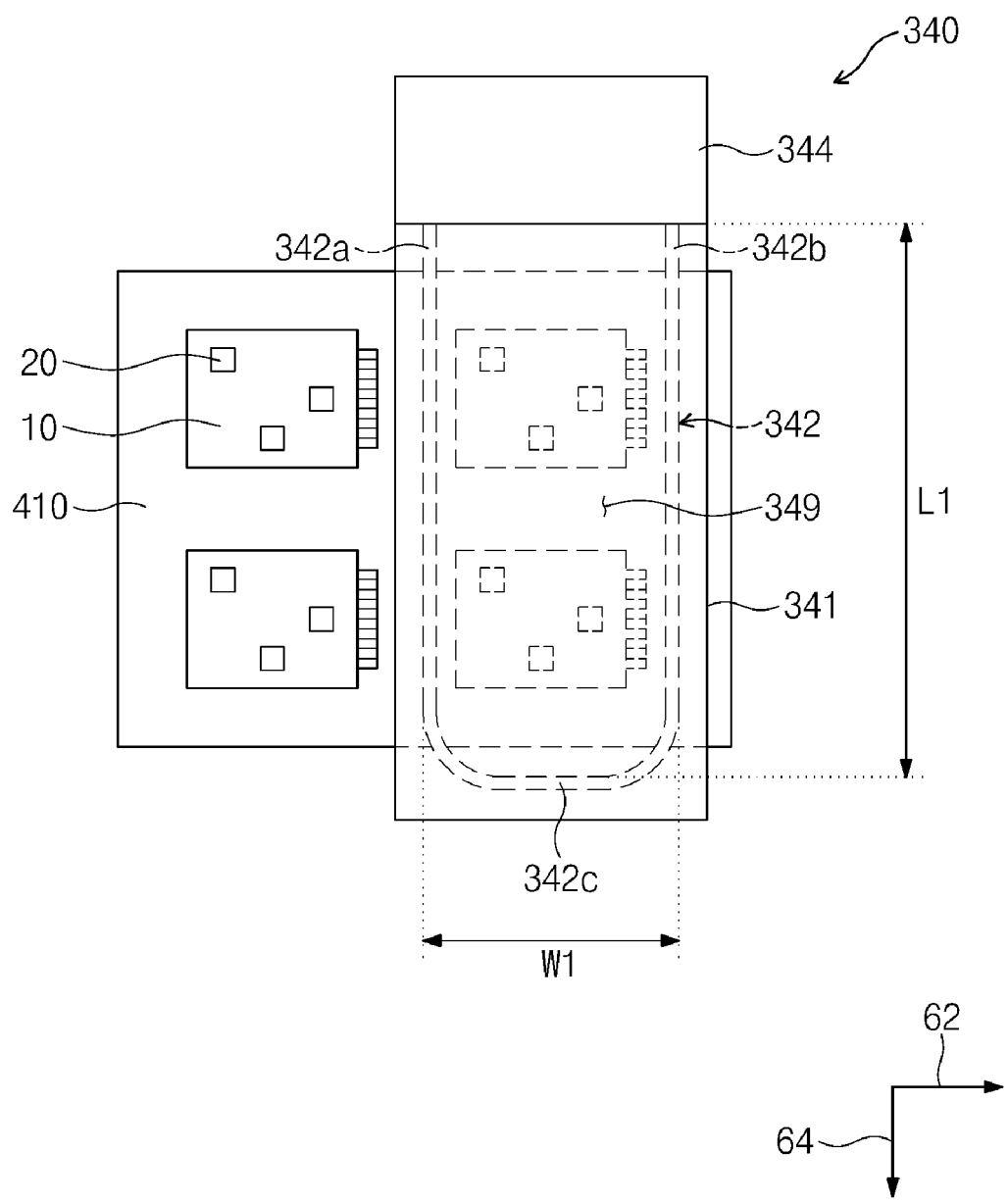
FIG. 11A is a plan view illustrating relationship between a supporter having printed circuit boards thereon and a heater of FIG. 9.
Figure 11B:
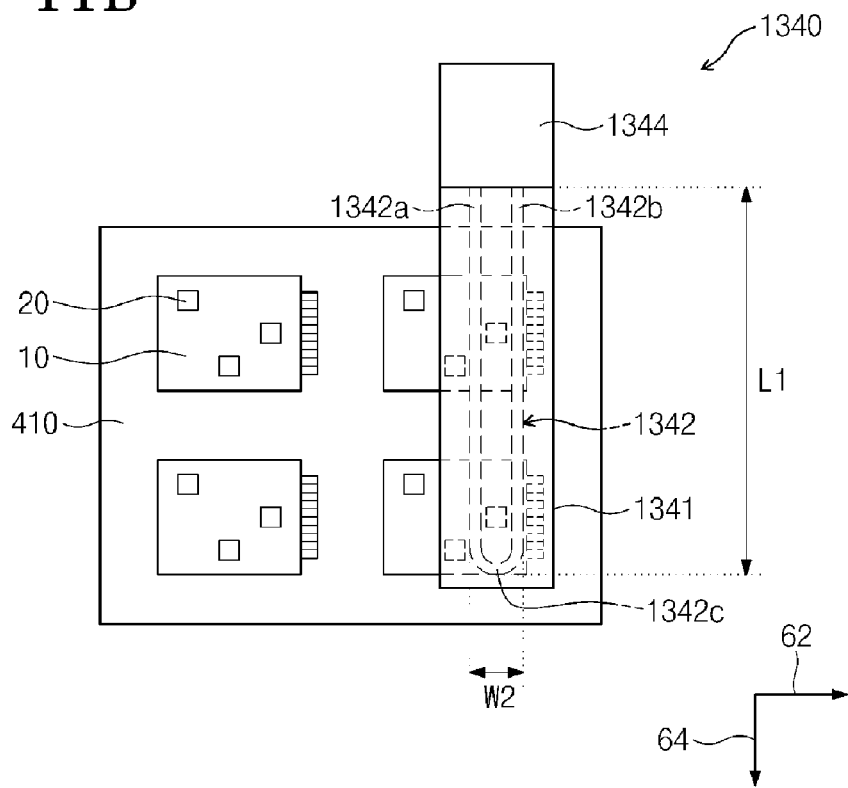
FIGS. 11B through 18 are plan or perspective views illustrating additional configurations of the heat unit of FIG. 8.
Figure 11C:
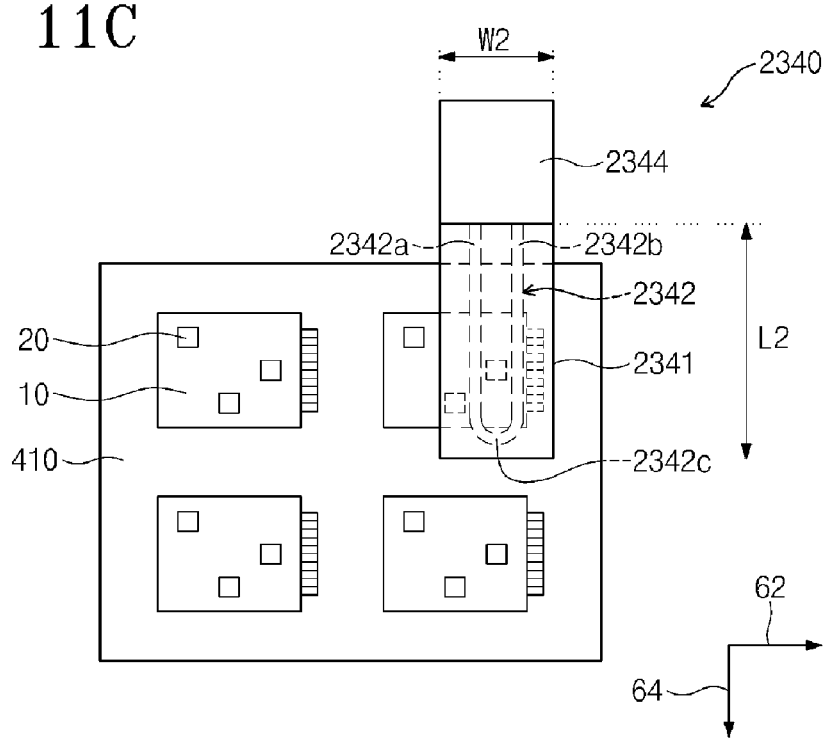

FIGS. 11A-11C illustrate heaters 340, 1340, 2340 of varying sizes to perform different functions. In FIG. 11A, the coil 342 has a length L1 and a width W1 sufficient to encompass two circuit boards 10 within the heating space 349 generated by the coil 342. Specifically, the first straight line section 342a and the second straight line section 342b have a length L1 longer than two circuit boards 10 side-by-side, and the connection portion 342c of the coil 342 has a width W1 wider than only one circuit board 10. However, the width W1 of the coil 342 may be increased to allow a plurality of printed circuit boards 10 to be located within in the heating space 349 in the width W1 direction, or the first direction 62.

In FIG. 11B, the heater 1340 includes a coil 1342, a power source 1344, and a housing 1341. The coil 1342 includes first and second length portions 1342a, 1342b and a connection portion 1342c connecting the first and second length portions 1342a, 1342b. The width W2 of the coil 1342 is narrower than the width of the coil 342 in FIG. 11A. The width W2 of the coil 1342 may be sufficiently narrow to allow only one semiconductor chip 20 to fit within the heating space 349 in the first direction 62. In FIG. 11B, the length L1 of the coil 1342 is still sufficient to allow semiconductor chips 20 from two circuit boards 10 arranged side-by-side to fit within the heating space 349 in the second direction 64.

FIG. 11C illustrates the coil 2342 having a narrow width W2 and a shorter length L2 than the coil 342 illustrated in FIG. 11A. The heater 2340 includes a coil 2342, a power source 2344, and a housing 2341. The coil 2342 includes first and second length portions 2342a, 2342b and a connection portion 2342c connecting the first and second length portions 2342a, 2342b. The coil 342 has the width W2 sufficient to allow only one semiconductor chip 20 to fit within the heating space 349 in the first direction 62 and a length L2 sufficient to allow only one printed circuit board 10 to be located within the heating space 349 in the second direction 64.

Referring to FIG. 9 again, the cooling member 343 includes an inlet 343a, a cooling line 343c, and an outlet 343b. The inlet 343a and the outlet 343b may be formed in the bottom of the housing 341. A supply pipe (not shown) that supplies a fluid to the cooling member 343 is connected to the inlet 343a, and a discharge pipe (not shown) that discharges a cooling fluid is connected to the outlet 343b. The cooling line 343c extends from the inlet 343a to the outlet 343b inside the housing 341. The cooling line 343c may surround an outside edge of the coil 342 on the same plane as the coil 342. The cooling fluid flows into the housing 341 through the inlet 343a and then flows along the cooling line 343c to cool the coil 342 and then flows out the external of the housing 341 through the outlet 343b. The fluid may include de-ionized water, glycerin, or air, for example.

Figure 12:
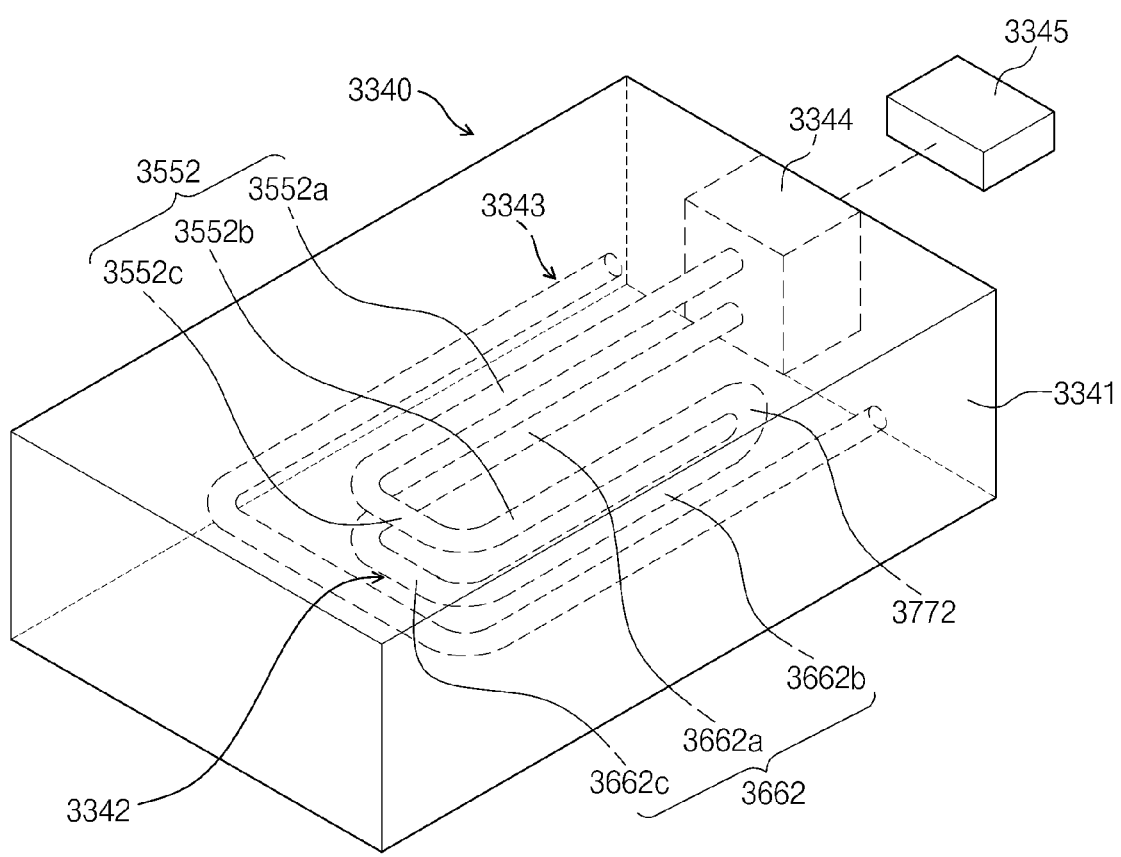

FIG. 12 is a perspective view illustrating another heater 3340. The heater 3340 includes a housing 3341, a cooling member 3343, a coil 3342, a power source 3344, and a controller 3345. The housing 3341, the cooling member 3343, the power source 3344, and the controller 3345 have a similar structure as the housing 341, the cooling member 343, the power source 344, and the controller 345 of FIG. 9. The coil 3342 includes a first coil unit 3552 and a second coil unit 3662. Each of the coil units 3552 and 3662 includes first straight line sections 3552a and 3662a, second straight line sections 3552b and 3662b, and connection sections 3552c and 3662c. The first straight line sections 3552a and 3662a, the second straight line sections 3552b and 3662b, and the connection sections 3552c and 3662c have a similar form and disposition as the first straight section 342a, the second straight line section 342b, and the connection section 342c of FIG. 9. The first coil unit 3552 and the second coil unit 3662 are electrically connected to each other. A connection part 3772 may be further provided to connect the first coil unit 3552 and the second coil unit 3662. The first coil unit 3552 and the second coil unit 3662 may be positioned to mirror each other in a vertical direction. In addition, if desired, three or more coil units may be provided and may be stacked vertically.

Figure 13:
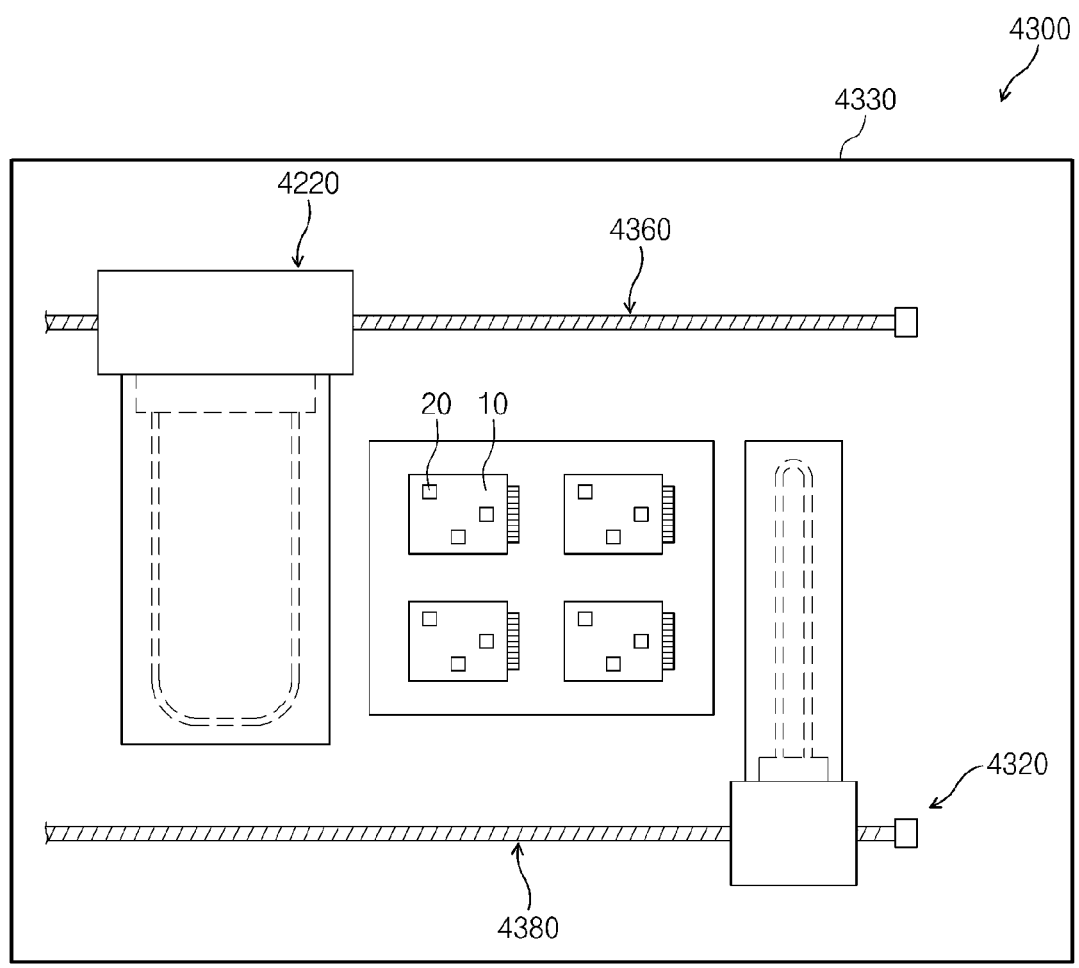

FIG. 13 is a perspective view illustrating another heat unit 4300. The heat unit 4300 includes a chamber 4330, a first heater 4220, and a second heater 4320. The chamber 4330 has a similar structure and form as the chamber 330 of FIG. 8. The first heater 4220 has a similar structure, form, and size as the heater 340 of FIG. 11A. The second heater 4320 may have a similar structure as the heater 1340 illustrated in FIG. 11B. The first heater 4220 and the second heater 4320 are simultaneously located within the chamber 4330. The first heater 4220 and the second heater 4320 may be moved linearly along the first direction 62 by the first heater driver 4360 and the second heater driver 4380. The first heater driver 4360 and the second heater driver 4380 may be separated from each other along the second direction 64, and may be located on opposite sides of a center line of the chamber 4330, the center line corresponding to the first direction 62. The first heater 4220 may be used to perform a reflow process on the solder ball 22 after it is initially mounted on the printed circuit board 10. The second heater 4320 may be used to perform a reflow process on a solder ball or solder connection 22 of a faulty chip 20' during a rework process to prepare the faulty chip 20' to be removed from the printed circuit board 10.

Figure 14:
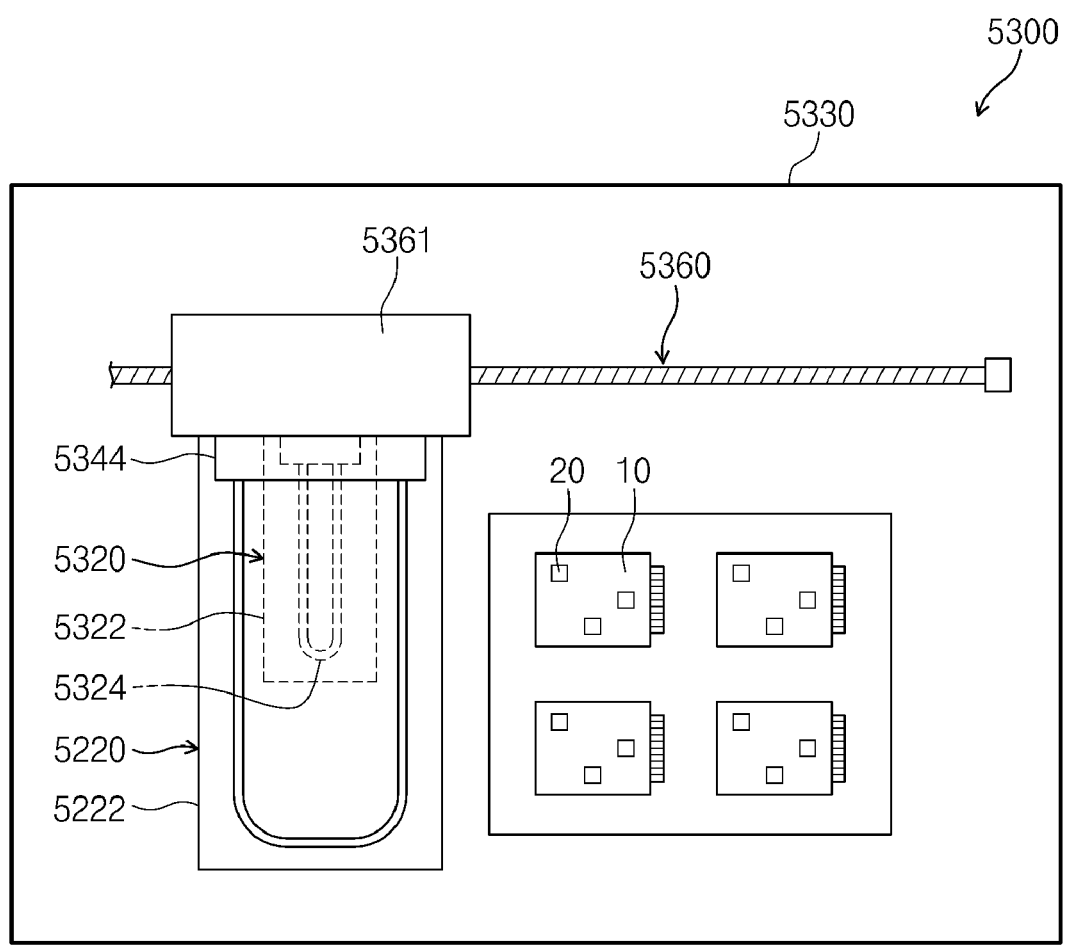

FIG. 14 is a plan view illustrating another heat unit 5300. The heat unit 5300 includes a chamber 5330, a first heater 5220, a second heater 5320, and a heater driver 5360. The first heater 5220 may be interchangeable in the bracket with the second heater 5320. In other words, the first heater 5220 may used to perform an initial reflow process, then the first heater 5220 may be removed from the bracket 5361 and the second heater 5320 may be used to perform a rework process to remove a faulty chip 20' from the circuit board 10. The chamber 5330 and the heater driver 5360 have a similar structure and form as the chamber 330 and the heater driver 360 of FIG. 7. The first heater 5220 has a similar structure and size as the heater 340 of FIG. 11A. The second heater 5320 has a similar structure and size as the heater 2340 of FIG. 11C. A power source 5344 is provided to each of the first and second heaters 5220 and 5320. The power source 5433 may be either a shared power source 5433, or each of the first and second heaters 5220 and 5320 may each have a separate power source 5433.

Figure 15:
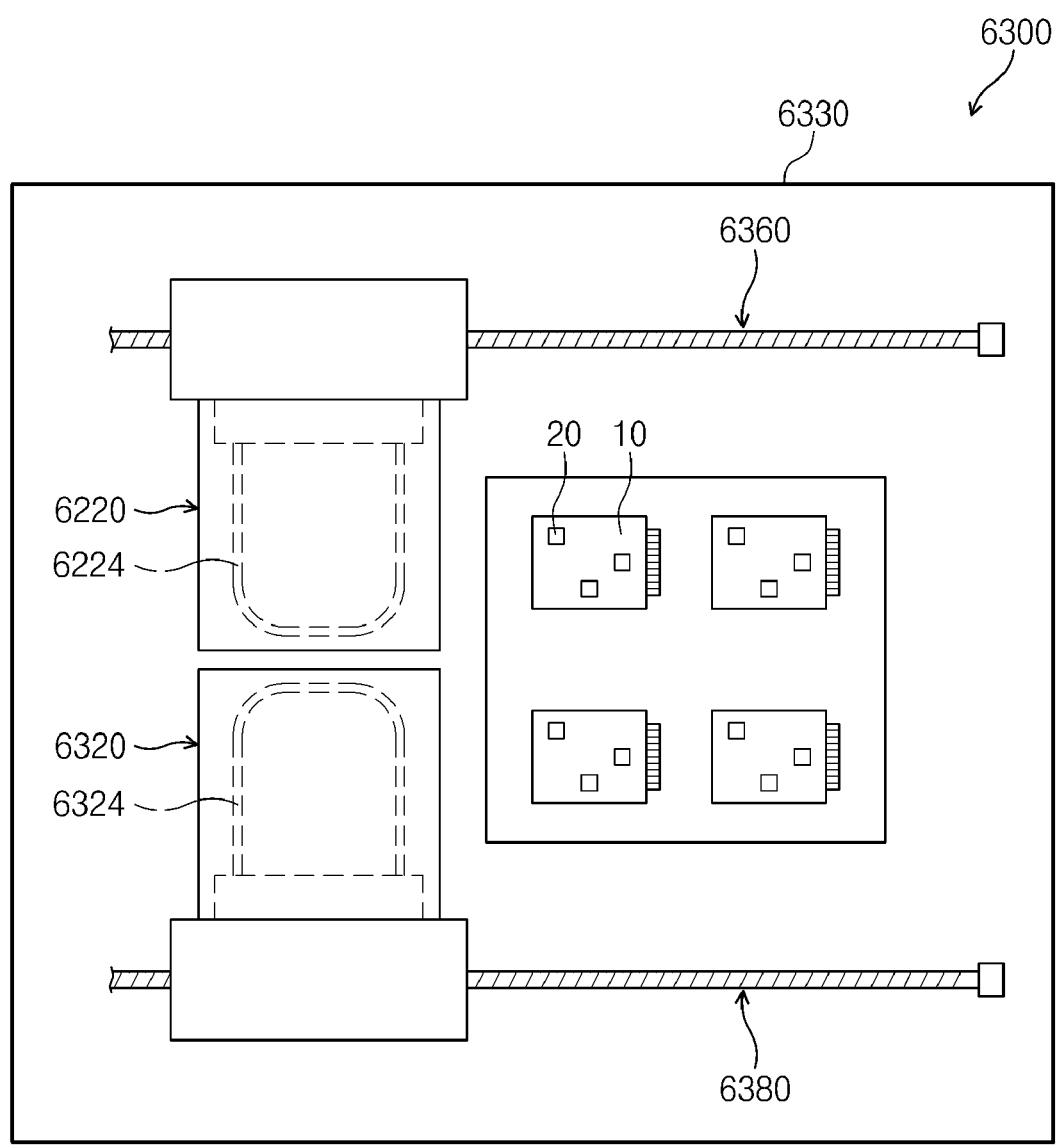

FIG. 15 is a plan view illustrating another heat unit 6300. The heat unit 6300 includes a chamber 6330, a first heater 6220, a second heater 6320, a first heater driver 6360, and a second heater driver 6380. The chamber 6330 has a similar structure and form as the chamber 330 of FIG. 8. The first heater 6220 and the second heater 6320 may be located opposite to each other on either side of a center line of the chamber 6300 parallel to the first direction 62. The lengths of coils 6224 and 6324 provided in the first heater 6220 and the second heater 6320 may be shorter than the length of the coil 342 provided in the heater 340 of FIG. 11A. According to the heaters 6220, 6320 shown in FIG. 15, the first heater 6220 and the second heater 6320 have lengths sufficient to fit only one printed circuit board 10 within the corresponding heating spaces 349.

As shown in FIG. 15, the first heater 6220 may perform a reflow process of a printed circuit board 10 in one column of a board supporter 410. The second heater 6320 may perform a reflow process of a printed circuit board 10 in another column of the board supporter 410. The first heater 6220 and the second heater 6320 may have the same form and size and may be symmetrical to each other with respect to the center line of the chamber 6330 in the first direction 62. Power sources 6226 and 6326 are respectively provided to the coil 6224 of the first heater 6220 and the coil 6324 of the second heater 6320. Alternatively, the coil 6224 of the first heater 6220 and the coil 6324 of the second heater 6320 may share one power source. The first heater driver 6360 moves the first heater 6220 in a straight line and the second heater drivers 6380 moves the second heater 6329 in a straight line. The first heater driver 6360 and the second heater driver 6380 may have the same structure and form as the heater driver 360 of FIG. 8.

Performing a reflow process or a rework process using an induction heating method has a benefit of having a short heating time so the reflow process is performed quickly. Additionally, when an induction heating method is used, only a conductor is heated so the semiconductor chip 20 and the printed circuit board 10 are not directly exposed to a heat of a high temperature. Accordingly, the semiconductor chip 20 and the printed circuit board 10 may avoid thermal warping or damage. Additionally, since the configuration of the heat unit is simple and its occupying area is small, an overall area of a module apparatus can be reduced.

Figure 16:
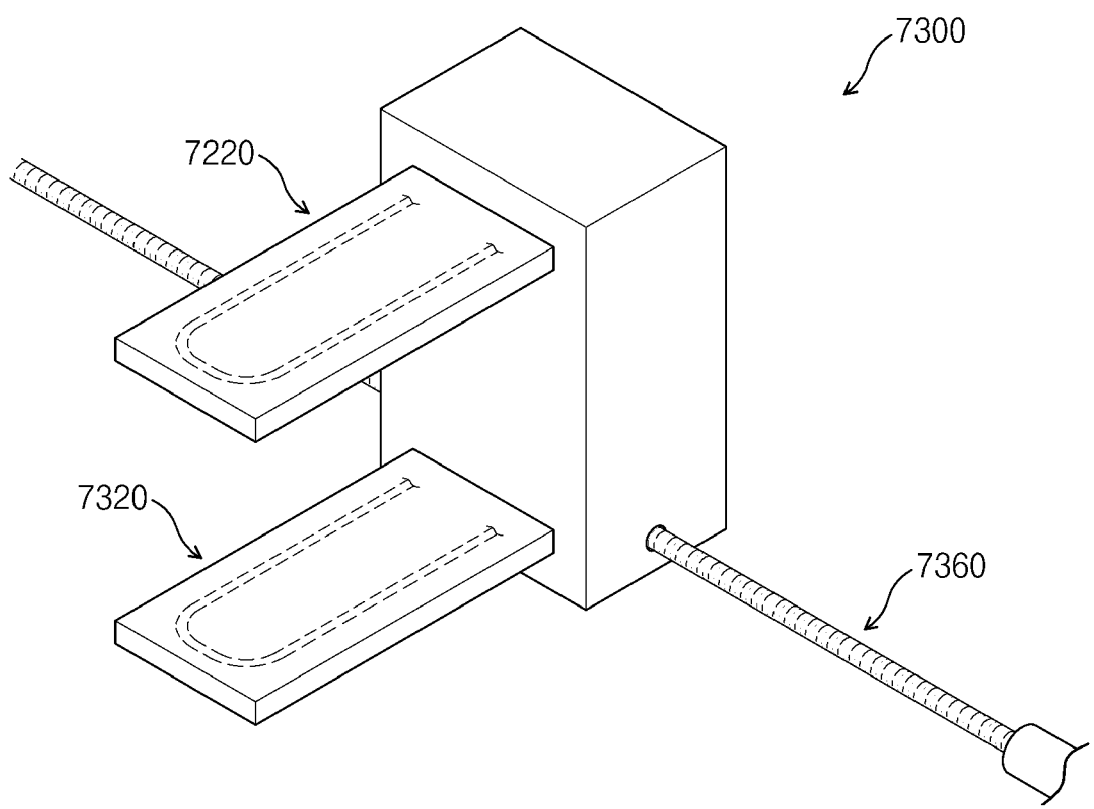

FIG. 16 illustrates another embodiment of a heat unit 7300. In FIG. 16, the heat unit 7300 includes first and second heaters 7220, 7320 connected to a bracket 7361. The bracket is connected to a drive unit 7360 to move the heaters 7220, 7320 in the first direction 62. The heaters 7220, 7320 may be stacked vertically in the third direction 66, and may be positioned so that one heater 7320 is located below a board supporter 410 or printed circuit board 10 and the other heater 7220 is located above the board supporter 410 or printed circuit board 10. Alternatively, bother of the heaters 7220, 7320 may be located above or below the board supporter 410 or printed circuit board 10.

Figure 17:
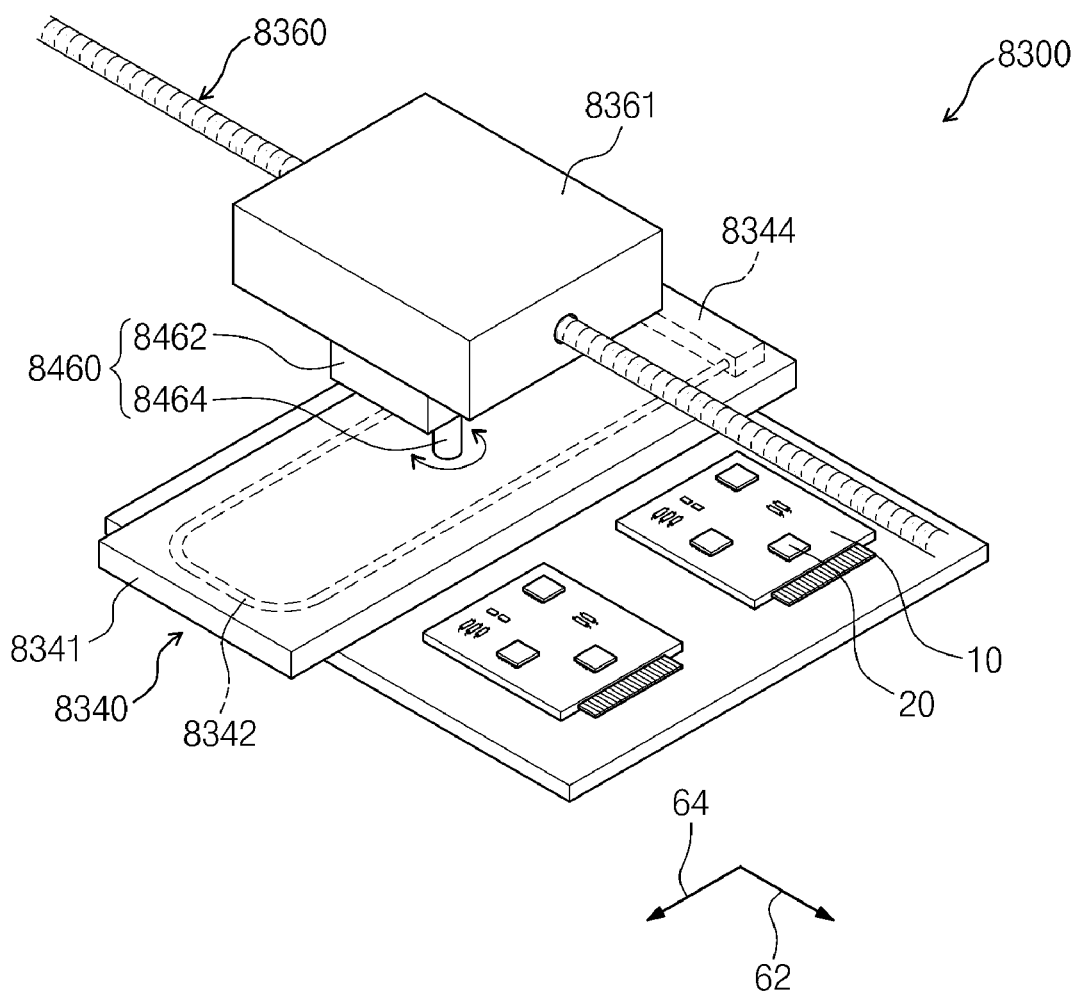

FIG. 17 is a perspective view illustrating another heat unit 8300. The heater 8340 in the heat unit 8300 includes a housing 8341, a cooling member (not shown), a coil 8342, a power source 8344, and a controller (not shown), and a rotation member 8460. The housing 8341, the cooling member (not shown), the coil 8342, the power source 8344, and the controller (not shown) may have similar structures and forms as the heater 340 of FIG. 10. The rotation member 8460 may be coupled to the bracket 8361, and the housing 8341 may be rotatably coupled to the rotation member 8360. The rotation member 8460 may rotate around an axis parallel to the third direction 66, so that the coil 8342 rotates on a plane that is substantially parallel to the surface of the printed circuit board 10. The rotation member 8460 includes a rotation axis 8464 coupled to the upper wall of the housing 8341 and a motor 8462 to provide a rotation force to the rotation axis 8464. The motor 8462 may be coupled to the bottom of the bracket 8361 or may be a part of the bracket 8361. The bracket 8361 may be configured to move linearly in the first direction 62 along a heater driver 8360 or other guide.

Rotating the coil improves heating uniformity of the solder balls 22 when a plurality of solder balls or solder connections 22 is provided on each semiconductor chip 20. The rotation member 8460 may continuously rotate the coil 8342 in one direction or may rotate the coil 8342 in different directions. Additionally, the rotation member 8460 may rotate the coil 8342 continuously or may rotate the coil 8342 by a predetermined angle and then stop the coil 8342. This process may be repeatedly performed.

Figure 18:
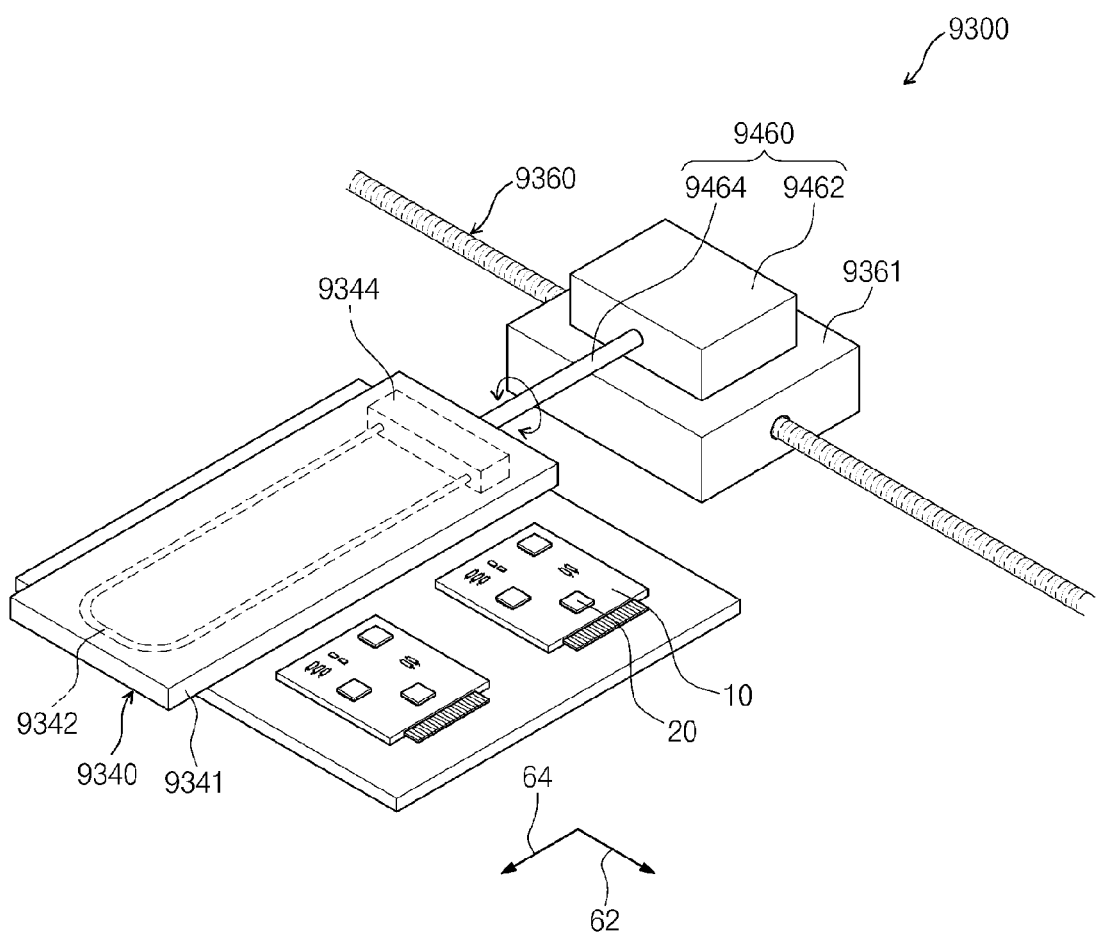

FIG. 18 is a perspective view illustrating another heat unit 9300 including a heater 9340 and a rotation member 9460. The heater 9340 of the heat unit 9300 includes a housing 9341, a cooling member (not shown), a coil 9342, a power source 9344, a controller (not shown), and a rotation member 9460. The housing 9341, the cooling member (not shown), the coil 9342, the power source 9344, and the controller (not shown) may have a similar structure and form as those of the heater 340 of FIG. 10. The rotation member 9460 may rotate the coil 9342 to alter an angle with respect to the surface of the printed circuit board 10 and a plane passing through a center of the coil 9342. The rotation member 9460 may include a rotation axis 9464 coupled to the sidewall of the housing 9341 and a motor 9462 to provide a rotation force to the rotation axis 9464. The rotation axis 9464 is parallel to the surface of the printed circuit board 10, and may extend in the second direction 64, so that the coil 9342 rotates around the rotation axis 9464 extending in the second direction 64. The motor 9462 may be coupled to one side of the bracket 9361 of the heater driver 9360. A center plane passing through a center of the entire coil may rotate between about −90° and about +90° relative to a surface of the printed circuit board 10. In other words, the coil may rotate from a position where a first edge of the coil 9342 faces the surface of the printed circuit board 10 to a position where the second edge of the coil 9342 opposite the first edge faces the surface of the printed circuit board. The rotation member 9460 may continuously rotate the coil 9342, or it may rotate the coil 9342 by a predetermined angle and then stop the coil 9342, and this may be repeatedly performed.

Figure 19A:
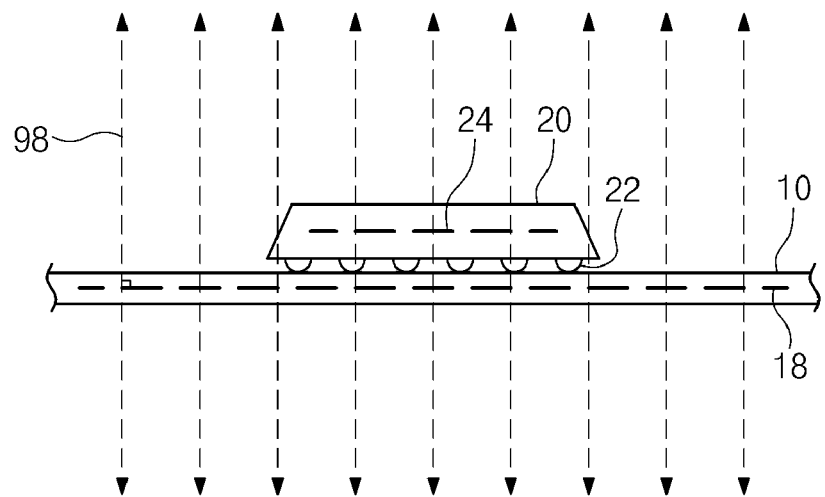
FIGS. 19A and 19B are views when a direction of a magnetic force line affects a printed circuit board or a semiconductor chip.
Figure 19B:
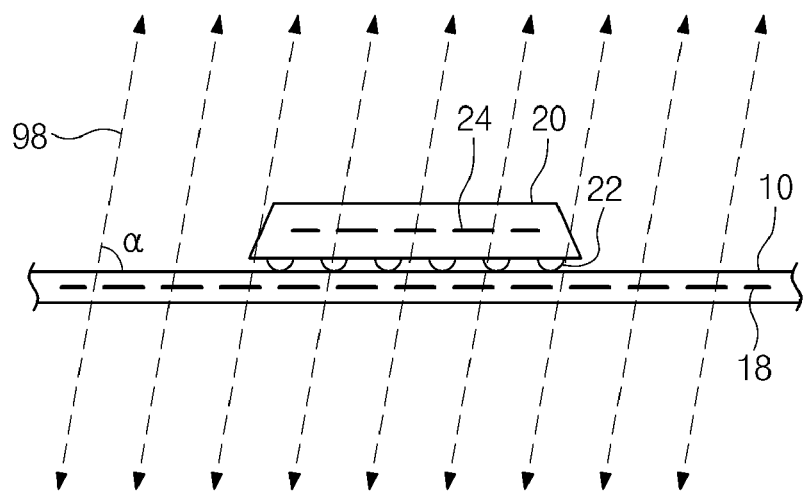

FIGS. 19A and 19B illustrate a plurality of conductive lines or wiring 18 and 24 inside the printed circuit board 10 and the semiconductor chip 20, respectively, that are substantially parallel to the surface of the printed circuit board 10. When a plane passing through a center of the entire coil 9342 is parallel to the surface of the printed circuit board 10, or when the coil 9342 is in a non-rotated position, as shown in FIG. 19A, the conductive lines 18 and 24 and a magnetic line 98 are substantially perpendicular to each other, causing the conductive lines 18, 24 to be heated at a high temperature. However, as shown in FIG. 19B, when the coil 9342 is rotated so that the printed circuit board 10 has an inclination α with respect to the magnetic lines 98 generated by the coil, the conductive lines 18 and 24 are prevented from being heated continuously with a high temperature.

Where the first direction 62 and the second direction 64 define a first plane, and the entire coil 9342 is located along the first plane when the coil 9342 is in a non-rotated state, the coil 9342 may be rotated to any angle between −90° and +90° with respect to the first plane. For example, the coil 9342 may be rotated +10°, so that the angle α of the magnetic lines 98 with respect to the surface of the printed circuit board 10 is +80°. Alternatively, the coil may be rotated 45° so that the angle α of the magnetic lines 98 with respect to the surface of the circuit board 10 is 45°. The coil 9342 may then be rotated in the opposite direction to form a −45° angle α between the magnetic lines 98 and the surface of the circuit board 10, if desired.

The coils of any of the above examples may have a circular form or polygonal form. In addition, a cooling member of any of the above examples may be located outside the coil or inside the coil. FIG. 20A illustrates a circular cross-section of coil 342 having a cooling member 343 located on an inside of the coil 342. FIG. 20B illustrates a cross-section of coil 342 having a triangular shape and a cooling member 343 located on the inside of the coil 342. FIG. 20C illustrates a cross-section of coil 342 having a polygonal shape and a cooling member 343 located on the inside of the coil 342. Providing a coil 342 with a polygonal cross-sectional shape may provide a magnetic field having different characteristics than a coil 342 having a circular cross-sectional shape.

Referring to FIGS. 2 and 4 through 6 again, after the printed circuit board 10 is submitted to the reflow process in the heat unit 300, the printed circuit board 10 is moved to the third region 76. The printed circuit board 10 may then be tested in the second unit 40. The second unit 40 includes a board moving member 500, a tester 600, and a faulty board storage 700. The board moving member 500 is positioned between the third region 76 and the unloader unit 50. The tester 600 and the faulty board storage 700 may be positioned on sides of the board moving member 500 along the second direction 64. For example, the tester 600 and the faulty board storage 700 may be positioned on opposite sides of the board moving member 500. Additionally, the unloader unit 50 and the second region 74 may also be located on opposite sides of the board moving member 500. In other words, the second region 74, the tester 600, the unloader unit 50, and the faulty board storage 700 may be positioned at four edges around the board moving member 500. Alternatively, the positions of the tester 600, the faulty board storage 700, the board moving member 500, and the unloader unit 50 may be changed according to a desired design and function.

The board moving member 500 moves the printed circuit board 10 from the third region 76 into the tester 600. Additionally, the board moving member 500 transfers the printed circuit board 10 that has been tested in the tester 600 into either the unloader unit 50 or the faulty board storage 700. Additionally, the board moving member 500 transfers printed circuit boards 10 stored in the faulty board storage 700 into the third region 76 to begin a rework process. Alternatively, transferring the printed circuit board 10 from the third region 76 to the tester 600, from the tester 600 to the faulty board storage 700, from the tester 600 to the unloader unit 50, and from the faulty board storage 700 to the third region 76 may be performed by different transfer members or manually performed by a user.

The board moving member 500 has a pad 520 and a pad driver 540. The pad driver 540 includes an arm 542, a vertical rod 544, and a rotating plate 546. The pad 520 holds the printed circuit board 10. The pad 520 may have a flat circular bottom surface and a substantially hemispheric form. An inlet (not shown) may be formed in the bottom surface of the pad 520. A vacuum line (not shown) may be connected to the inlet to apply a vacuum to the printed circuit board 10 positioned adjacent to the inlet. The arm 542 moves the pad 520 along a plane parallel to the plane defined by a line traveling in the first direction 62 and a line traveling in the second direction 64. The arm 520 may have a plurality of joints connected by a rotation axis. The arm 520 may be coupled to the end of the vertical rod 544. The vertical rod 544 may be connected to a drive source (not shown) such as a motor that causes the vertical rod 544 to move vertically in the third direction 66. The vertical rod 544 may be coupled to the rotating plate 546 and the rotating plate 546 may be rotated by a motor (not shown). The above-described structure of the board moving member 500 corresponds to just one example, but any pad 520, any method of attaching a printed circuit board 10 to the board moving member 500, or any structure of the pad driver 540 may be used.

When the board supporter 410 is used, as shown in the module apparatuses 1000 and 3000 of FIGS. 2 and 5, the board supporter 410 may be removed from the third region 76 by a worker or an external transfer device 470 once all of the printed circuit boards 10 from the board supporter 410 have been moved to either the unloader 50 or the faulty board storage 700. The board supporter 410 may be transferred into the return members 460, 3460 or may be stored in an additional storage member (not shown).

The board moving member 500 moves the printed circuit board 10 from the third region 76 to the tester 600. The tester 600 tests whether an electrical connection including the solder ball 22 between the printed circuit board 10 and the semiconductor chip 20 is acceptable. The tester 600 includes test terminals 620 that are electrically connected to the connection terminals 12 of the printed circuit board 10 during testing. The tester 600 has an insertion slot 640 at one side where the connection terminals 12 of the printed circuit board 10 are inserted. One side of the printed circuit board 10 inserted into the insertion slot 640 is a place where the connection terminals 12 are formed. The test terminals 620 of the tester 600 are provided in the insertion slot 640 to allow the test terminals 620 to be electrically connected to the connection terminals 12 when one side of the printed circuit board 10 is inserted into the insertion slot 640. The tester 600 applies an input signal to the connection terminal 12 and receives an output signal from the semiconductor chip 20 of the printed circuit board 10. The tester 600 determines whether the electrical connection between the printed circuit board 10 and the semiconductor chip 20 is acceptable based on the output signal. When it is determined that the electrical connection in faulty or not acceptable, the semiconductor chip 20' is determined to be faulty, and information regarding the faulty semiconductor chip 20' and the printed circuit board 10 may be sent to the controller 345 of the heat unit 300 for use during a future rework process of the faulty chip 20'.

The board moving member 500 moves a printed circuit board 10 having a faulty chip 20' to the faulty board storage 700. FIG. 21 is a perspective view illustrating one example of the faulty board storage 700. The faulty board storage 700 includes a frame 720 and supporting plates 740. The frame 720 may have a rectangular plate form. The supporting plates 740 are inserted in the frame 720 to support a plurality of printed circuit boards 10. Each supporting plate 740 may have a size sufficient to accommodate a plurality of printed circuit boards 10. The supporting plates 740 are stacked and are spaced apart from each other by a predetermined distance in the third direction 66.

The board moving member 500 moves a good printed circuit board 10 to the unloader unit 50, and the printed circuit board 10 may then be removed from the circuit manufacturing apparatus 1000. Referring to FIG. 2 again, the unloader unit 50 includes an unloader 52, a magazine 920, and a magazine driver 940. The good printed circuit board 10 is placed on the unloader 52 by the board moving member 500. The pusher 960 moves the printed circuit board 10 from the unloader 52 to the magazine 920. The magazine 920 stores the good printed circuit boards 10.

FIG. 22 illustrates an example of the magazine 920. The magazine 920 includes a bottom plate 926 and two side plates 922 and 924. The side plates 922 and 924 extend upwards from opposite ends of the bottom plate 926. The side plates 922 and 924 may have the same form, including slots 928 formed in the plates at the same locations in the vertical direction 66 to accommodate two opposite ends of a printed circuit board 10. The sides corresponding to the front, rear, and top of the magazine 920 may be open. The sides corresponding to the front and rear of the magazine 920 may serve as a path through which the printed circuit board 10 comes into or out of the magazine 920. The printed circuit boards 10 may be inserted into the slots 928 through the front and rear of the magazine 920, and may also be stacked and stored in the magazine 920 being spaced apart from each other by a distance corresponding to the distance between respective slots 928.

In other words, if the front of the magazine 920 is defined as the side into which the board moving member 500 places the printed circuit board 10, and the opposite side is defined as the rear of the magazine 920, then the board moving member 500 may insert a good printed circuit board 10 into slots 928 of the magazine 920 and a user or other external board moving device (not shown) may remove the good printed circuit board 10 from the magazine 920 via the rear side of the magazine 920.

While the above example illustrates a magazine 920 having slots 928 to hold printed circuit boards 10, any appropriate device may be used, such as shelves, ledges, protrusions, or other supporting structures.

As the pusher 960 moves the printed circuit boards 10 into the magazine 920, a height of the magazine 920 in the vertical direction 66 may be adjusted by a magazine driver 940 to accommodate additional circuit boards 10. The magazine driver 940 includes a base plate 942 and a plate driver 944. The base plate 942 is located adjacent to the unloader 52 along the second direction 64, and may be offset from a height of the unloader 52 in the vertical direction 66 as the magazine driver 940 moves the magazine 920 in the vertical direction 66. The base plate 942 holds the magazine 920. The plate driver 944 includes a supporting rod 944a extending downward from the bottom of the base plate 942 and a motor 944b connected to the supporting rod 944a to slide the supporting rod 944a in a vertical direction 66. The plate driver 944 elevates the magazine 920 by a predetermined interval each time a printed circuit board 10 is inserted into the slot 928 in the magazine 920 to allow another printed circuit board 10 to be inserted into the next empty slot 928. The magazine 920 may be placed on the base plate 942 by a worker or by another moving member (not shown).

The pusher 960 transfers the printed circuit board 10 from the surface of the unloader 52 into the magazine 920. The pusher 960 is positioned on an opposite side of the unloader 52 from the magazine 920. The pusher 960 has a pressure plate 962 to contact the printed circuit board 10 and to push the printed circuit board 10 to the magazine 920 and a plate driver 964 that is coupled to the pressure plate 962 to drive the pressure plate 962. The pressure plate 962 may have a substantially square plate form.

Figure 24:
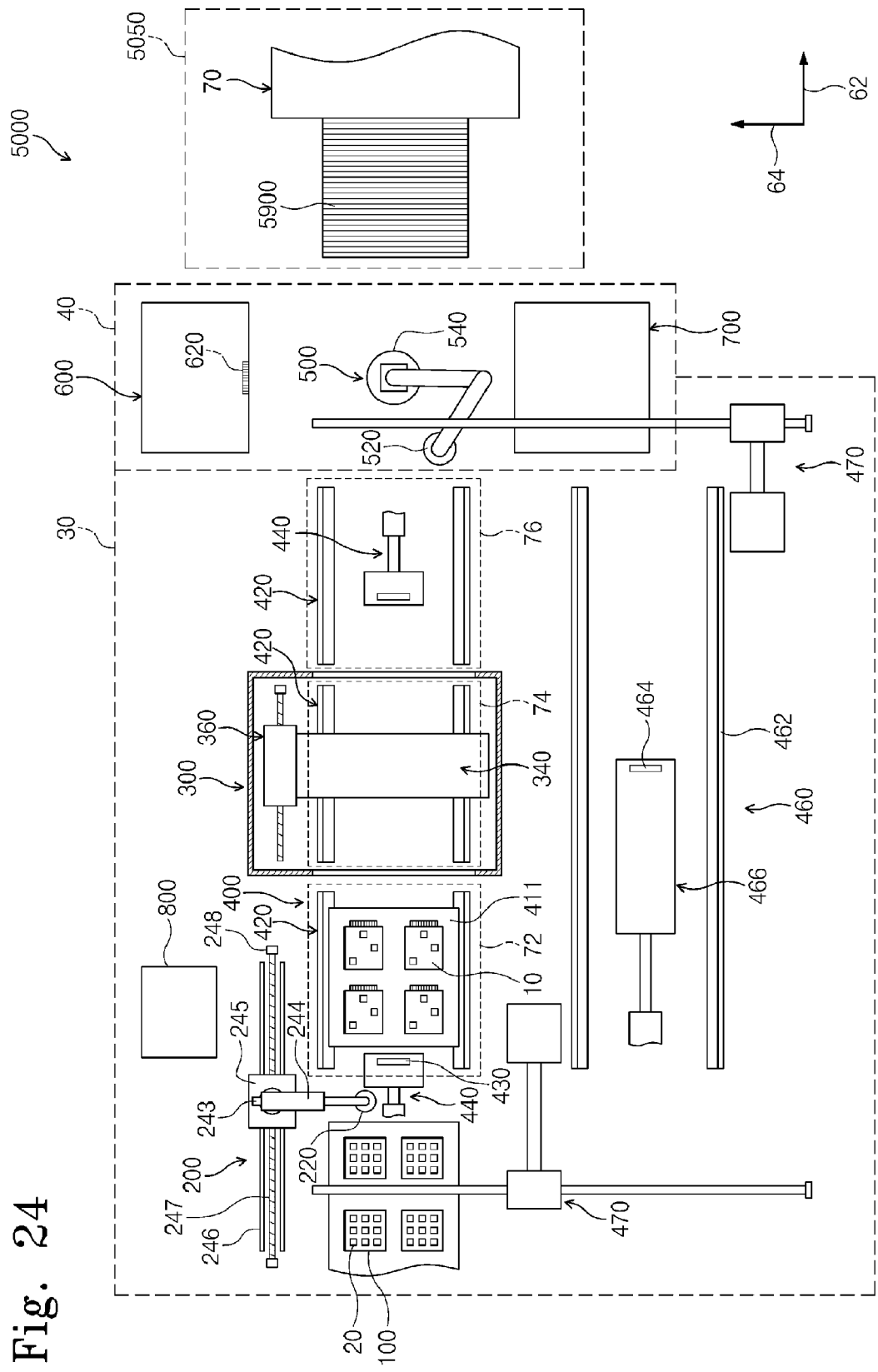
FIG. 24 is a plan view illustrating a modification of a module apparatus of FIG. 2.

FIG. 24 illustrates another circuit manufacturing apparatus 5000. The circuit manufacturing apparatus 5000 of FIG. 24 has a similar structure as the circuit manufacturing apparatus 1000 of FIG. 2, except the unloader unit 5050 in the circuit manufacturing apparatus 5000 of FIG. 24 has a different structure than the unloader unit 50 in the circuit manufacturing apparatus 1000 of FIG. 2. The unloader unit 5050 includes an unloader conveyer 5900 that feeds a good printed circuit board 10 to a storage unit 70. The storage unit 70 may be similar to the magazine 920 of FIG. 2, for example. The unloader conveyor 5900 may be located adjacent to the second unit 40 of the circuit manufacturing apparatus 1000 along the first direction 62.

Figure 25A:
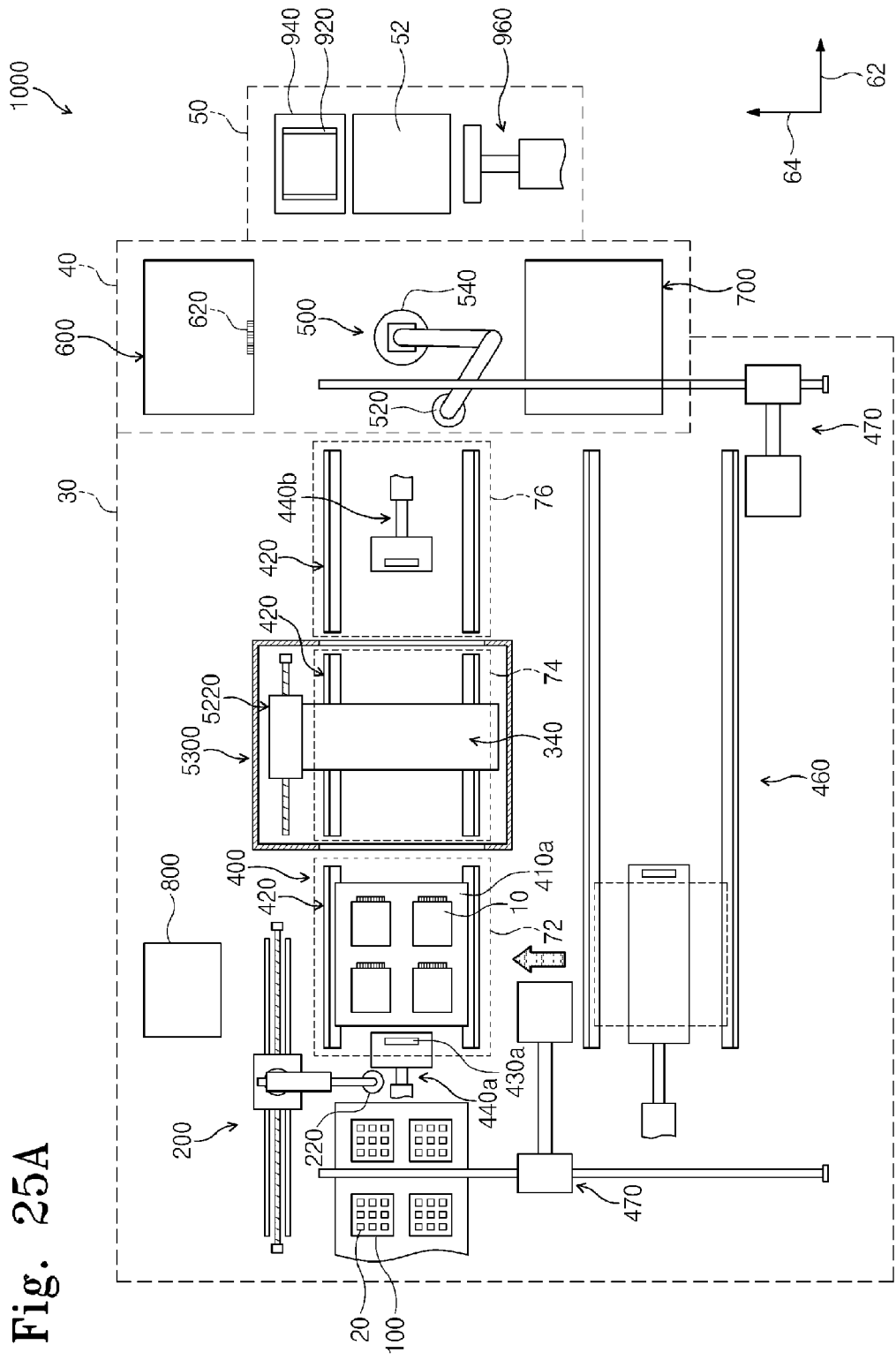
FIGS. 25A-25Q (25O being omitted to avoid confusion) are views illustrating sequential module processes using an apparatus of FIG. 2.
Figure 25B:
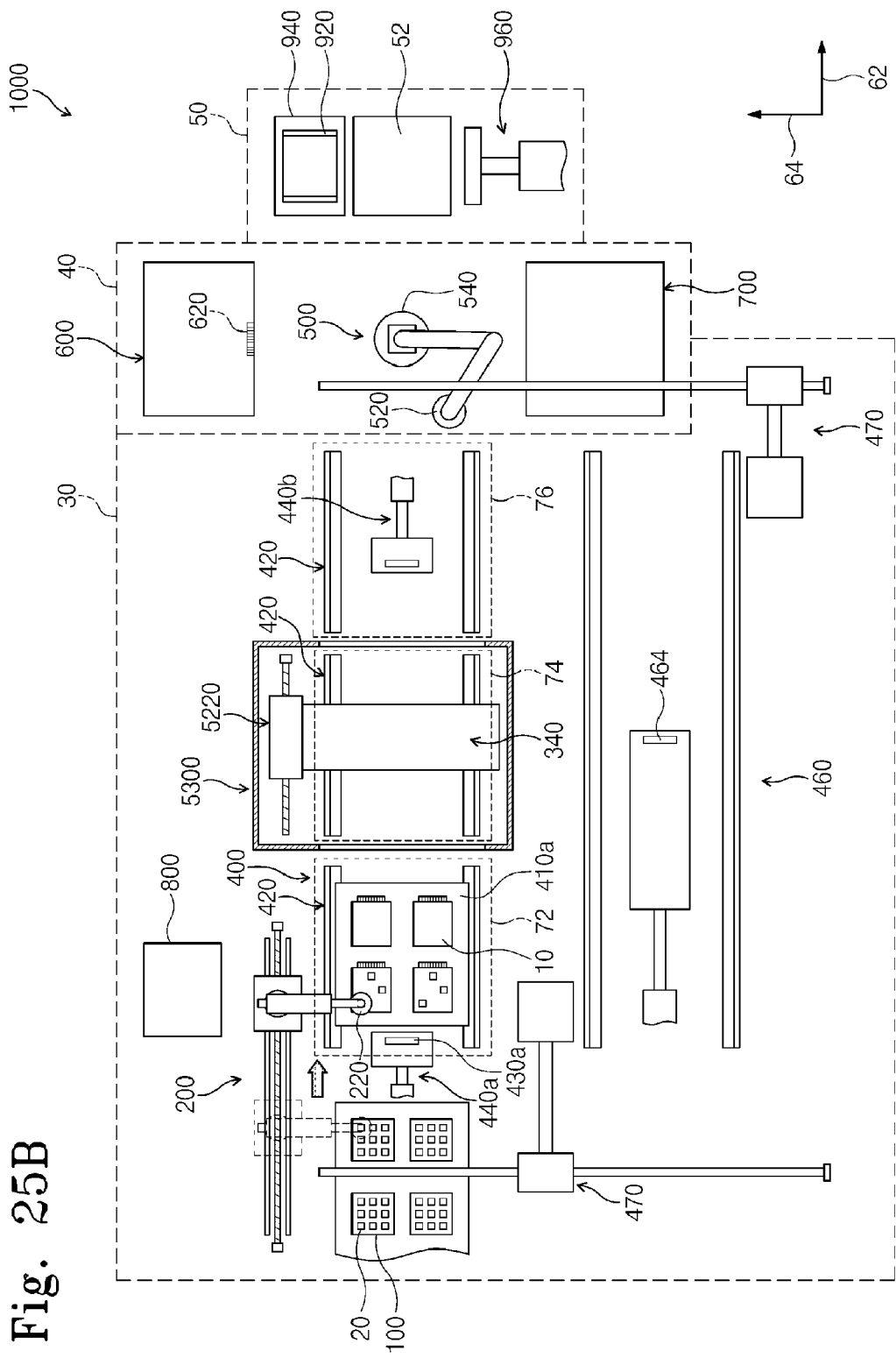
Figure 25C:
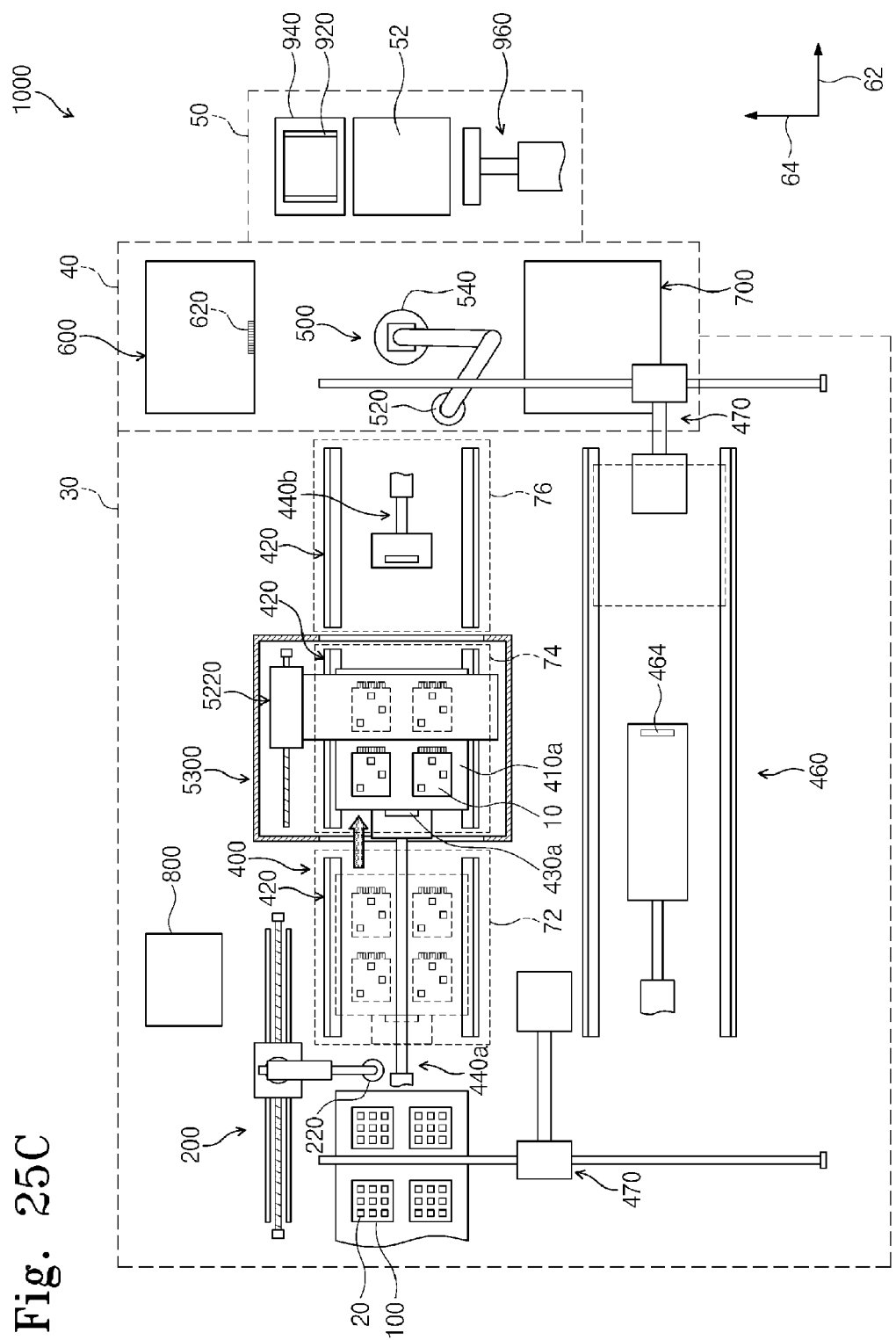
Figure 25D:
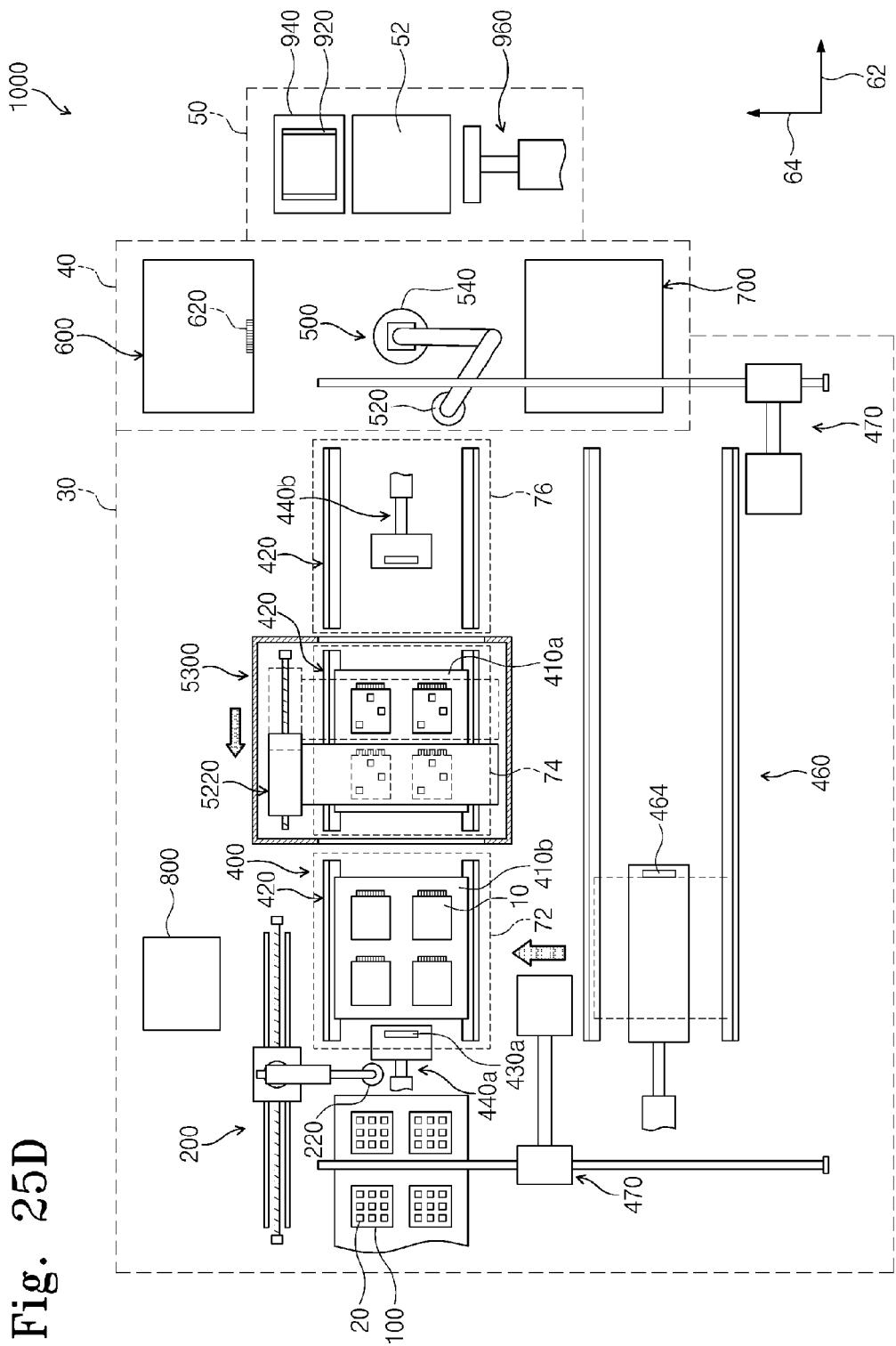
Figure 25E:
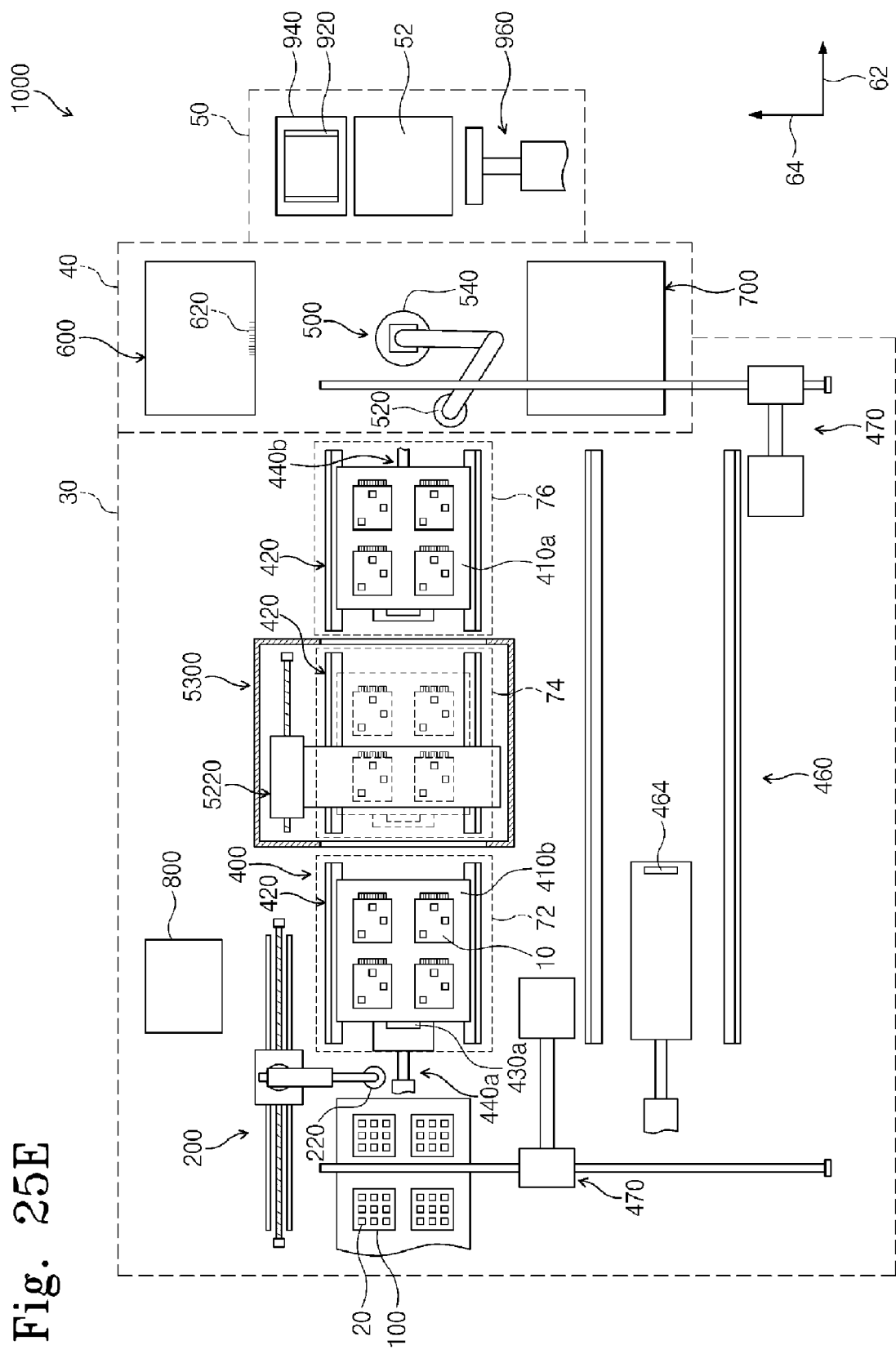
Figure 25F:
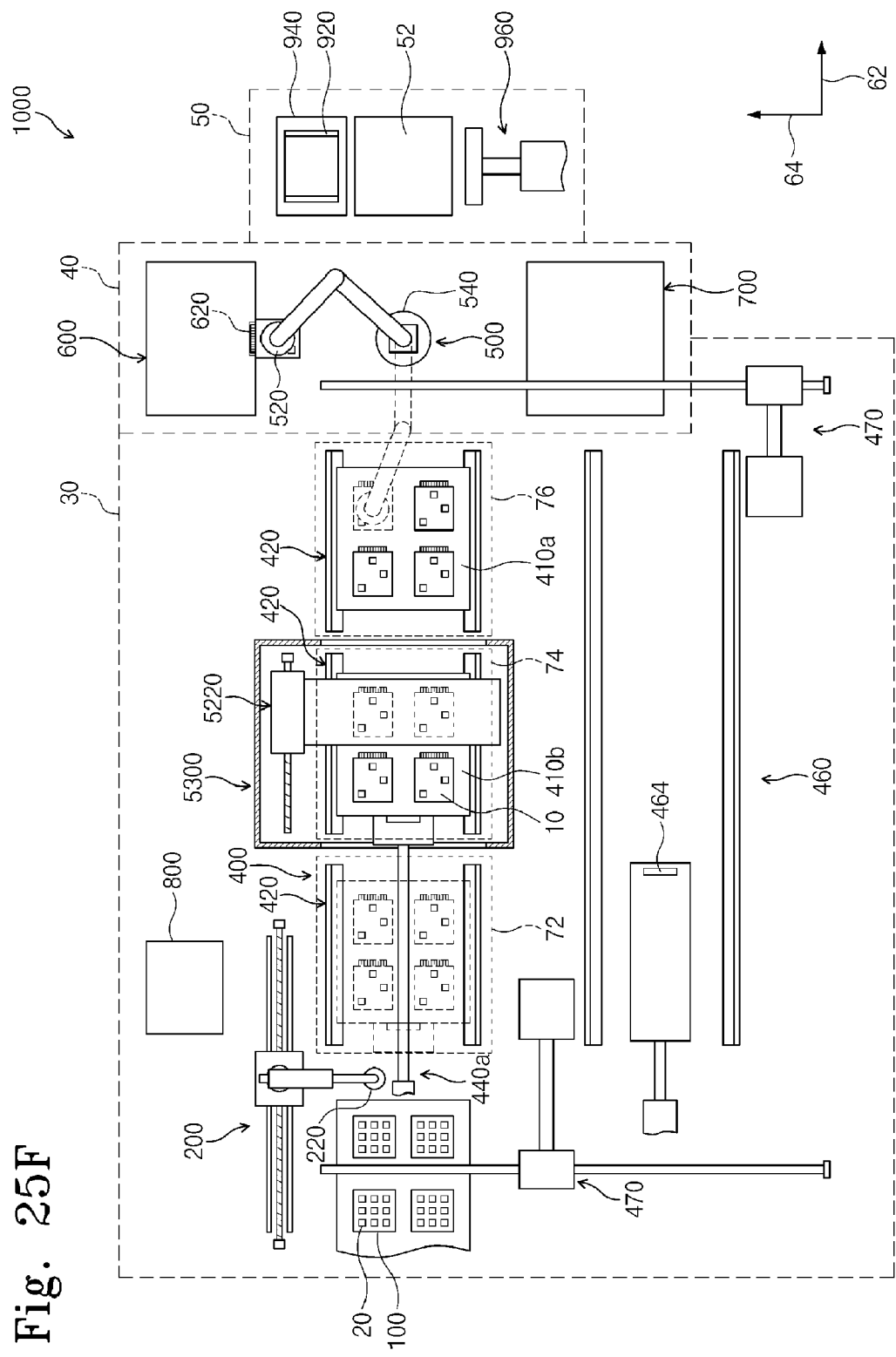
Figure 25G:
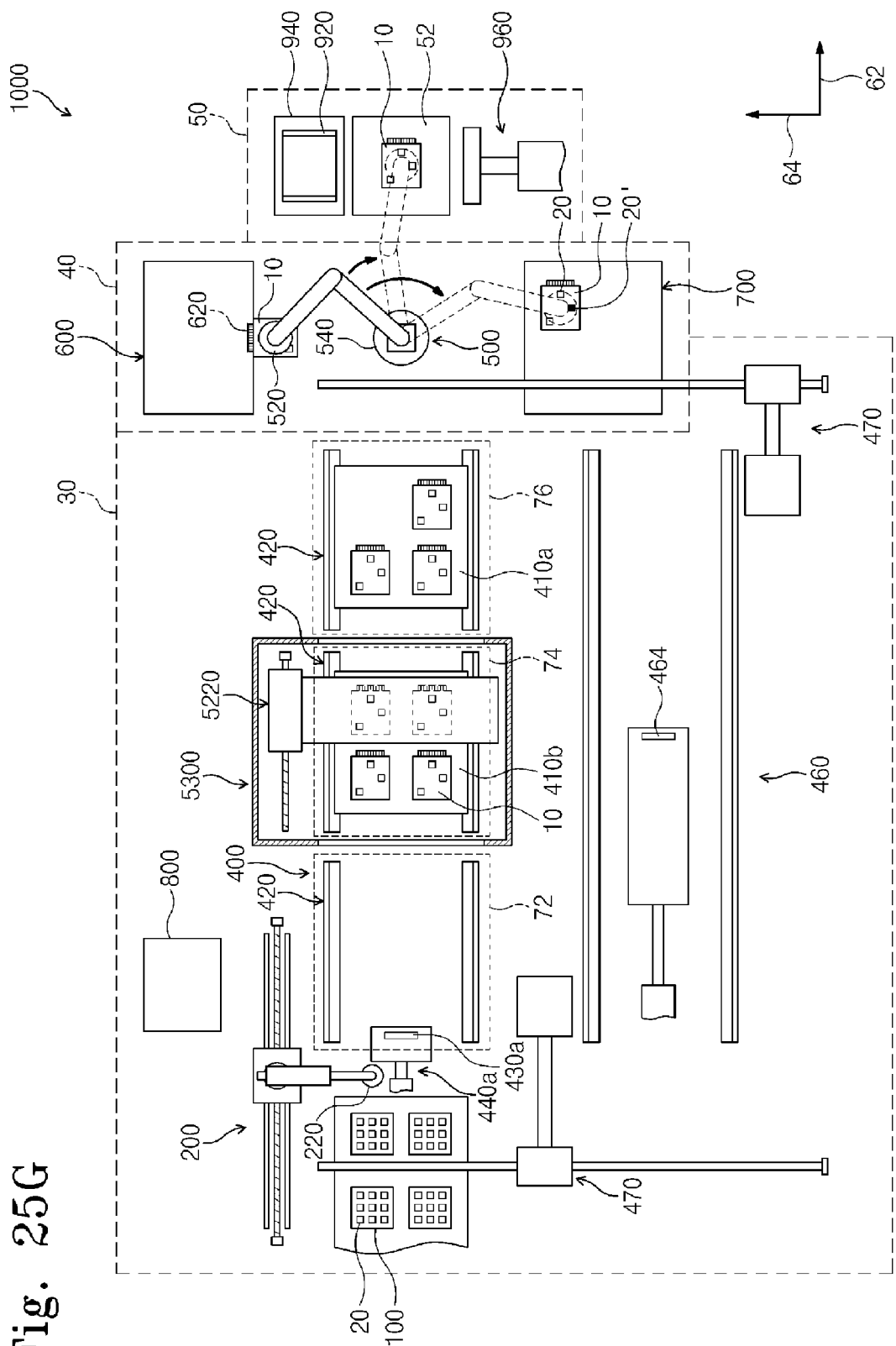
Figure 25H:
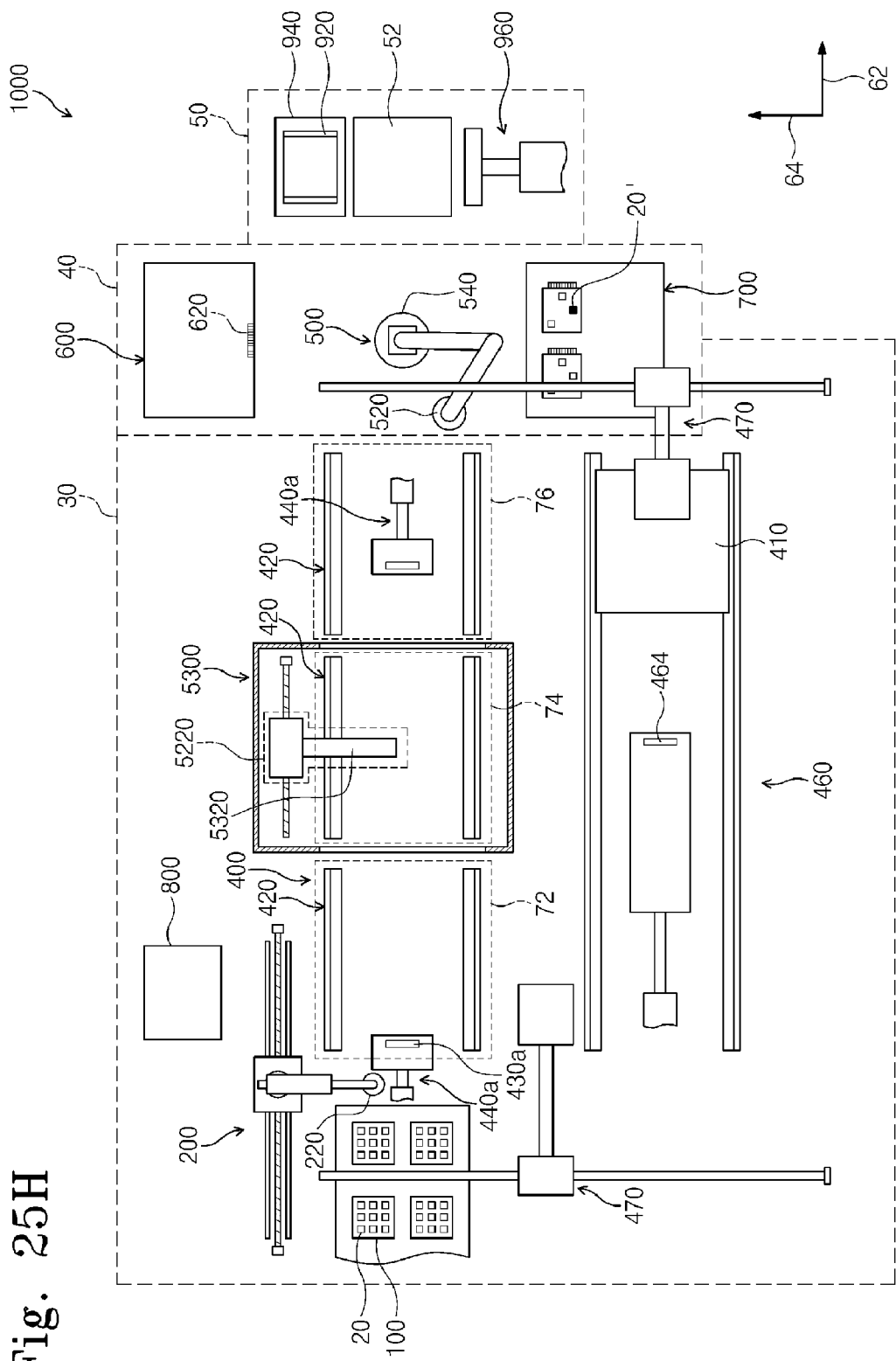
Figure 25I:
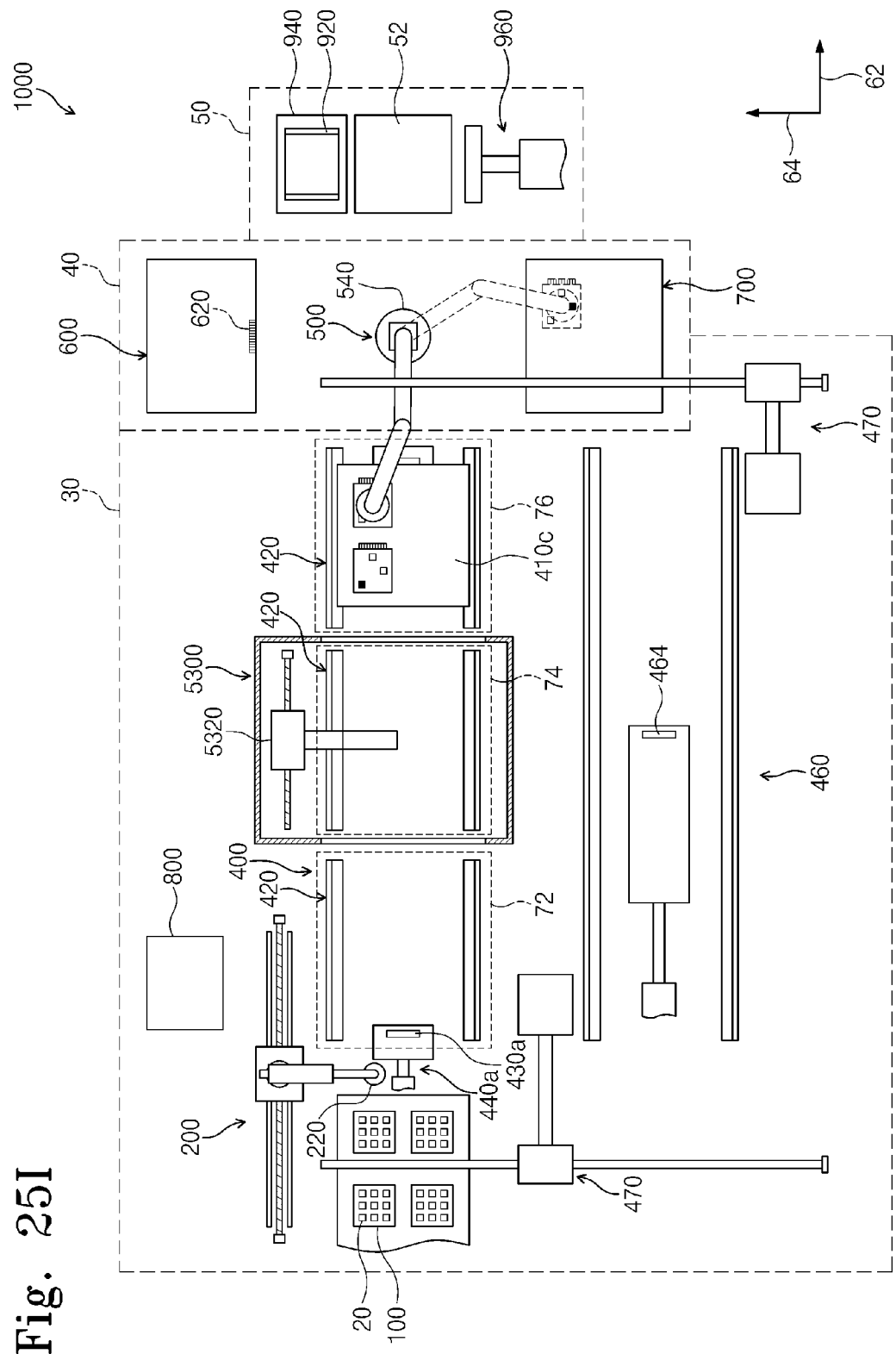
Figure 25J:
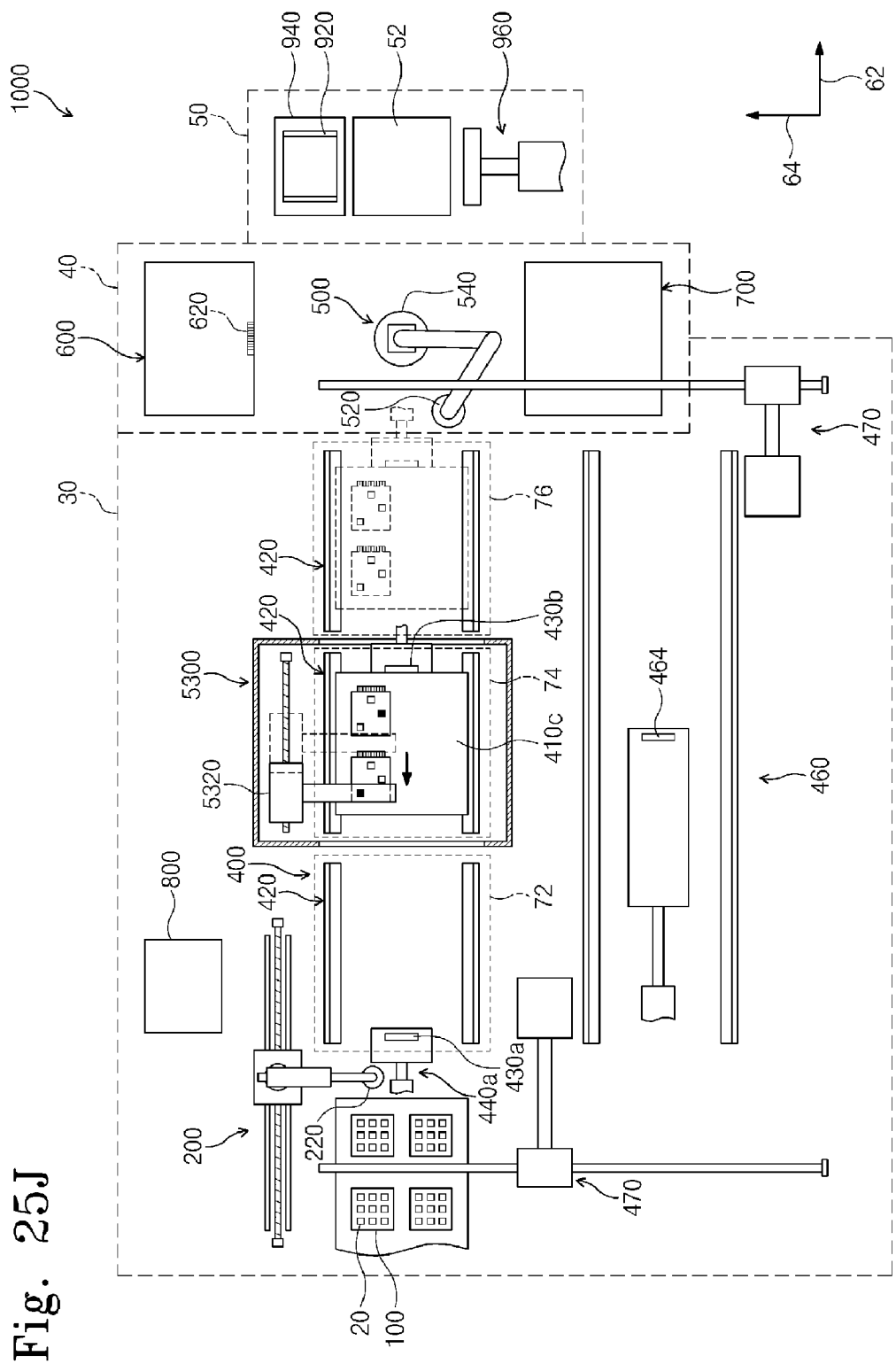
Figure 25K:
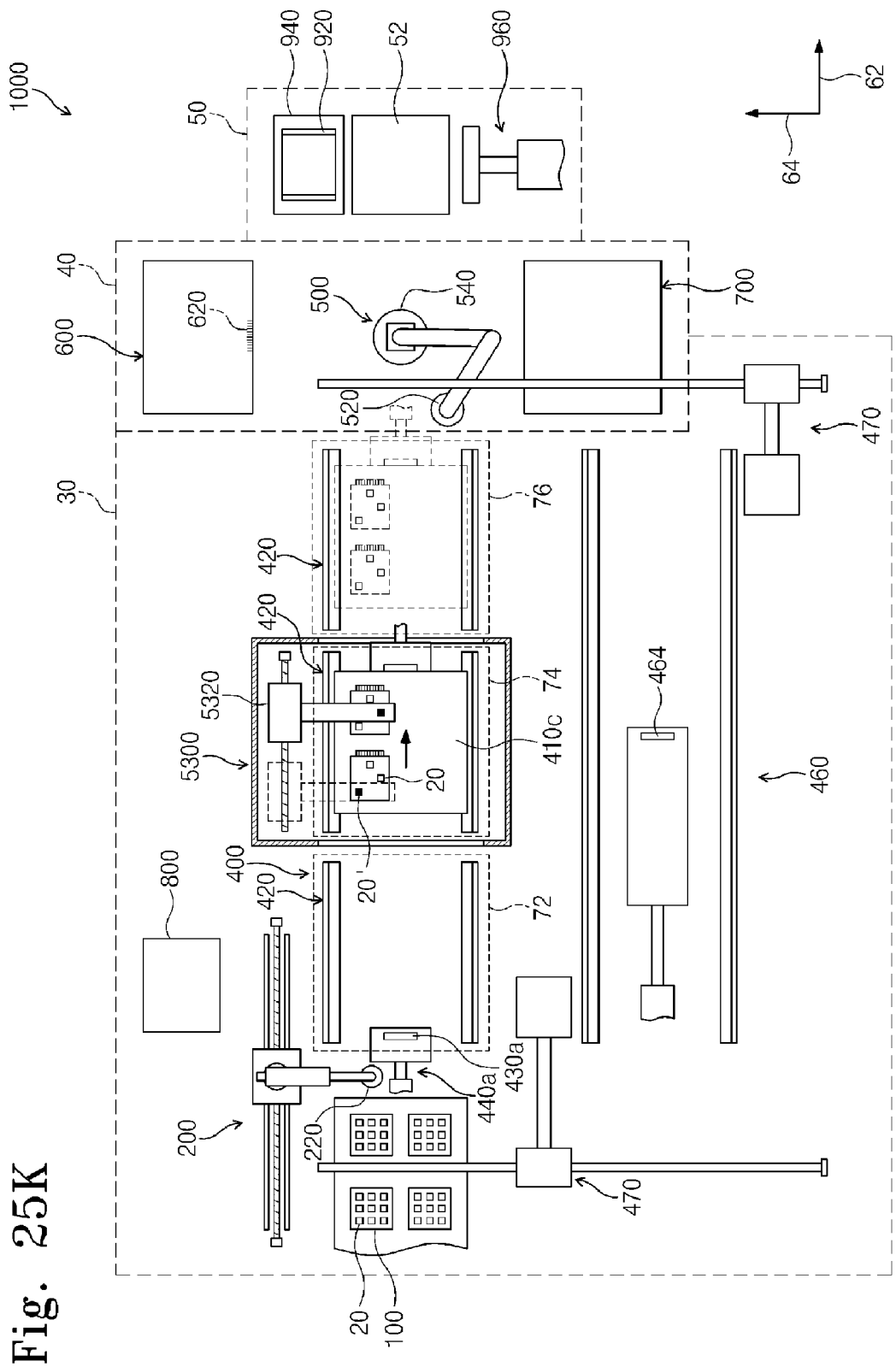
Figure 25L:
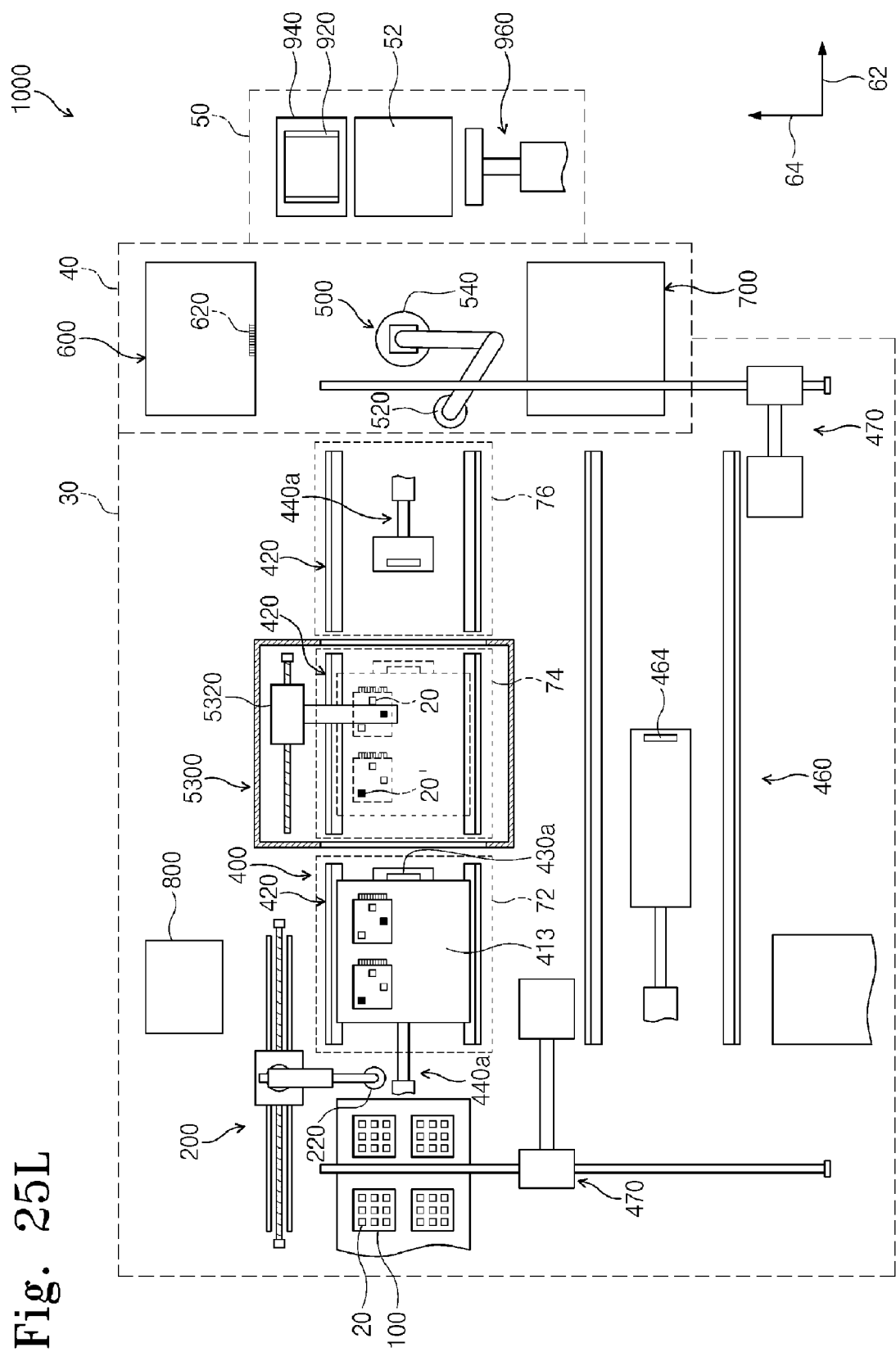
Figure 25M:
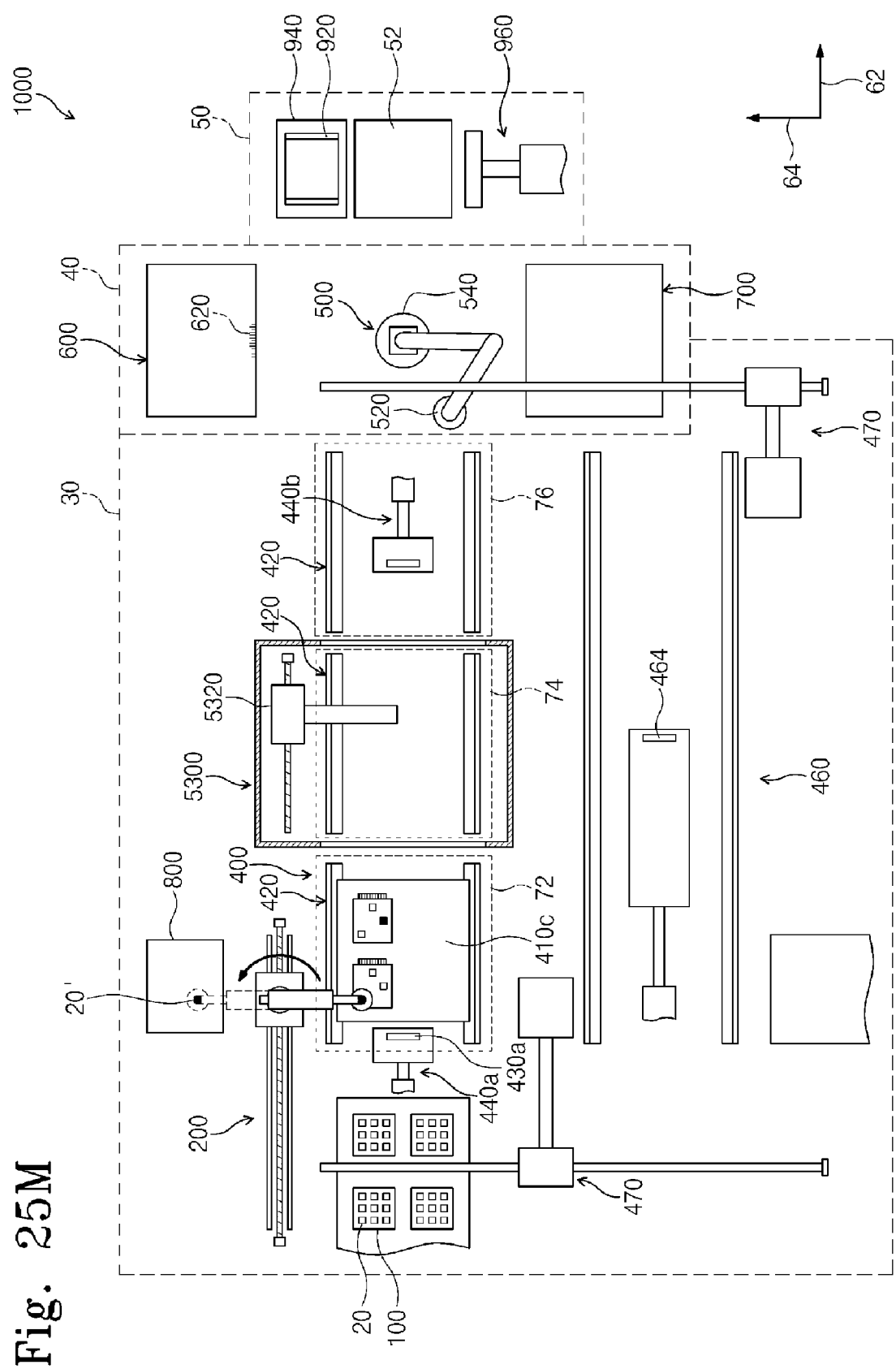
Figure 25N:
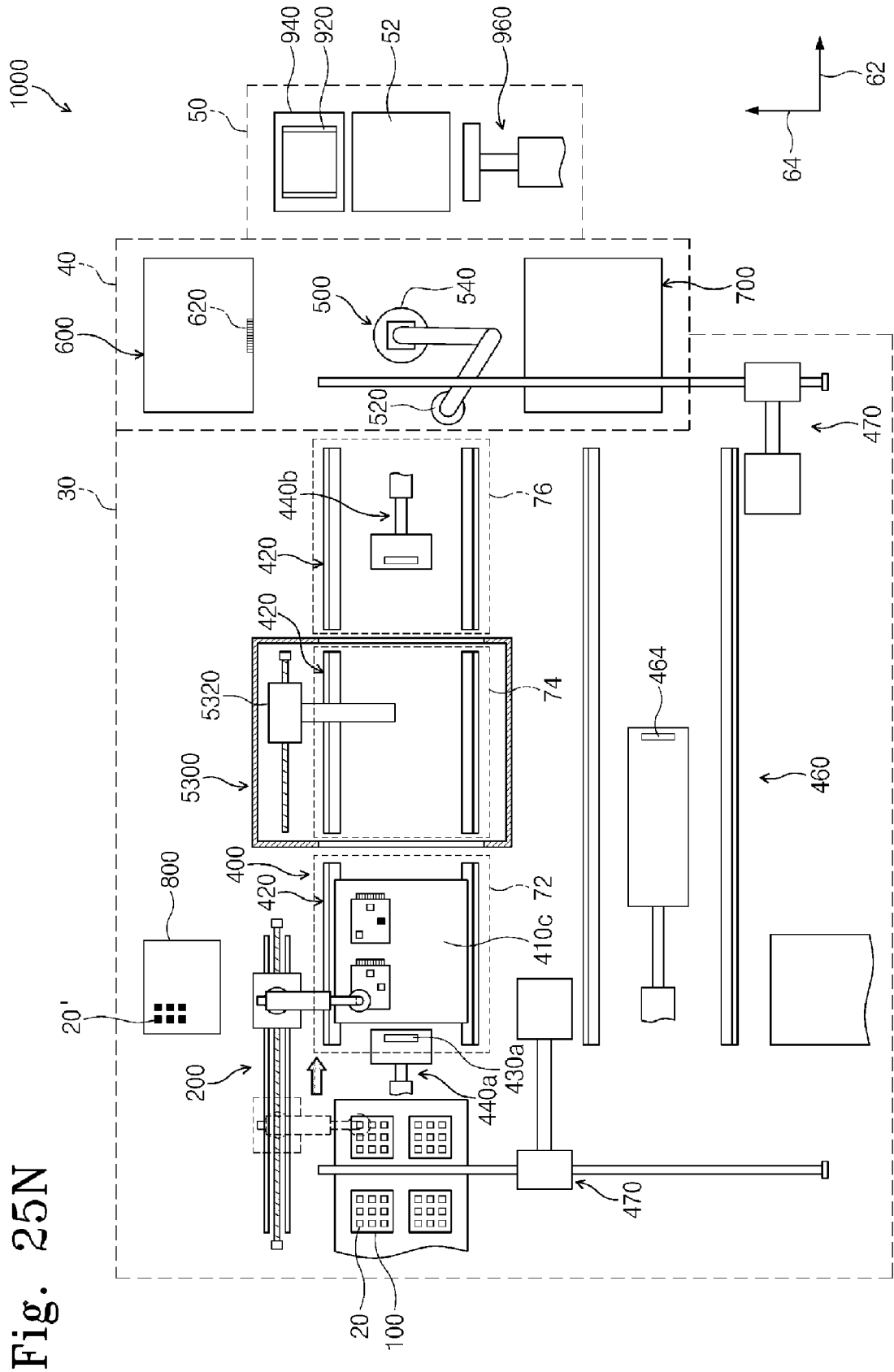
Figure 25P:
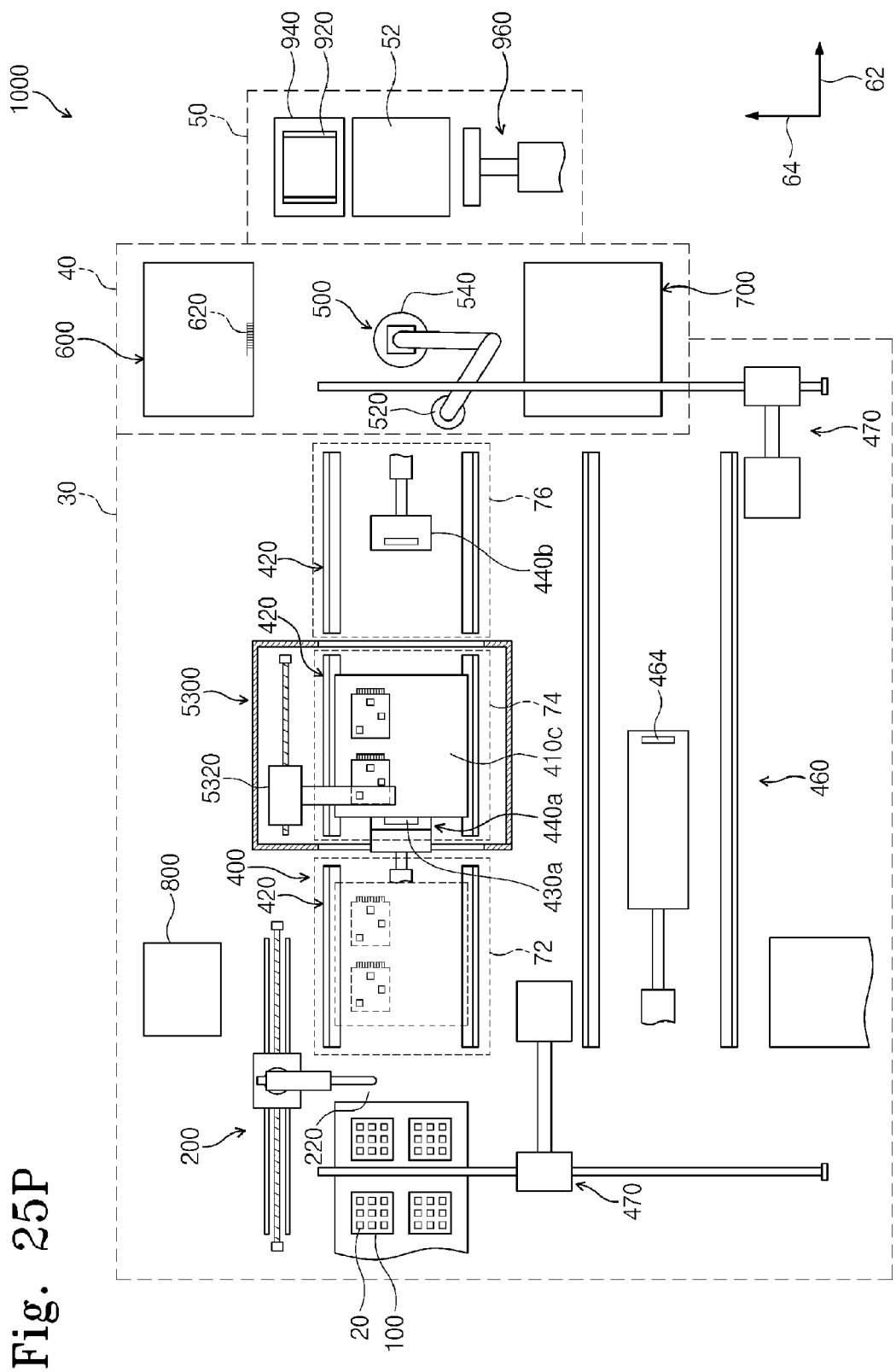
Figure 25Q:
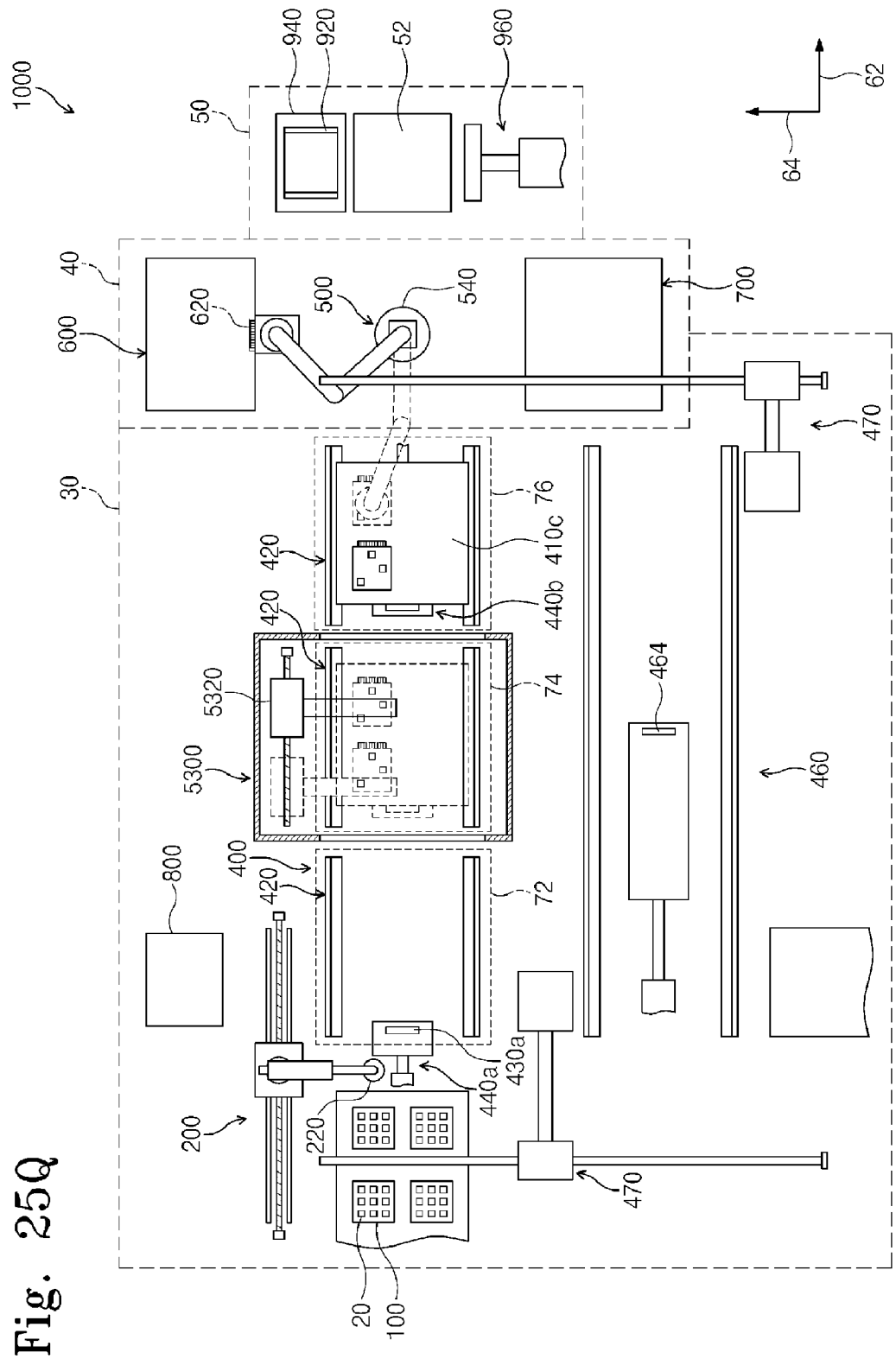

FIGS. 25A through 25Q ("25O" was omitted to avoid confusion between the letter "O" and the number "0") illustrate a process of manufacturing and testing a printed circuit board using the circuit manufacturing apparatus 1000 of FIG. 2. The manufacturing process may include a first, reflow operation, a second, testing operation, and a third, rework operation, which are described generally here, and will be described in more detail referring to the figures below. In the first reflow operation, the semiconductor chip 20 is mounted on the printed circuit board 10 in the first unit 30, and a reflow process for heating the solder ball 22 of the semiconductor chip 20 is performed. In the second operation, an electrical connection state between the semiconductor chip 20 and the printed circuit board 10 is tested in the second unit 40 adjacent to the first unit 30. Based on a test result, the printed circuit board 20 having a faulty semiconductor chip 20', or a semiconductor chip 20' having a faulty electrical connection, is stored in the faulty board storage 700. In the third operation, the faulty semiconductor chip 20' is removed from the printed circuit board 10 and then a new semiconductor chip 20 is mounted on the printed circuit board 10 in the first unit 30. Then, a solder ball 22 of the new semiconductor chip 20 is heated. FIGS. 25A-25Q illustrate a circuit manufacturing unit 1000 that uses the heat unit 5300 of FIG. 14, including the first heater 5220 to perform an initial reflow process and a second heater 5320 to perform the rework process.

First, the first heater 5220 is installed in the bracket 5361, as shown in FIG. 14. The first heater 5220 may have a width sufficient to fit a single printed circuit board 10 within a heating space 349 in the first direction 62 and a length sufficient to fit a plurality of printed circuit boards 10 within the heating space 349 in the second direction 64.

A first board supporter 410a is placed on the transfer guide 420 in the first region 72. A plurality of printed circuit boards 10 may be positioned on the first board supporter 410a either before or after it is placed on the transfer guide 420. According to one example, the printed circuit boards 10 are arranged on the first board supporter 410a in a two-row×two-column matrix as shown in FIG. 25A.

As illustrated in FIG. 25B, the chip transfer unit 200 mounts the semiconductor chips 20 from a chip supporter 100 onto the printed circuit boards 10 on the first board supporter 410a.

As illustrated in FIG. 25C, once the semiconductor chips 20 are mounted on all the printed circuit boards 10 on the first board supporter 410a, the projection 430a in the first region 72 pushes the first board supporter 410a from the first region 72 to the second region 74 where the first heater 5220 performs a reflow process on the printed circuit boards 10 arranged in the first column on the first board supporter 410a.

As illustrated in FIG. 25D, when the reflow process is completed on the printed circuit boards 10 in the first column on the first board supporter 410a, the first heater 5220 moves in the first direction 62 so that the printed circuit boards 10 in the second column are located in a heating space 349 and the reflow process is performed on the printed circuit boards 10 of the second column. While the reflow process is performed on the printed circuit boards 10 in the heat unit 300, a second board supporter 410b may be transferred onto the transfer guide 420 in the first region 72, and the semiconductor chips 20 may be mounted onto the printed circuit boards 10 on the second board supporter 410b by the chip transfer unit 200.

As illustrated in FIG. 25E, once the reflow process is completed on all the printed circuit boards 10 on the first board supporter 410a, the first board supporter 410a is transferred from the second region 74 into the third region 76 by the projection 430b in the third region 76.

As illustrated in FIG. 25F, the second board supporter 410b is transferred from the first region 72 into the second region 74 by the projection 430a in the first region, and a printed circuit board 10 on the first board supporter 410a is transferred from the first board supporter 410a to the tester 600 by the board moving member 500. The tester 600 performs a test of electrical characteristics between the printed circuit board 10 and the semiconductor chip 20. The second projection driver 440b is omitted from FIG. 25F for clarity. However, when not in active use, the projection drivers 440a, 440b may be located beneath the board supporters 410 with the respective fingers 430a, 430b in retracted states, or the projection drivers 440a, 440b may be located at either end of the board supporters 410 in the first direction 62.

As illustrated in FIG. 25G, the printed circuit board 10 for which a test in the tester 600 is completed may be transferred into the unloader unit 50 or the faulty board storage 700 by the board moving member 500. A good printed circuit board 10 is transferred to the unloader unit 50 by the board moving member 500, and then is stored in the magazine 920. The printed circuit board 10 having a faulty chip 20' is transferred to the faulty board storage 700 by the board moving member 500. In FIG. 25G, a faulty chip 25', or a chip' having a faulty connection with the printed circuit board 10 is represented by a solid polygonal shape, and a good chip 20 is represented by an un-filled polygonal shape. While the printed circuit boards 10 of the first board supporter 410a are being tested, the heat unit 300 may perform a reflow process on the printed circuit boards 10 on the second board supporter 410b.

As illustrated in FIG. 25H, once testing of all the printed circuit boards 10 on the first and second board supporters 410a, 410b is completed, the first board supporter 410a and the second board supporter 410b may be removed from the third region 76. The board supporters 410 may be removed from the third region by a user or by the transfer device 470 and stored in a storage area (not shown). Alternatively, one of the boards may be kept and used as the third board supporter 410c. However, FIG. 25H illustrates a new board supporter 410c being placed on the return member 460 to be moved by the transfer member 470 to the transfer rails 420 located in the third region 76 of the first unit 30.

After all the printed circuit boards 10 are tested by the tester 600, the circuit manufacturing unit 1000 may be prepared for a rework process by removing the first heater 5220 from the bracket 5361, and installing the second heater 5320 in bracket 5361. As shown in FIG. 14, the second heater 5320 may have a smaller width and/or length than the first heater 5220 to perform a reflow process of only selected semiconductor chips 20, 20' on the printed circuit board 10.

As illustrated in FIG. 25I, after the third board supporter 410c is placed in the third region 76, the printed circuit boards 10 having faulty chips 20' are moved from the faulty board storage 700 onto the third board supporter 410c by the board moving member 500. The printed circuit boards 10 may be arranged on the third board supporter 410c in a one row×N column matrix (N is a natural number).

As illustrated in FIG. 25J, the third board supporter 410c is transferred from the third region 76 to the second region 74 by the projection 430b.

As illustrated in FIG. 25K, the second heater 5320 is positioned to allow a bad chip 20' on a first printed circuit board 10 to be located within the heating space 349, and then the heater 5320 applies heat to a first semiconductor chip 20' to melt the solder ball or solder connection 22. After the heating the first semiconductor chip 20', the heater 5320 may move to position another faulty chip 20' within the heating space 349.

As illustrated in FIG. 25L, once all the faulty chips 20' have been heated, the third board supporter 410c may be transferred from the second region 74 into the first region 72 by the projection 430 in the first region 72.

As illustrated in FIG. 25M, the chip transfer unit 200 removes a faulty chip 20' from a printed circuit board 10 in the first region 72 and transfers the faulty chip 20' to the faulty chip storage 800.

As illustrated in FIG. 25N, once all the faulty chips 20' are removed from the printed circuit boards 10, the chip transfer unit 200 mounts a new semiconductor chip 20 from the chip supporter 100 onto the printed circuit board at a position where the faulty chip 20' had been located.

As illustrated in FIG. 25P, once the semiconductor chips 20 are mounted onto the printed circuit board 10, the third board supporter 410c is transferred from the first region 72 to the second region 74 by the projection 430a in the first region 72. In the second region 74, the second heater 5230 is positioned to allow the newly mounted semiconductor chip 20 to be located within the heating space 349 and the second heater 5230 applies heat to the solder ball 22 to melt the solder ball 22 and to connect the semiconductor chip 20 to the printed circuit board 10.

Next, as illustrated in FIG. 25Q, the third board supporter 410c is transferred from the second region 74 into the third region 76 by the projection 430b in the third region 76. The printed circuit board 10 is moved from the third region 76 to the tester 600 by the board moving member 500. If it is determined that the printed circuit board 10 is good, or that the semiconductor chips 20 on the printed circuit board 10 are operating correctly, the printed circuit board 10 is transferred to the unloader unit 50. If it is determined that a printed circuit board 10 is faulty, or that a semiconductor chip 20' is operating incorrectly, the faulty circuit board 10 is stored in the faulty board storage 700, and the rework process is repeated.

Figure 26:
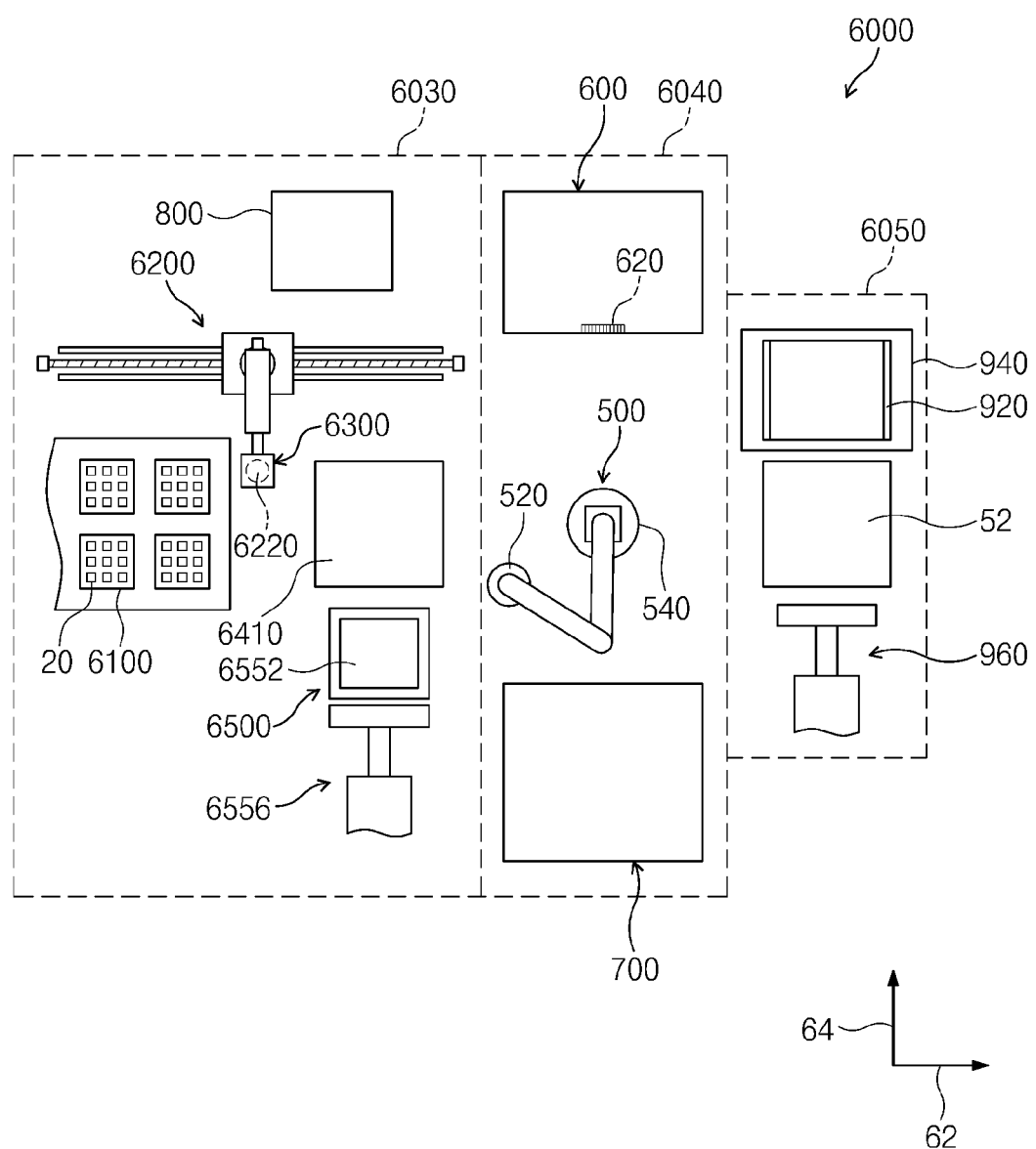
FIG. 26 is a plan views illustrating a circuit manufacturing apparatus according to an embodiment of the inventive.

FIG. 26 illustrates a plan view of a circuit manufacturing apparatus 6000 according to another embodiment of the present general inventive concept. The circuit manufacturing apparatus 6000 includes a first unit 6030, a second unit 6040, and an unloader unit 6050. Functions performed by the first unit 6030, the second unit 6040, and the unloader unit 6050 are similar to functions performed by the first unit 30, the second unit 40, and the unloader unit 50 of the circuit manufacturing apparatus 1000 of FIG. 2.

The first unit 6030, the second unit 6040, and the unloader unit 6050 may be positioned sequentially in a first direction 62.

The first unit 6030 includes a chip supporter 6100, a chip transfer unit 6200, a board supporter 6410, and a heat unit 6300. The chip supporter 6100 and the board supporter 6410 may be positioned sequentially in the first direction 62. The chip transfer unit 6200 may be positioned to one side of the chip supporter 6100 and the board supporter 6410. The chip supporter 6100 and the chip transfer unit 6200 may have similar structures as the chip supporter 100 and the chip transfer unit 200 of FIG. 2. The board supporter 6410 has a substantially flat top surface. A semiconductor chip 20 may be mounted to the printed circuit board 10 when the printed circuit board 10 is positioned on the board supporter 6410. A board storage 6500 may be provided on the opposite side of the board supporter 6410 from the chip transfer unit 200. The board storage 6500 includes a magazine 6552 and a magazine driver (not shown). The magazine 6552 and the magazine driver may have similar structures as the magazine 920 and the magazine driver 940 of FIGS. 22 and 23. A board pusher 6556, similar to the pusher 960 of FIG. 2, pushes a printed circuit board 10 from the magazine 6552 to the board supporter 6410.

Figure 27:
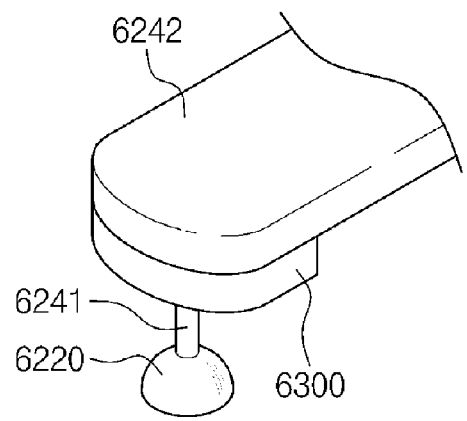
FIG. 27 is a perspective view illustrating a chip transfer unit and a heat unit of FIG. 26.
Figure 28:
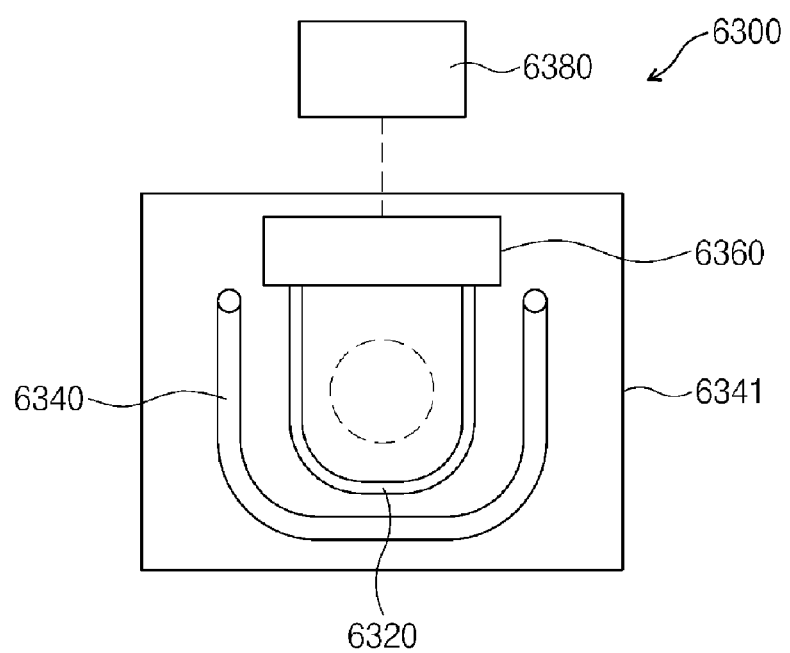
FIG. 28 is a plan view illustrating a structure of a heat unit in FIG. 27.

Unlike the circuit manufacturing apparatus 1000 of FIG. 2, the circuit manufacturing apparatus 6000 of FIG. 26 may include a chip transfer unit 6200 that includes a heat unit 6300. FIG. 27 is a perspective view of a chip transfer unit 6200 having a heat unit 6300 included therein. FIG. 28 is a plan view illustrating a structure of the heat unit 6300 of FIG. 27. The heat unit 6300 applies heat to the solder ball 22 of the semiconductor chip 20 through an induction heat so as to reflow the solder ball 22 and connect the semiconductor chip 20 to the circuit board 10. The heat unit 6300 includes a housing 6341, a cooling member 6340, a coil 6320, a power source 6360, and a controller 6380. The heat unit 6300 is coupled to the chip transfer unit 6200 to be movable with the chip transfer unit 6200. The housing 6341 may be positioned between the pad 6220 and the horizontal transfer rod 6242. The housing 6341 may be coupled to the support bar 6241 or to the bottom surface of the horizontal transfer rod 6242 to surround the support bar 6241. The coil 6320 may have a similar structure and form as the coil 342 of FIGS. 9 and 10. The coil 6320 may have a size that allows one semiconductor chip 20 to be located within the heating space 349, or it may be of a sufficient size to allow an entire printed circuit board 10 to be located within the heating space 349. The cooling member 6340 may surround the outer sides of the coil 6320. The cooling member 6340 may have a similar structure and form as the cooling member 343 of FIG. 9. The power source 6360 supplies a current to the coil 6320 and is controlled by the controller 6380

When the semiconductor chip 20 is transferred by the chip transfer unit 6200 onto the printed circuit board 10, the heat unit 6300 applies heat to the solder ball 22 of the semiconductor chip 20.

Referring to FIG. 26, the second unit 6040 includes a board moving member 6500, a tester 6600, and a faulty board storage 6700, which may perform similar functions and may have a similar structures as the board moving member 500, the tester 600, and the faulty board storage 700 of FIG. 2.

While the above examples provide illustrations of a heat unit 6300 mounted on a chip transfer unit 6200 to perform a reflow process of a solder ball 22 previously formed on a semiconductor chip 20, the chip transfer unit 6200 may alternatively include a solder source to form a solder ball 22 on the semiconductor chip 20. The chip transfer unit 6200 may support a semiconductor chip 20 using vacuum absorption or a non-contact method using Bernoulli's principle.

FIGS. 29A through 29J illustrate sequential operations of a circuit manufacturing process using the circuit manufacturing apparatus 6000 of FIG. 26.

Figure 29A:
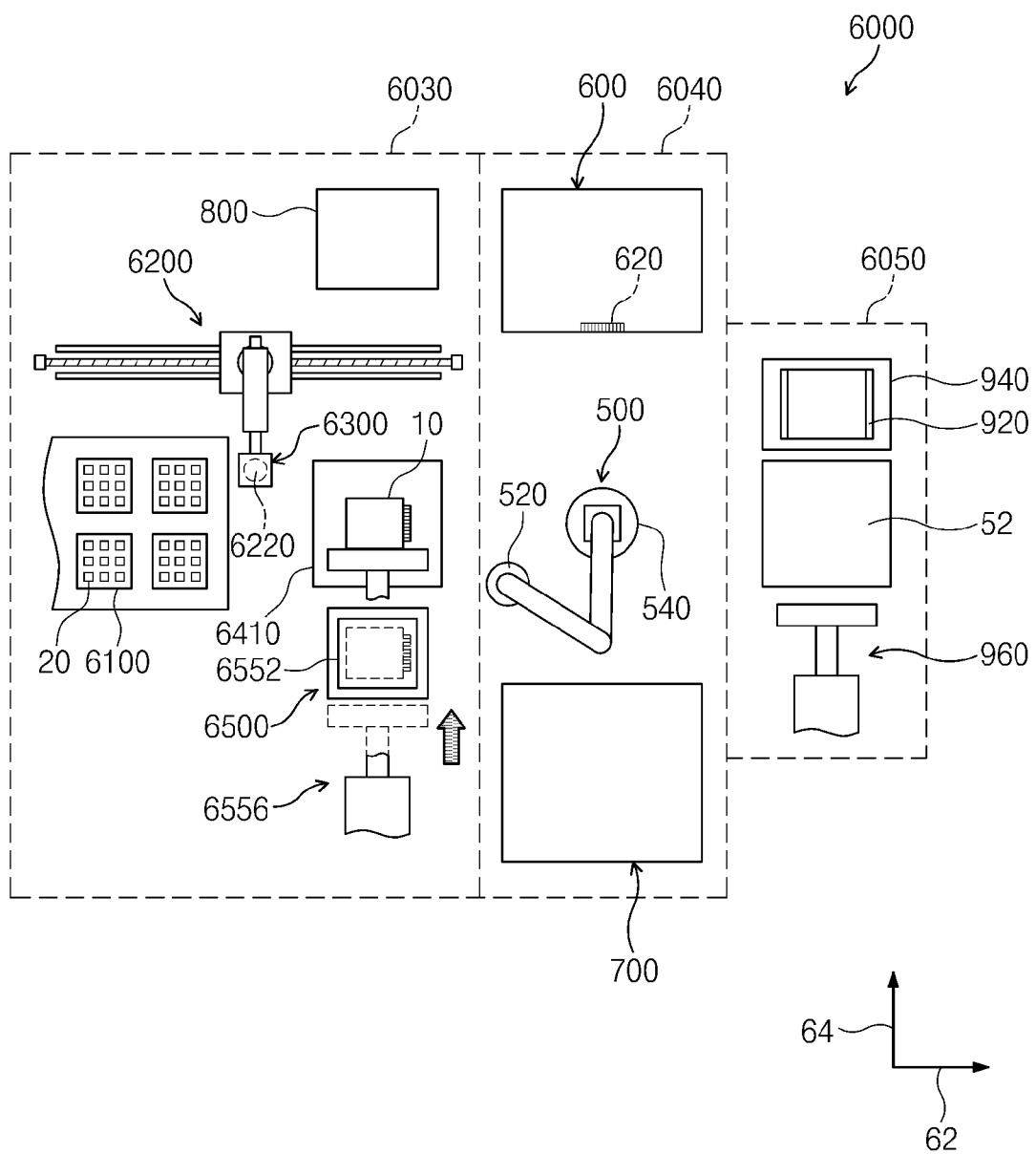
FIGS. 29A through 29J illustrate a circuit manufacturing process using the circuit manufacturing apparatus of FIG. 26.

First, as illustrated in FIG. 29A, a printed circuit board 10 is transferred from the magazine 6552 into the board supporter 6410 by the magazine pusher 6556.

Figure 29B:
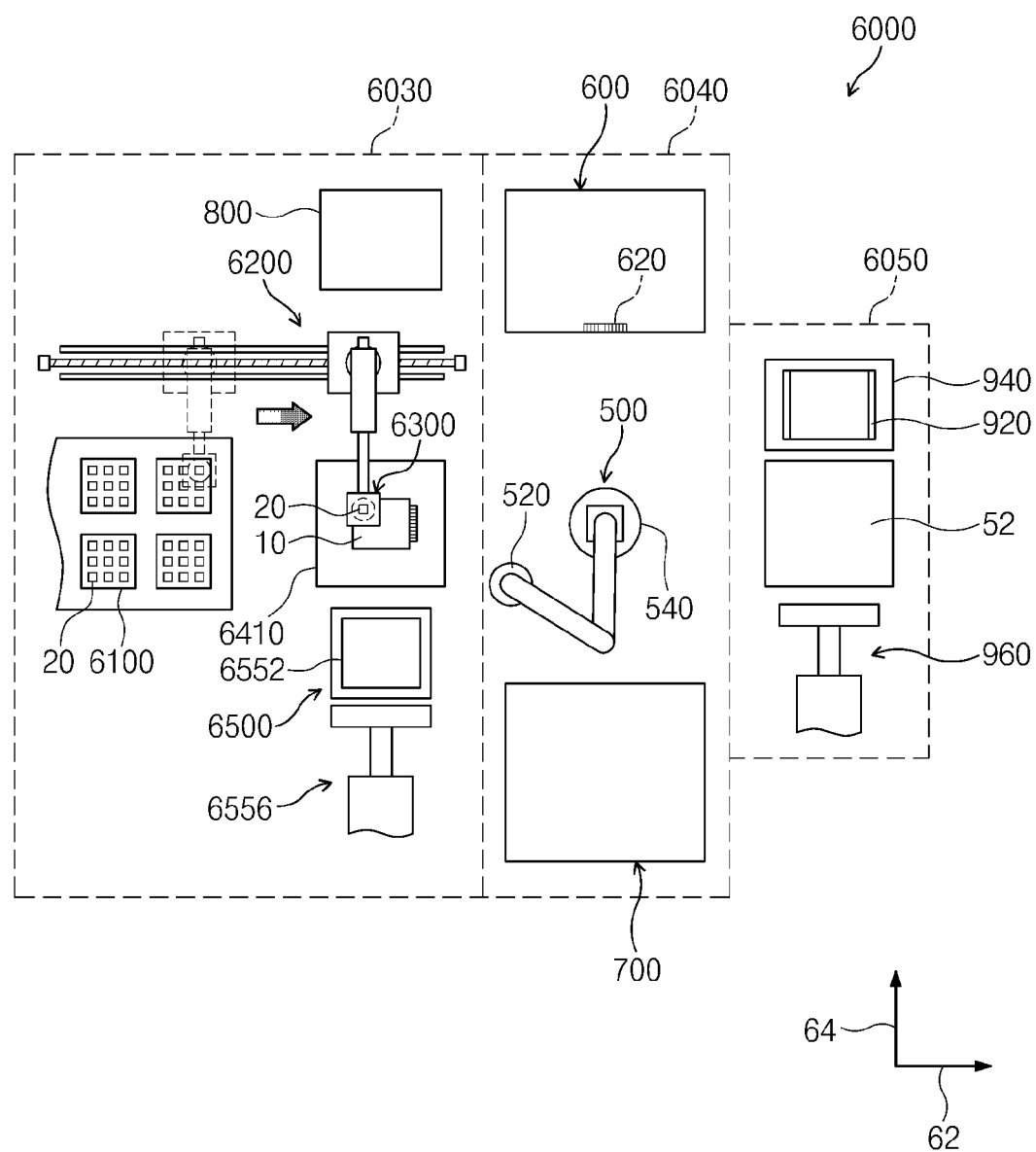

As illustrated in FIG. 29B, the chip transfer unit 6200 transfers the semiconductor chip 20 from the chip supporter 6100 onto the printed circuit board 10 on the board supporter 6410. Then, the heat unit 6300 mounted on the chip transfer unit 6200 applies heat to the solder ball 22 of the semiconductor chip 20 using induction heat to perform a reflow process. Alternatively, the solder ball 22 of the semiconductor chip 20 may be heated by the heat unit 6300 while the semiconductor chip 20 is being transferred from the chip supporter 6100 to the printed circuit board 10 on the board supporter 6410.

Figure 29C:
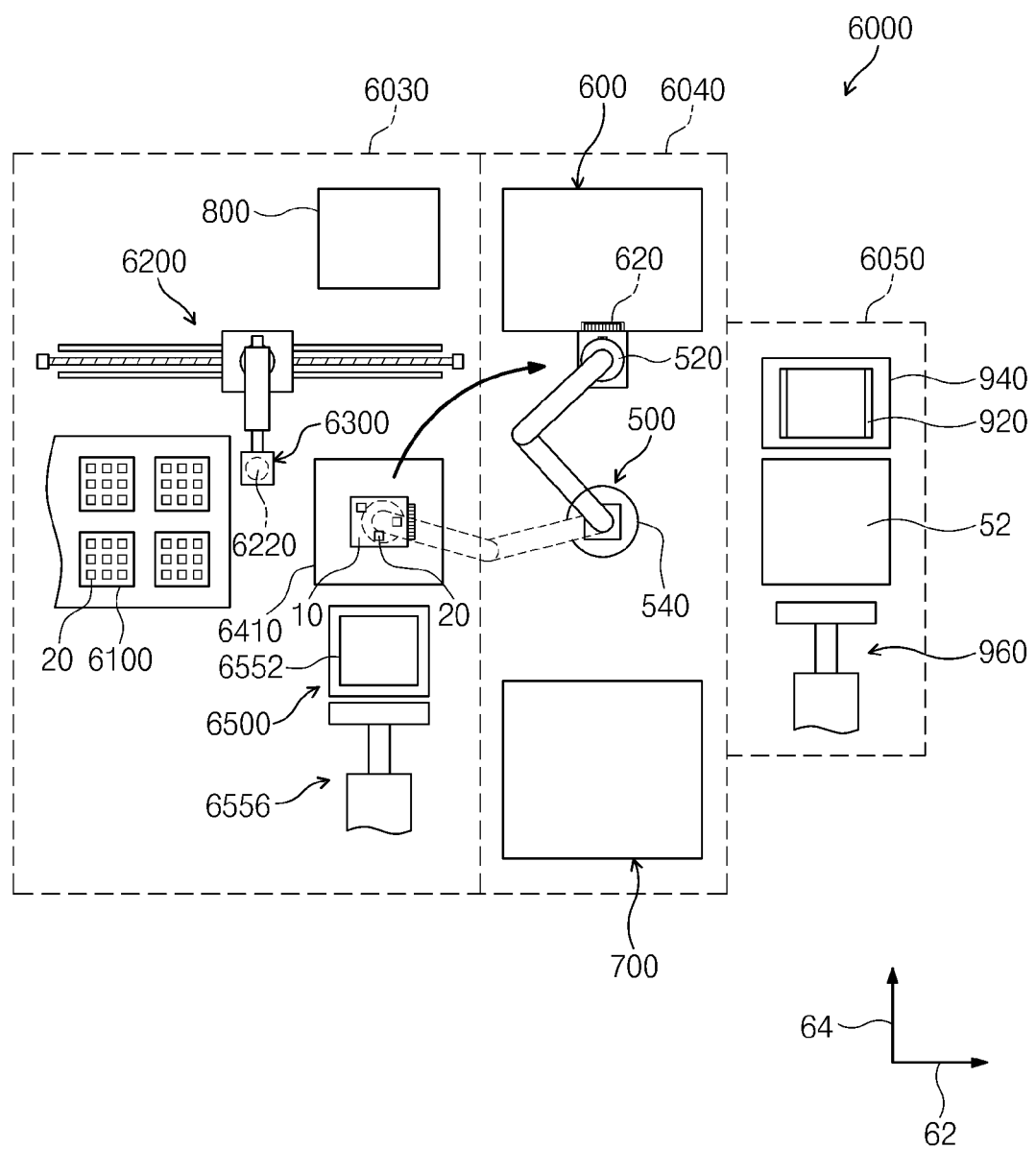

As illustrated in FIG. 29C, the board moving member 6500 transfers the printed circuit board 10 to the tester 600, and the tester 600 tests an electrical connection state between the semiconductor chip 20 and the printed circuit board 10.

Figure 29D:
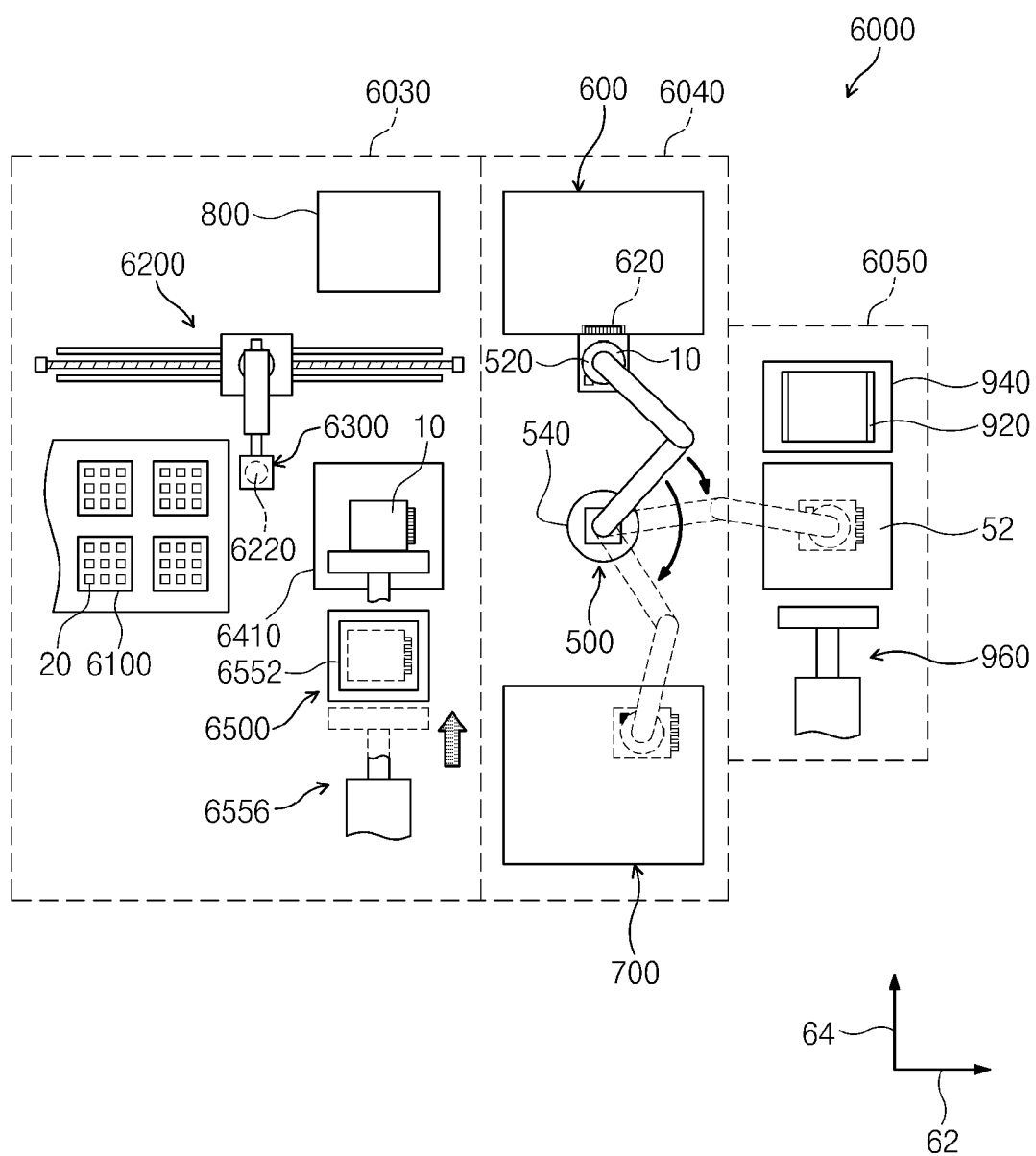

As illustrated in FIG. 29D, during the test, another printed circuit board 10 may be transferred from the magazine 6552 to the board supporter 6410. Once a test is completed on the printed circuit board 10, the printed circuit board 10 is transferred into the unloader unit 6050 if it is determined that the printed circuit board 10 functions properly, and the printed circuit board 10 is transferred to the faulty board storage 6700 if it is determined that the printed circuit board 10 is faulty or has a faulty chip 20'. Meanwhile, the chip transfer unit 6200 may mount semiconductor chips 20 from the board chip supporter 6100 onto the printed circuit board 10 located on the board supporter 6410.

Once the test is completed on a series of printed circuit boards 10, a rework process may be performed on the faulty printed circuit boards 10.

Figure 29E:
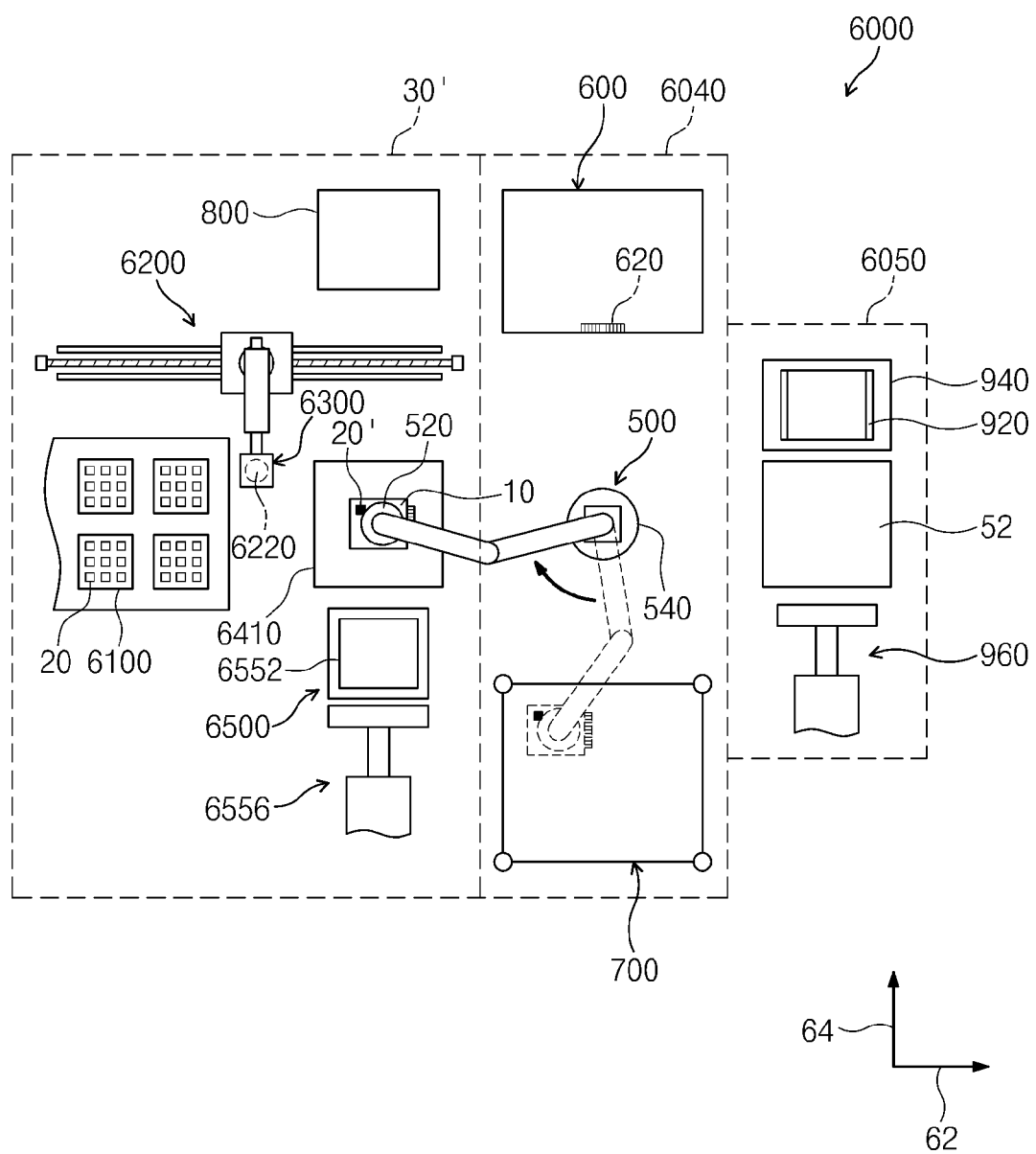

As illustrated in FIG. 29E, the board moving member 500 moves a printed circuit board 10 stored in the faulty board storage 6700 to the board supporter 6410.

Figure 29F:
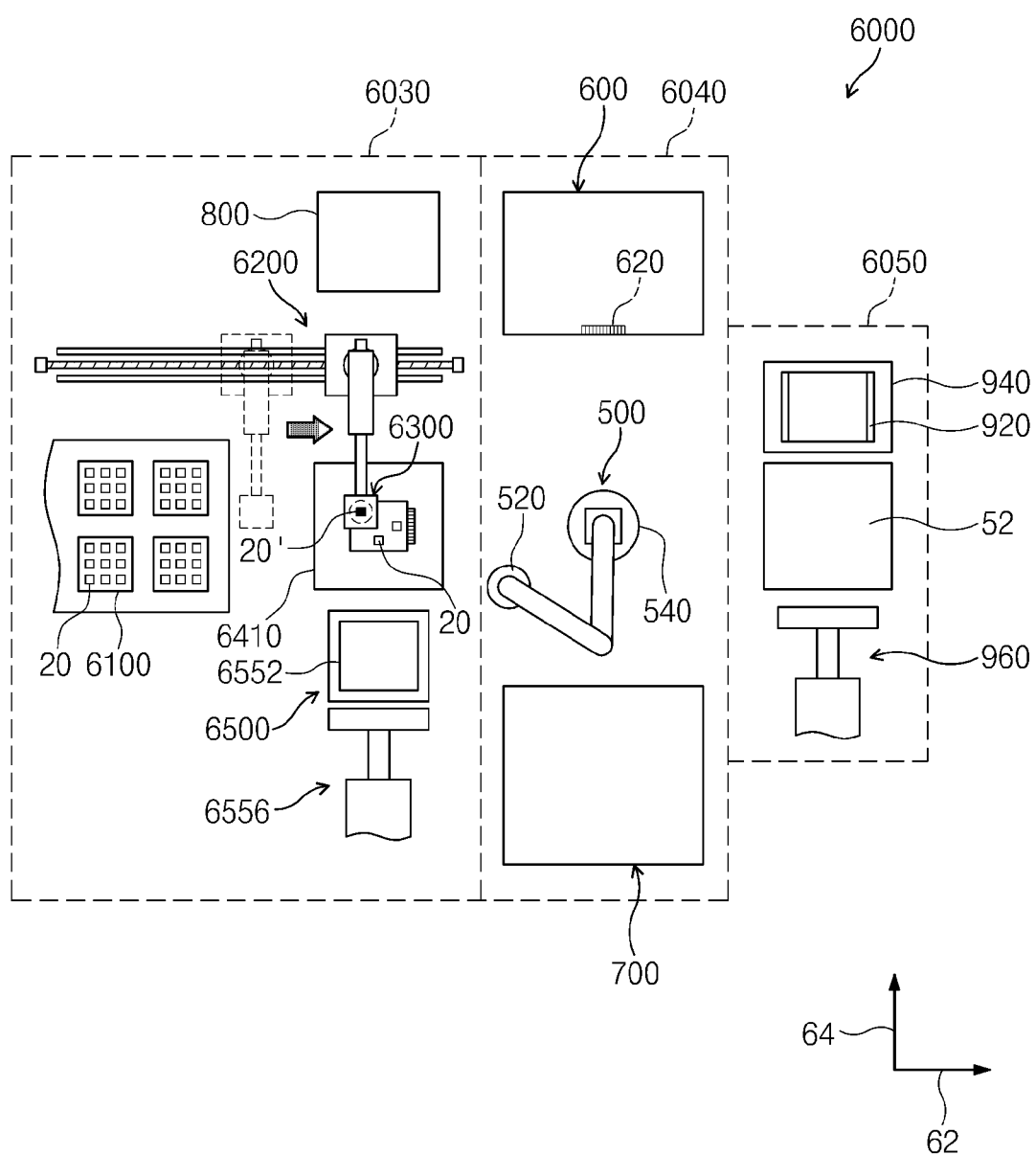

As illustrated in FIG. 29F, the chip transfer unit 6200 is positioned over the faulty semiconductor chip 20' to allow the faulty semiconductor chip 20' to be positioned within the heating space 349 of the heating unit 6300, and the heat unit 6300 applies heat to the solder ball or solder connection 22 between the faulty chip 20' and the printed circuit board 10.

Figure 29G:
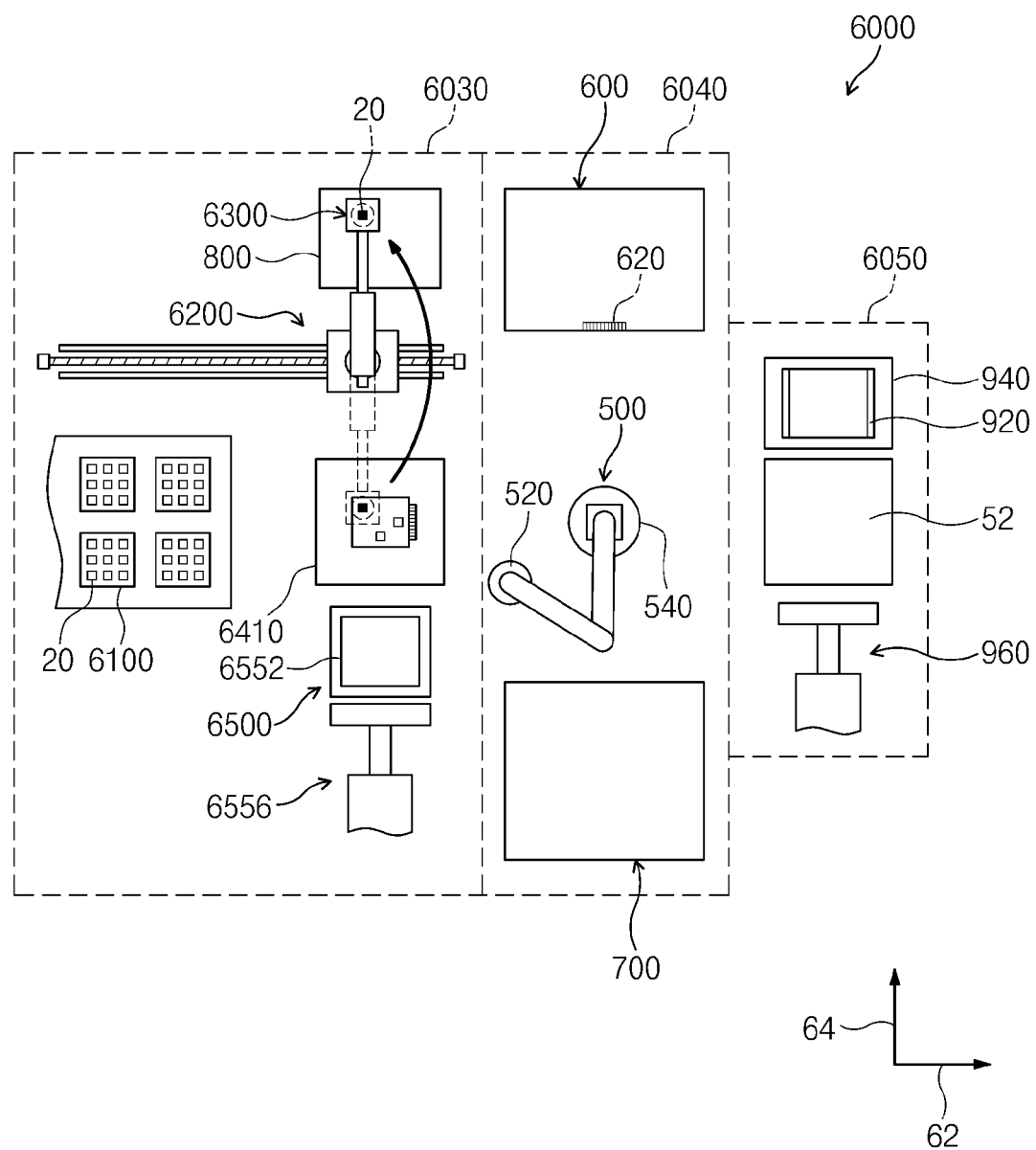

As illustrated in FIG. 29G, upon completion of the heating process, the chip transfer unit 6200 removes the faulty chip 20' from the printed circuit board 10 and transfers it into the faulty chip storage 6800.

Figure 29H:
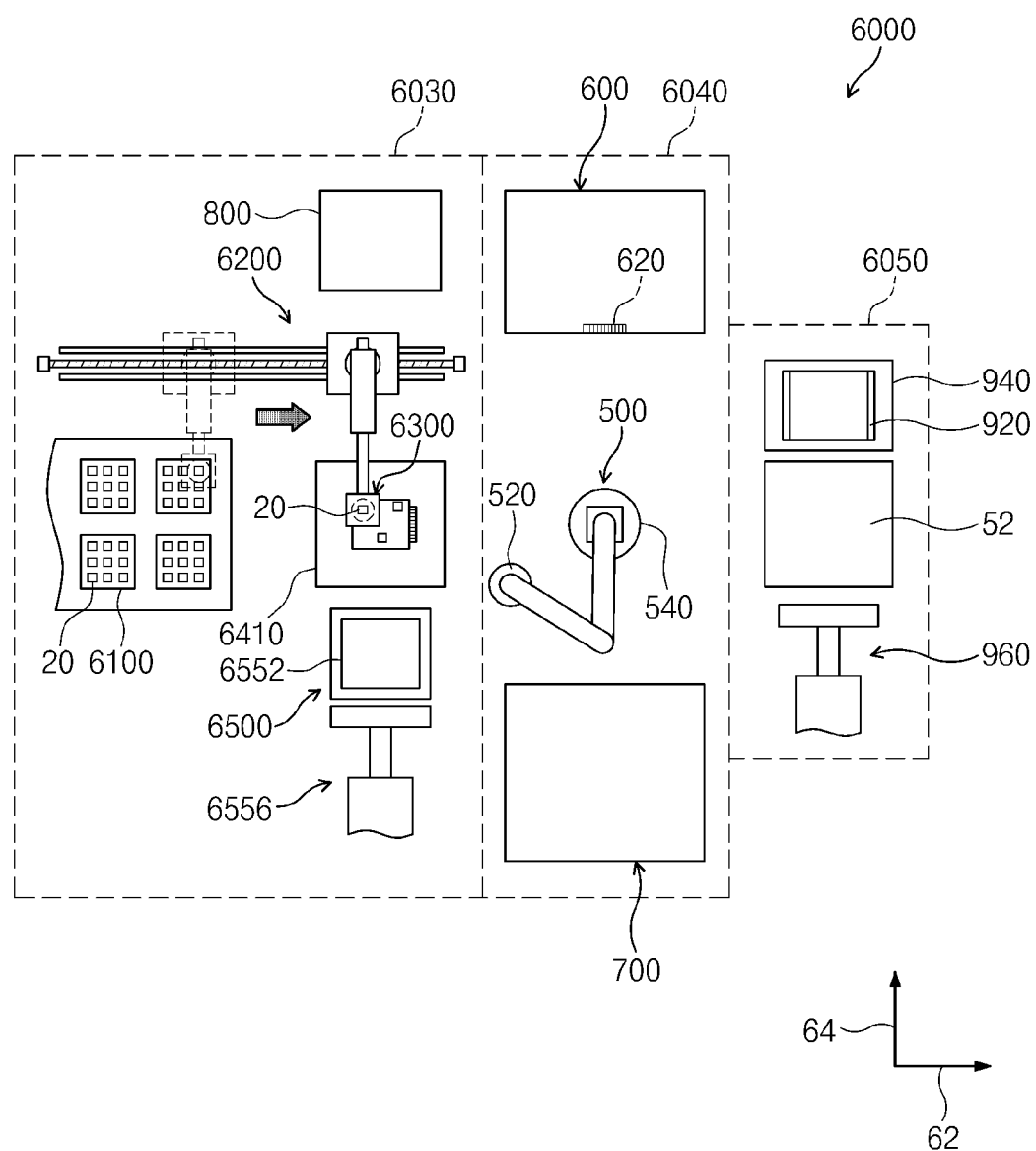

As illustrated in FIG. 29H, the chip transfer unit 6200 transfers a new semiconductor chip 20 from the chip supporter 6100 onto the printed circuit board 10 at the location where the faulty chip 20' was previously located. During the mounting of the new semiconductor chip 20, a reflow process is performed on the solder ball 22 of the new semiconductor chip 20.

Figure 29I:
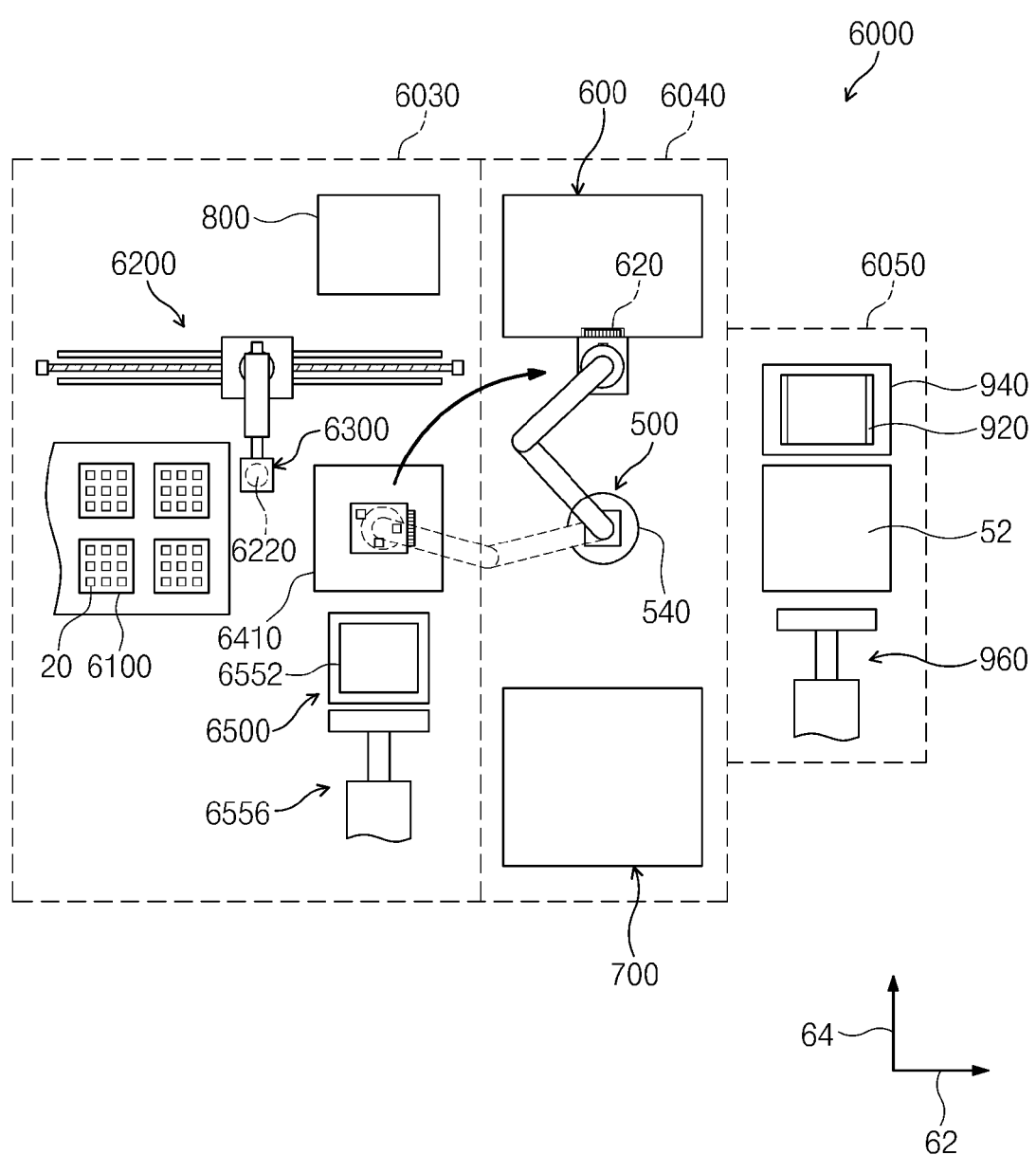

As illustrated in FIG. 29I, the board moving member 500 again moves the printed circuit board 10 to the tester 6600 again and then a test is performed.

Figure 29J:
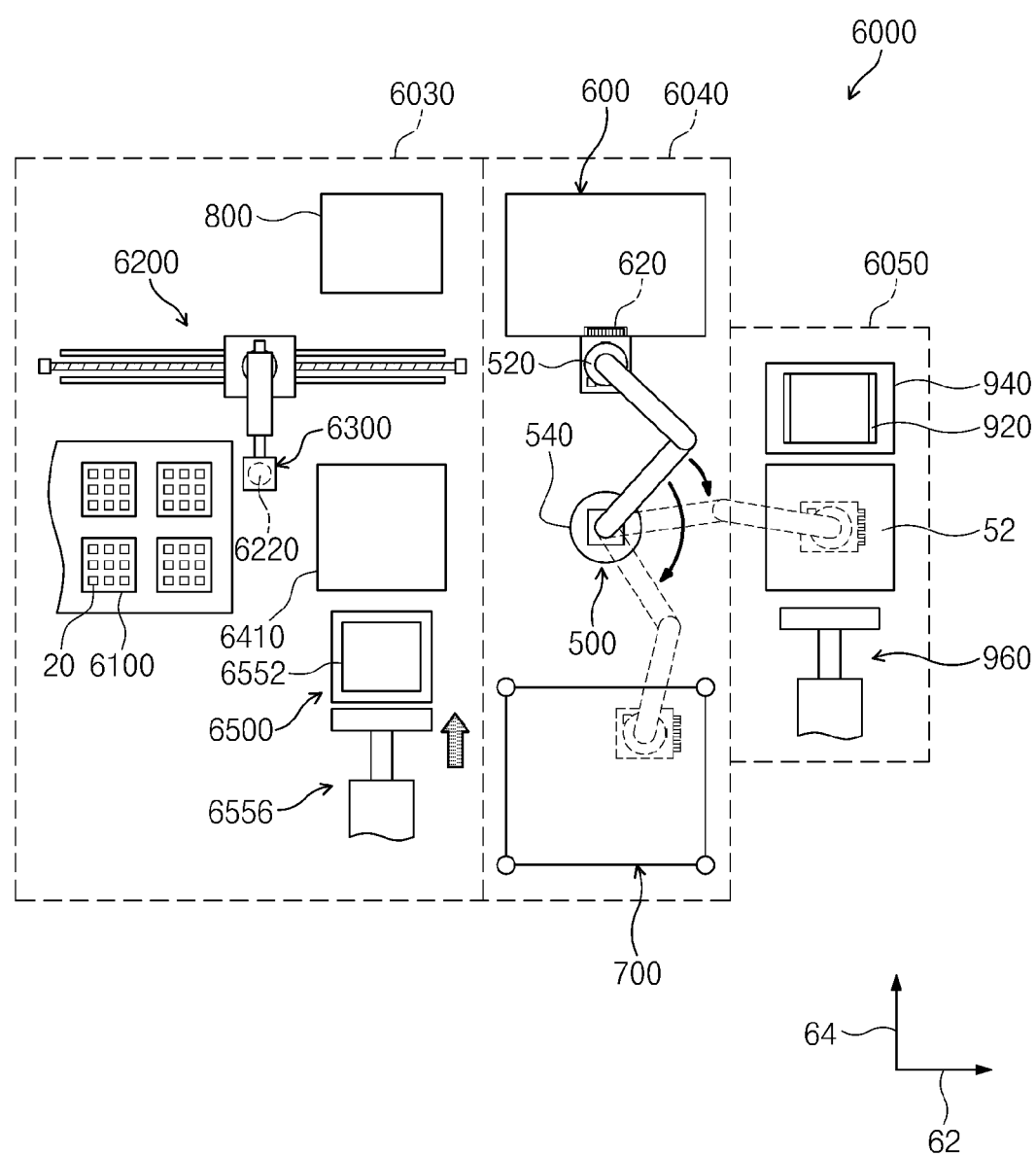

As illustrated in FIG. 29J, if it is determined that the printed circuit board 10 is functioning properly, it is transferred into the unloader unit 6050. On the other hand, if it is determined that the printed circuit board 10 is not functioning properly, or that the printed circuit board has a faulty semiconductor chip 20', then the printed circuit board 10 may be moved to the faulty board storage 6700, and the rework process may be repeated as necessary.

In embodiments of the present general inventive concept, the semiconductor chips 200 may be wafer chips. The wafer chip is a non-encapsulated component. Also, if the semiconductor chip 200 is the wafer chip, the module apparatus may include a die bonding part and a test part and an assembly process may include a process using the die bonding part and the test part.

Although a few embodiments of the present general inventive concept have been illustrated and described, it will be appreciated by those skilled in the art that changes may be made in these embodiments without departing from the principles and spirit of the general inventive concept, the scope of which is defined in the appended claims and their equivalents.

What is claimed is:

1. An assembling apparatus, comprising:
   a chip transfer unit to mount a first semiconductor chip to a first circuit board to form an electrical circuit;
   a heating unit to heat at least one solder connection to electrically connect the first semiconductor chip to the first circuit board;
   a testing unit to test the first semiconductor chip mounted on the first circuit board; and
   an output unit to receive the first circuit board when the testing unit determines that the first semiconductor chip functions properly,
   wherein the testing unit comprises:
      a tester apparatus; and
      a circuit board moving member to move the first circuit board from the heating unit to the tester apparatus, and, based upon a testing result of the testing apparatus, to one of a faulty circuit board storage and the output unit, and
   when the testing unit determines that the first semiconductor chip is not functioning properly, the circuit board moving member moves the circuit board to the heating unit to reheat the solder connection to remove the non-functioning first semiconductor chip from the first circuit board.

2. The assembling apparatus according to claim 1, wherein the chip transfer unit comprises:
   a chip supporter to store the first semiconductor chip prior to mounting the first semiconductor chip onto the first circuit board; and
   a chip transfer apparatus to mount the first semiconductor chip onto the first circuit board.

3. The assembling apparatus according to claim 2, wherein the chip transfer apparatus comprises:
   a vacuum line including an inlet to attach to the first semiconductor chip;
   at least one transfer rod to position the inlet of the vacuum line; and
   at least one drive source to move the at least one transfer rod.

4. The assembling apparatus according to claim 1, wherein the heating unit comprises:
   a heater including a coil to generate a magnetic field; and
   a power source to supply power to the coil.

5. The assembling apparatus according to claim 4, wherein the heater includes a first heater to be positioned above the first circuit board and a second heater to be positioned beneath the first circuit board.

6. The assembling apparatus according to claim 4, wherein:
   a plurality of circuit boards including the first circuit board is mounted on a circuit board supporter, and
   the heater includes a first heater to be positioned above at least one circuit board on the circuit board supporter and a second heater to be positioned above at least another circuit board on the circuit board supporter.

7. The assembling apparatus according to claim 4, wherein:
   the first circuit board has a substantially planar upper surface defined by a first direction and a second direction perpendicular to the first direction, and
   the heater is rotatable along an axis perpendicular to each of the first and second directions.

8. The assembling apparatus according to claim 4, wherein:
   the first circuit board has a substantially planar upper surface defined by a first direction and a second direction perpendicular to the first direction, and
   the heater is rotatable along an axis parallel to a line along a plane defined by the first and second directions.

9. The assembling apparatus according to claim 4, wherein:
   the first circuit board has a substantially planar upper surface defined by a first direction and a second direction perpendicular to the first direction, and
   a surface of the heater facing the first circuit board is positioned at an angle with respect to the upper surface of the first circuit board that is greater than zero degrees and less than ninety degrees.

10. The assembling apparatus according to claim 9, wherein:
    the surface of the heater facing the first circuit board is positioned at an angle with respect to the upper surface of the first circuit board that is less than or equal to forty-five degrees.

11. The assembling apparatus according to claim 4, wherein:
    the first circuit board has a substantially planar upper surface defined by a first direction and a second direction perpendicular to the first direction, and
    the heating unit includes a guide to move the heater along the first direction with respect to the first circuit board.

12. The assembling apparatus according to claim 11, wherein the heater further comprises a bracket to mount the heater to the guide.

13. The assembling apparatus according to claim 4, wherein the heater further comprises a cooling member surrounding the coil.

14. The assembling apparatus according to claim 4, wherein the heater further comprises a cooling member embedded within the coil.

15. The assembling apparatus according to claim 4, wherein the heater comprises:
    a first heater having a coil of a first size to simultaneously heat a plurality of circuit boards; and
    a second heater having a coil of a second size smaller than the first size to heat only one circuit board at a time.

16. The assembling apparatus according to claim 15, wherein:
    the heater further comprises a bracket to mount the heater to a guide, and
    the first heater and the second heater are interchangeably mountable on the bracket.

17. The assembling apparatus according to claim 15, wherein the heating unit includes:

two guides on opposite ends of the first circuit board to move the first heater and the second heater, respectively, along the first direction with respect to the first circuit board; and two brackets to mount the first heater and the second heater to respective guides to allow the first heater and the second heater to be simultaneously located in the heating unit.

18. The assembling apparatus according to claim 4, wherein a circumferential cross-section of the coil has a polygonal shape.

19. The assembling apparatus according to claim 1, further comprising:

a circuit board transfer apparatus to move the first circuit board between the chip transfer unit, the heating unit, and the testing unit.

20. The assembling apparatus according to claim 19, wherein the circuit board transfer apparatus is a conveyor belt.

21. The assembling apparatus according to claim 19, wherein the circuit board transfer apparatus comprises:

a plate;

a projection extending from a surface of the plate in a first direction perpendicular to the plate, the projection moveable in the first direction perpendicular to the surface of the plate and having a retracted state when the projection is moved towards the plate and an extended state when the projection is moved away from the surface of the plate;

a transfer rod to move the plate in a second direction perpendicular to the first direction; and rails to maintain the circuit board on a path in the second direction, wherein:

the projection is capable of moving the circuit board when in the extended state, and the projection is capable of moving around the circuit board when in the retracted state.

22. The assembling apparatus according to claim 19, wherein:

a plurality of circuit boards including the first circuit board are mounted on a circuit board supporter, and the circuit board transfer apparatus moves the plurality of circuit boards by applying a force to an end of the semiconductor chip supporter.

23. The assembling apparatus according to claim 1, wherein:

the chip transfer unit, the heating unit, and the testing unit are arranged in a line, so that the first circuit board may be moved along a line from the chip transfer unit to the heating unit to the testing unit.

24. The assembling apparatus according to claim 1, wherein the first semiconductor chip is a wafer chip.

25. An assembling apparatus, comprising:

a chip transfer unit to mount a semiconductor chip to a circuit board to form an electrical circuit;

a heating unit to heat at least one solder connection to electrically connect the semiconductor chip to the circuit board;

a testing unit to test the semiconductor chip mounted on the circuit board; and an output unit to receive the circuit board when the testing unit determines that the semiconductor chip functions properly, wherein the testing unit comprises:

a tester apparatus;

a faulty circuit board storage storing the circuit board when the testing unit determines that the semiconductor chip does not function properly; and a circuit board moving member to move the circuit board among the heating unit, the tester apparatus, the faulty circuit board storage, and the output unit.

* * * * *